US011152237B2

(12) United States Patent
Nakada et al.

(10) Patent No.: US 11,152,237 B2
(45) Date of Patent: Oct. 19, 2021

(54) SUBSTITUTE SAMPLE, METHOD FOR DETERMINING CONTROL PARAMETER OF PROCESSING, AND MEASUREMENT SYSTEM

(71) Applicant: Hitachi, Ltd., Tokyo (JP)

(72) Inventors: Hyakka Nakada, Tokyo (JP); Takeshi Ohmori, Tokyo (JP); Tatehito Usui, Tokyo (JP); Masaru Kurihara, Tokyo (JP); Naoyuki Kofuji, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 194 days.

(21) Appl. No.: 16/716,602

(22) Filed: Dec. 17, 2019

(65) Prior Publication Data
US 2020/0273732 A1  Aug. 27, 2020

(30) Foreign Application Priority Data
Feb. 22, 2019 (JP) .............................. JP2019-030494

(51) Int. Cl.
| | | |
|---|---|---|
| *G05B 13/04* | (2006.01) | |
| *H01L 21/67* | (2006.01) | |
| *G05B 13/02* | (2006.01) | |
| *H01L 21/308* | (2006.01) | |
| *H01L 21/66* | (2006.01) | |
| *H01L 21/3065* | (2006.01) | |

(52) U.S. Cl.
CPC .... *H01L 21/67276* (2013.01); *G05B 13/0265* (2013.01); *G05B 13/042* (2013.01); *H01L 21/67069* (2013.01); *H01L 21/308* (2013.01); *H01L 21/3065* (2013.01); *H01L 22/20* (2013.01)

(58) Field of Classification Search
CPC ............ G01B 11/0625; G05B 13/0265; G05B 13/042; H01L 21/3065; H01L 21/308; H01L 21/67069; H01L 21/67276; H01L 22/20; C07D 317/40; C07D 407/06; C08G 59/245; C08G 59/4007; C08G 59/5026; C08G 59/504; C08G 59/56; G01N 27/9046
See application file for complete search history.

(56) References Cited

U.S. PATENT DOCUMENTS

| | | | |
|---|---|---|---|
| 7,372,583 B1 | 5/2008 | Jin et al. | |
| 2001/0007143 A1* | 7/2001 | Wakita | .................... H01L 22/20 |
| | | | 716/136 |
| 2013/0111416 A1* | 5/2013 | Nakagawa | ................ G03F 1/70 |
| | | | 716/51 |
| 2019/0094721 A1* | 3/2019 | Tinnemans | ........... G03F 9/7073 |

FOREIGN PATENT DOCUMENTS

JP  2009-44125 A  2/2009

* cited by examiner

*Primary Examiner* — Kidest Bahta
(74) *Attorney, Agent, or Firm* — Crowell & Moring LLP

(57) ABSTRACT

A sample simulates a processing state of a semiconductor sample and is measured by a measurement device. The sample includes: a first surface formed at a first height when viewed from a sample surface; a second surface formed at a second height higher than the first height; and a plurality of inflow parts which allow a particle for performing processing on the first surface to flow between the first surface and the second surface. The processing by the particle flowing from the inflow parts is superimposed in at least a part of a region to be processed on the first surface, and the region where the processing is superimposed on the first surface is measured by the measurement device.

13 Claims, 36 Drawing Sheets

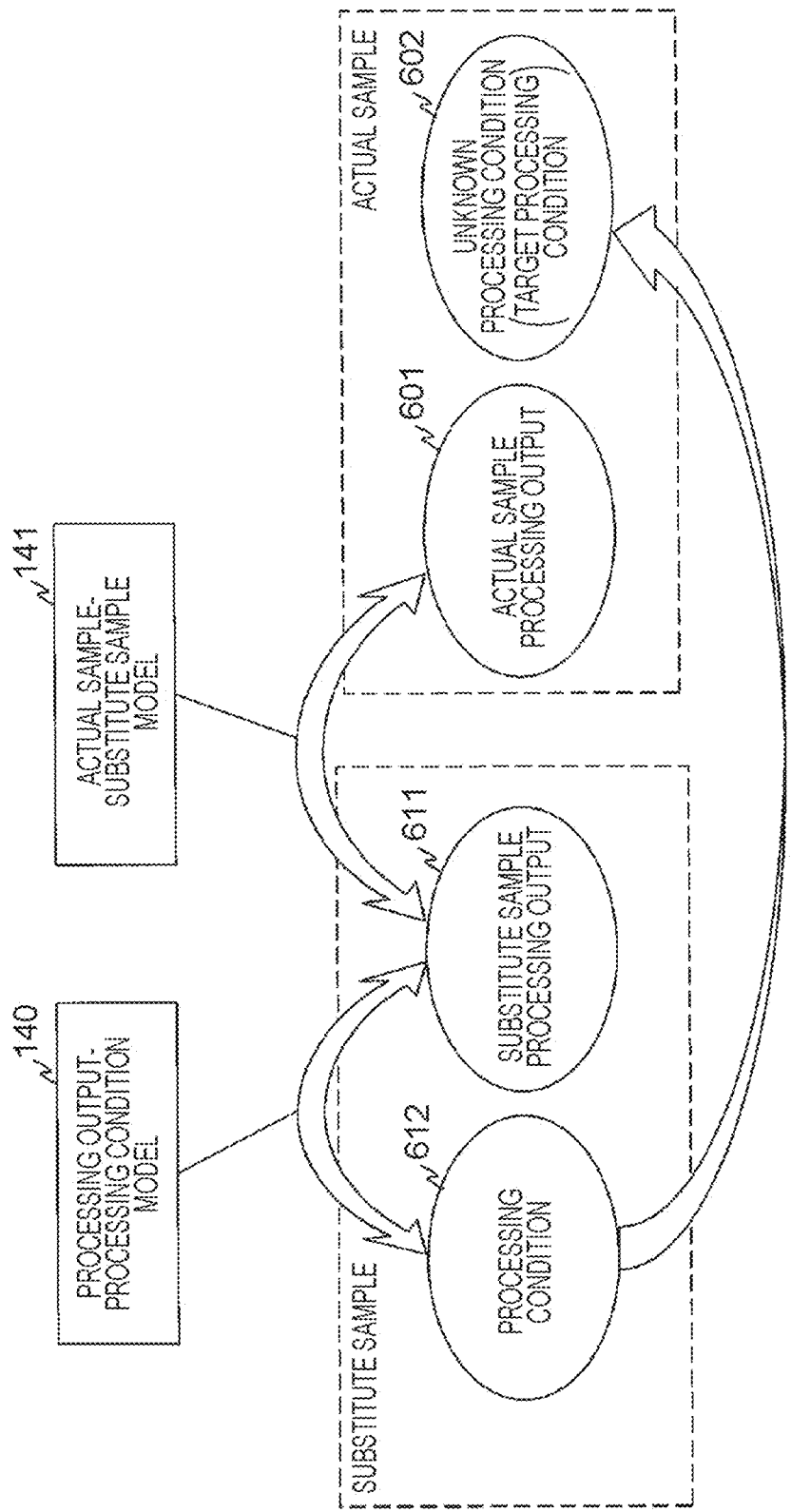

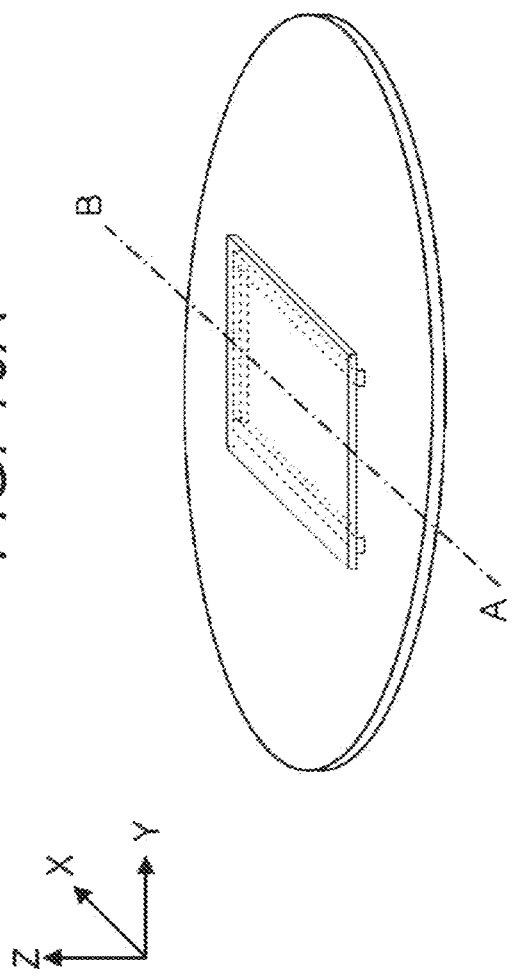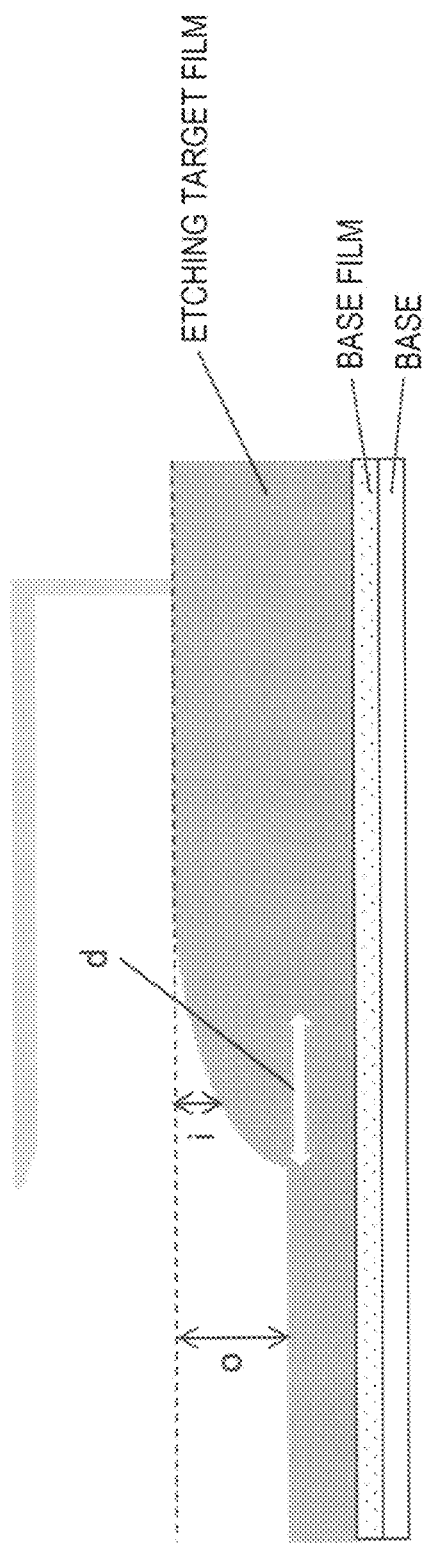

SUBSTITUTE SAMPLE, METHOD FOR DETERMINING CONTROL PARAMETER OF PROCESSING, AND MEASUREMENT SYSTEM

CLAIM OF PRIORITY

The present application claims priority from Japanese patent application JP 2019-30494 filed on Feb. 22, 2019, the content of which is hereby incorporated by reference into this application.

BACKGROUND OF THE INVENTION

1. Field of the Invention

The present invention relates to a substitute sample for substituting a semiconductor for determining processing conditions of a semiconductor process, a method for determining the processing conditions of the semiconductor process, and a measurement system.

2. Description of the Related Art

In a semiconductor process, a desired product can be manufactured by setting appropriate processing conditions (control parameters) obtained by process development in a processing device.

In recent years, a large number of new control parameters have been added due to introduction of new materials forming devices and expansion of a control range of the device according to complication of the device structure.

In order to fully bring out the performance of the processing device, it is essential to optimize a large number of control parameters. As a technique for realizing optimization of control parameters, for example, a technique described in JP 2009-44125 A is known.

JP 2009-44125 A describes that "a shape model of a structure defined by profile parameters characterizing the geometric shape of the structure is obtained. A set of profile parameter values is obtained and used to generate a set of simulated diffraction signals that each characterize the behavior of light diffracted from the structure. After the support vector machine has been trained using the set of simulated diffraction signals as input and the set of profile parameter values as expected output, a manufacturing process is performed to manufacture the structure on the wafer. A measurement diffraction signal from the structure is obtained and input to a trained support vector machine. The value of the profile parameter of the structure is obtained as the output of the trained support vector machine. One or more process parameters or device settings of the manufacturing tool are adjusted based on the value of the profile parameter."

SUMMARY OF THE INVENTION

In recent years, a search technique for optimum processing conditions using machine learning has attracted attention. The technique and machine learning described in JP 2009-44125 A require a large amount of learning data. As a method of obtaining a large amount of data for learning, a method of being set by an engineer having process development know-how and high device operation skills or a method of performing a large number of processing tests is conceivable.

However, there is a problem that there is a shortage of engineers. Furthermore, the sample used for the processing test is expensive because the sample is the sample used for actual product manufacture, and it takes time to obtain the result of the processing test, which are problematic. Therefore, in the method for optimizing the processing conditions using learning data in the related art, it is difficult to reduce the cost for process development.

The present invention provides a substitute sample for realizing optimization of processing conditions for processing with reduced cost for process development, a method for determining processing conditions for a semiconductor process using the substitute sample, and a measurement system.

A typical example of the invention disclosed in this application is as follows. That is, a sample simulates a processing state of a semiconductor sample and is measured by a measurement device. The sample includes: a first surface formed at a first height when viewed from a sample surface; a second surface formed at a second height higher than the first height; and a plurality of inflow parts which allow a particle for performing processing on the first surface to flow between the first surface and the second surface. The processing by the particle flowing from the plurality of inflow parts is superimposed in at least a part of a region to be processed on the first surface, and the region where the processing is superimposed on the first surface is measured by the measurement device.

According to the present invention, it is possible to reduce the cost for process development and calculate the optimal control parameter. Problems, configurations, and effects other than those described above will become apparent from the description of the following embodiments.

BRIEF DESCRIPTION OF THE DRAWINGS

FIG. 6 is a diagram for explaining the concept of the target processing condition calculation processing according to the first embodiment;

FIG. 10A is a diagram illustrating an example of a substitute sample of the first embodiment;

FIG. 10B is a diagram illustrating the example of the substitute sample of the first embodiment;

DESCRIPTION OF THE PREFERRED EMBODIMENTS

Figure 1:
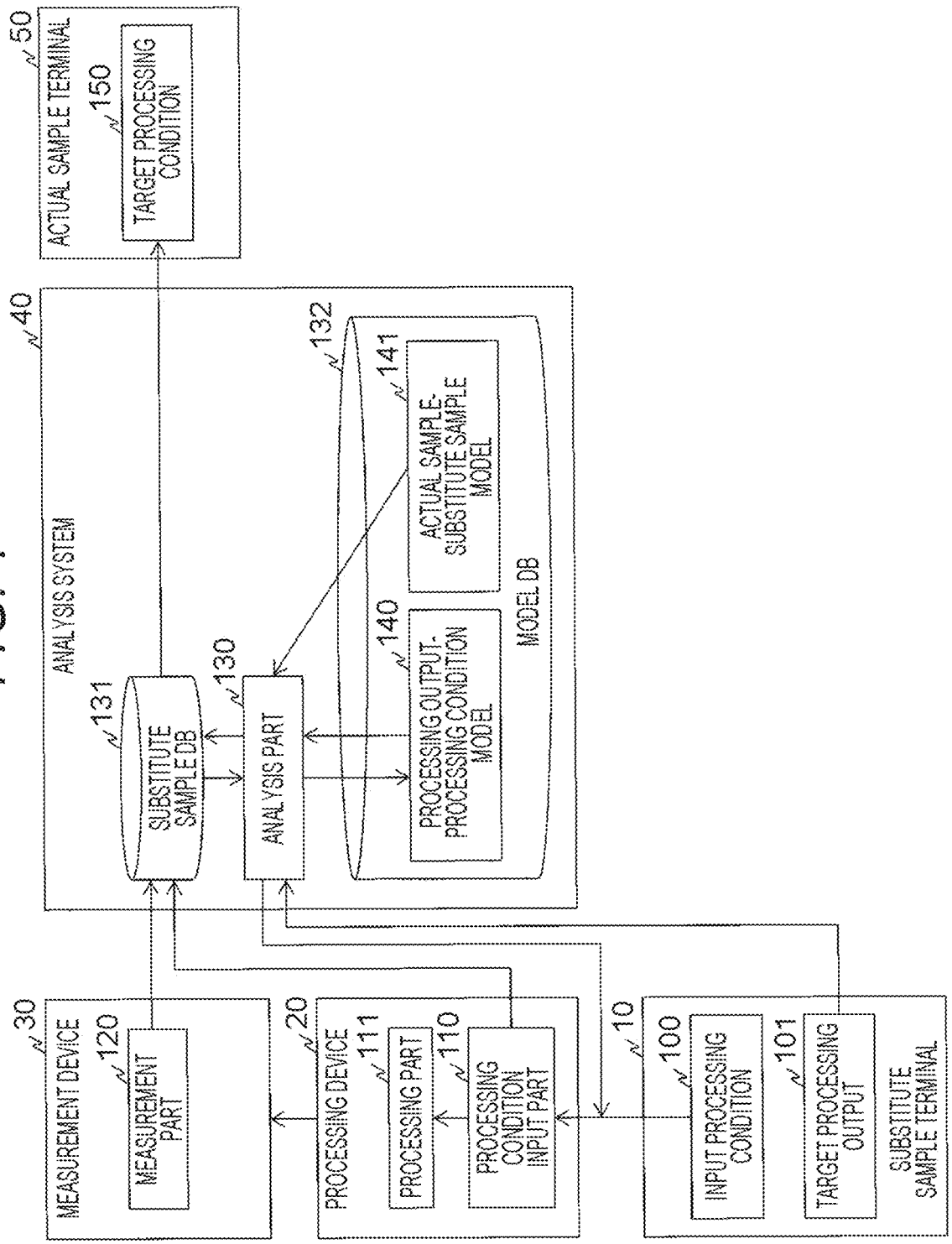
FIG. 1 is a block diagram illustrating an example of a configuration of a sample processing system of a first embodiment.

Embodiments of the present invention will be described below with reference to the drawings. However, the present invention is not construed as being limited to the description of the embodiments below. It is easily understood by those skilled in the art that the specific configuration can be changed without departing from the concept or spirit of the present invention.

In the configurations of the invention described below, the same or similar configurations or functions are denoted by the same reference numerals, and redundant descriptions are omitted.

In this specification, notations such as "first", "second", "third", and the like are given to identify the components, and do not necessarily limit the number or order.

The position, size, shape, range, and the like of each component illustrated in the drawings and the like are intended to facilitate understanding of the invention, and may not represent the actual position, size, shape, range, or the like. Therefore, the present invention is not limited to the position, size, shape, range, and the like disclosed in the drawings and the like.

First Embodiment

First, terms used in this specification will be described.

An "actual sample" is a sample used for manufacturing an actual product. A "substitute sample" is a sample that is expected to have a correlation in a geometrical structure, physical properties, and the like with an actual sample, and is easy to measure the state, characteristics, and the like. In this embodiment, the actual sample is not used as the substitute sample. Examples of the substitute sample include structures on wafers such as a test element group (TEG) sample and a sample with a hut. In this specification, when "actual sample" and "substitute sample" are not distinguished, they are described as "sample".

"Processing" represents processing such as film formation processing, lithography processing, and etching processing performed on the actual sample and the substitute sample. "Processing condition" represents information for controlling a device that performs the above-described processing. Specifically, the processing condition is information including a control parameter set in a device that performs processing as an element. "Processing output" represents information indicating the shape and properties of the sample obtained by measuring the sample during or after processing. Specifically, the processing output is information including a measurement value measured by the measurement device as an element.

The above is an explanation of terms used in this specification. Next, a specific configuration of a sample processing system will be described.

Figure 2:
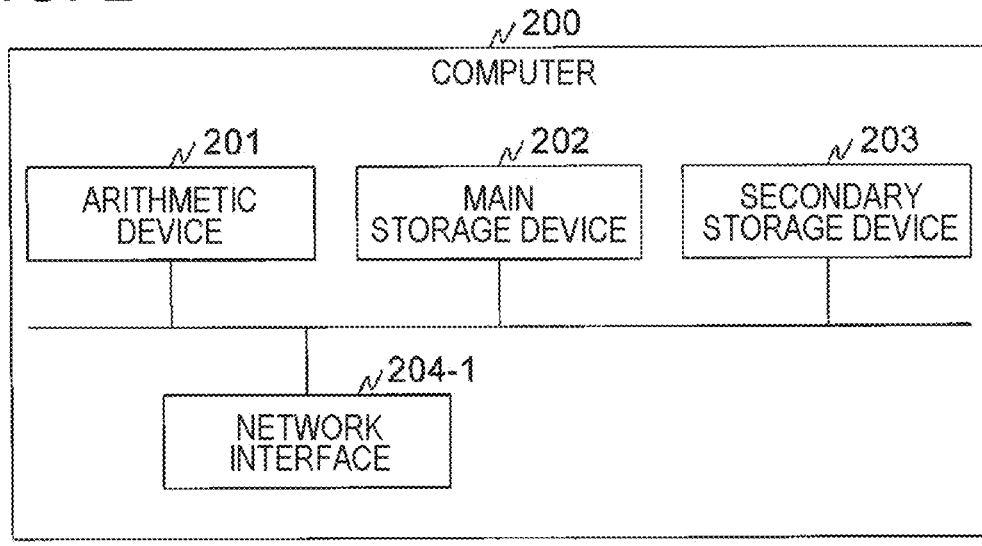
FIG. 2 is a diagram illustrating an example of a hardware configuration of a computer that configures the sample processing system according to the first embodiment.

FIG. 1 is a block diagram illustrating an example of the configuration of the sample processing system of a first embodiment. FIG. 2 is a diagram illustrating an example of a hardware configuration of a computer that configures the sample processing system according to the first embodiment.

The sample processing system includes a substitute sample terminal 10, a processing device 20, a measurement device 30, an analysis system 40, and an actual sample terminal 50. The substitute sample terminal 10 and the actual sample terminal 50 may be combined into one terminal. The components included in the sample processing system are connected to each other directly or via a network.

The substitute sample terminal 10 is a device for inputting processing conditions of the processing performed on the substitute sample. The substitute sample terminal 10 generates an input processing condition 100 based on a user input, and inputs the input processing condition to the processing device 20. As will be described later, the user operates the substitute sample terminal 10 to input the input processing condition 100 and a target processing output 101. The input processing condition 100 is an input for generating the substitute sample DB 131 and is a processing condition for processing the substitute sample. The target processing output 101 is an input for calculating a target processing condition 150, and is a target value of the processing output of the actual sample. The target processing output 101 can include a condition that is satisfied by an element included in the processing output of the actual sample.

The processing device 20 is a device that performs processing on a sample based on processing conditions, and includes a processing condition input part 110 and a processing part 111. For example, the processing device 20 performs a semiconductor etching processing. Note that this embodiment is not limited to the type of processing performed by the processing device 20 and the content of the processing.

For example, the processing device 20 is a lithography device, a film forming device, a pattern processing device, an ion implantation device, a heating device, and a cleaning device.

Examples of the lithography device include an exposure device, an electron beam drawing device, and an X-ray drawing device. Examples of the film forming device include a CVD, a PVD, a vapor deposition device, sputtering device, and a thermal oxidation device. Examples of the pattern processing device include a wet etching device, a dry etching device, an electron beam processing device, and a laser processing device. Examples of the ion implantation device include a plasma doping device and an ion beam doping device. Examples of the heating device include a resistance heating device, a lamp heating device, and a laser heating device. Examples of the cleaning device include a liquid cleaning device and an ultrasonic cleaning device.

A processing condition input part 110 receives the processing conditions input from the substitute sample terminal 10 or the actual sample terminal 50 and outputs the conditions to the processing part 111. The processing condition input part 110 transmits the input processing condition 100 to the analysis system 40 when receiving the input processing condition 100 from the substitute sample terminal 10.

The processing part 111 controls the processing performed on the sample based on the processing conditions. For example, the processing part 111 controls the processing performed on the substitute sample based on the input processing condition 100.

The measurement device 30 is a device that measures values indicating the shape and properties of the sample processed by the processing device 20, and includes a measurement part 120. The measurement part 120 controls measurement of values.

For example, the measurement device 30 obtains values indicating the shape and properties of the sample by measuring the reflection, transmission, interference, absorption, and polarization spectrum of light, laser, and X-rays incident on the sample. More specifically, examples of the measurement device 30 include a device using an electron microscope, an optical monitor, a temperature measurement device using infrared light, a defect detection device using a Kelvin probe force microscope, and a prober device for evaluating electrical characteristics.

The measurement device 30 may measure not only the measurement values relating to the sample after processing, but also the medium such as plasma, gas, and liquid that acts on the sample during processing, and the products generated during processing. Although the medium and the products do not directly represent the state of the sample, they are useful information as information on the sample because they are physical quantities that may indicate a correlation between the state of the processing and the result of the processing.

For example, examples of the measurement device 30 may include a plasma emission monitor using optical spectrum measurement, a deposit monitor in a processing chamber using infrared spectroscopy measurement, an atomic and molecular monitor emitted from a processing target using a mass analyzer, and an electrical property monitor in the processing chamber using a probe.

In addition, the measurement device 30 may be a sensor that obtains power output values such as voltage, current, and power, the values of variable electrical elements such as capacitors and coils in the matching unit, the flow rates of various used gases, the temperatures of the device housing and device components, inner pressure of the processing chamber, the opening degree of the pressure control valve, a valve opening/closing state, a gas exhaust speed, the operation timing and the operation time of the processing and the device, and the like.

In FIG. 1, the measurement device 30 and the processing device 20 are described as separate configurations, but the measurement device 30 may be incorporated in the processing device 20. The sample processing system may include a plurality of measurement devices 30 having the same or different values to be measured.

The analysis system 40 analyzes the correlation between the processing conditions of the substitute sample and the processing output, and calculates a target processing condition 150 that is a processing condition of processing performed on the actual sample based on the target processing output 101. The analysis system 40 includes an analysis part 130, a substitute sample DB 131, and a model DB 132.

The analysis part 130 executes the learning processing such as machine learning and statistical analysis in order to analyze the correlation between the processing conditions of the processing performed on the substitute sample and the processing output of the substitute sample. The machine learning is a processing using regression analysis such as kernel regression and a neural network. The statistical analysis is a processing using correlation analysis, principal component analysis, or the like.

The analysis part 130 calculates the target processing condition 150 based on the model DB 132 and the target processing output 101. Details of processing executed by the analysis part 130 will be described later. In addition, the analysis part 130 manages the substitute sample DB 131 and the model DB 132.

The function of managing the database may be separated from the analysis part 130 to be used as a storage part. In addition, a device different from the analysis system 40 may hold the substitute sample DB 131 and the model DB 132.

The substitute sample DB 131 is a database that manages the processing conditions of the processing performed on the substitute sample and the processing output of the substitute sample in association with each other. For example, the substitute sample DB 131 includes an entry configured by a field for storing identification information of the substitute sample, a field for storing the type of substitute sample, a field for storing processing conditions, and a field for storing processing output.

The model DB 132 is a database for managing a model that is definition information of the correlation of arbitrary values. The model DB 132 includes a processing output-processing condition model 140 and an actual sample-substitute sample model 141.

The processing output-processing condition model 140 is a model that defines the correlation between the processing conditions of the processing performed on the substitute sample and the processing output of the substitute sample. As will be described later, the processing output-processing condition model 140 is generated by a learning processing executed by the analysis part 130.

The actual sample-substitute sample model 141 is a model that defines a correlation between the processing output of the substitute sample and the processing output of the actual sample. It is assumed that the actual sample-substitute sample model 141 is generated in advance.

Note that this embodiment is not limited to the method for generating the actual sample-substitute sample model 141. For example, the actual sample-substitute sample model 141 may be generated using geometric optical simulation, wave optical simulation using Maxwell equations, fluid simulation using Naviestokes equations, molecular dynamics simulation, or the like, and may be generated based on machine learning and statistical analysis. The actual sample-substitute sample model 141 may be a model calculated based on experimental data of a processing device different from the processing device.

The actual sample-substitute sample model 141 may not be a model that is established in the entire region of the space with the element included in the processing output as an axis. For example, the actual sample-substitute sample model may be a model that is established only in the region in the vicinity of the predicted value of the processing output of the actual sample.

The actual sample-substitute sample model 141 may be generated by the analysis system 40 or may be generated by an external system. In a case where the analysis system 40 is generated, the analysis part 130 can generate the actual sample-substitute sample model 141 by executing the learning processing using the processing output of the actual sample and the processing output of the substitute sample obtained under the same processing conditions.

The actual sample terminal 50 is a device for inputting processing conditions for processing performed on the actual sample. The actual sample terminal 50 inputs the target processing condition 150 input from the analysis system 40 to the processing device 20.

The substitute sample terminal 10, the actual sample terminal 50, and the analysis system 40 are realized by using a computer 200 as illustrated in FIG. 2. The computer 200 includes an arithmetic device 201, a main storage device 202, a secondary storage device 203, and a network interface 204.

The arithmetic device 201 executes a program stored in the main storage device 202. For example, the arithmetic device 201 is a processor, a graphics processing unit (GPU), or a field programmable gate array (FPGA). The arithmetic device 201 operates as a module that realizes a specific function by executing processing according to a program.

The main storage device 202 stores a program executed by the arithmetic device 201 and information used by the program. In addition, the main storage device 202 includes a work area temporarily used by the program. For example, the main storage device 202 is a volatile or non-volatile memory. For example, a program for realizing the analysis part 130 is stored in the main storage device 202.

The secondary storage device 203 is a device that permanently stores data. For example, the secondary storage device 203 is a hard disk drive (HDD) or a solid state drive (SSD). For example, a substitute sample DB 131 and a model DB 132 are stored in the secondary storage device 203. A program for realizing the analysis part 130 and the like may be stored in the secondary storage device 203. In this case, the arithmetic device 201 reads the program from the secondary storage device 203 and loads the program into the main storage device 202.

The network interface 204 is an interface for connection to other devices via a network.

The computer 200 may include an input device such as a keyboard, a mouse, and a touch panel, and an output device such as a display.

Figure 3:
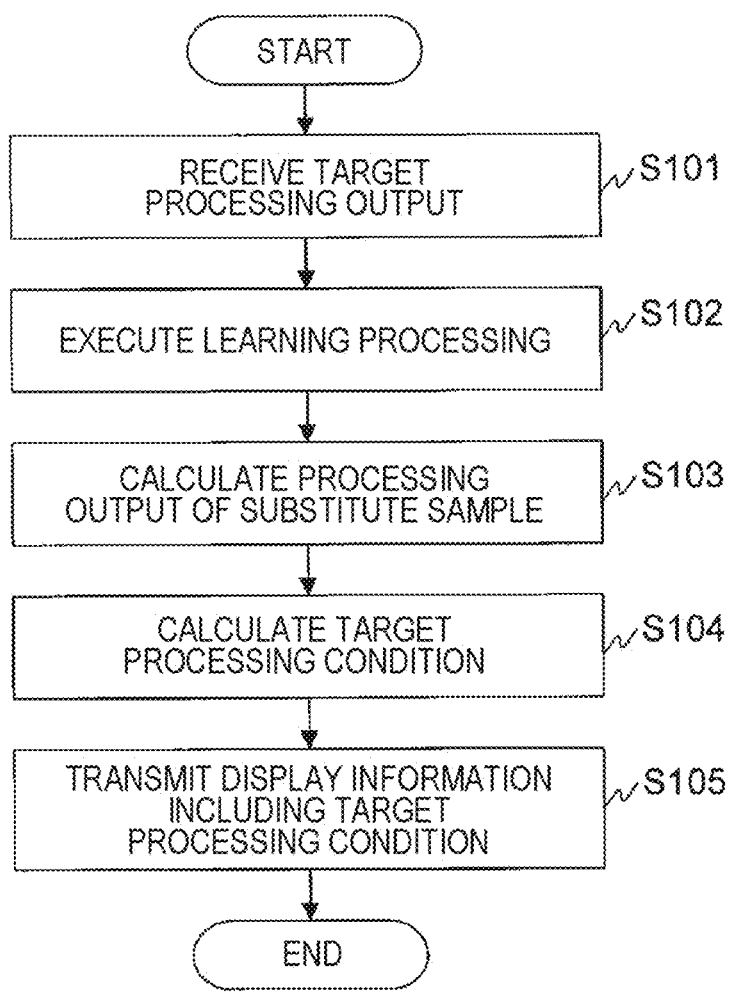
FIG. 3 is a flowchart for explaining target processing condition calculation processing executed by an analysis system according to the first embodiment.
Figure 4:
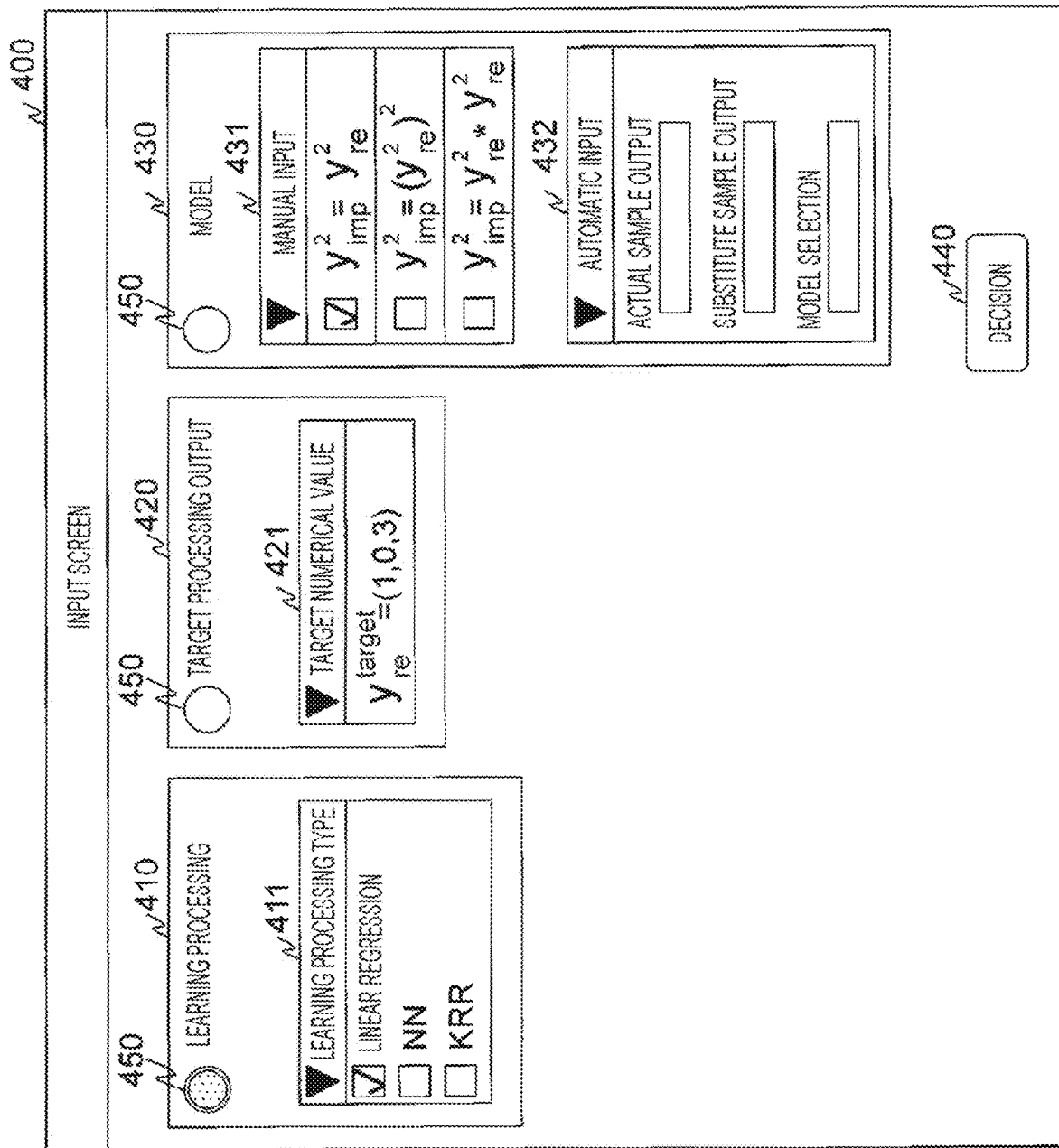
FIG. 4 is a diagram illustrating an example of a GUI displayed on a substitute sample terminal of the first embodiment.
Figure 5:
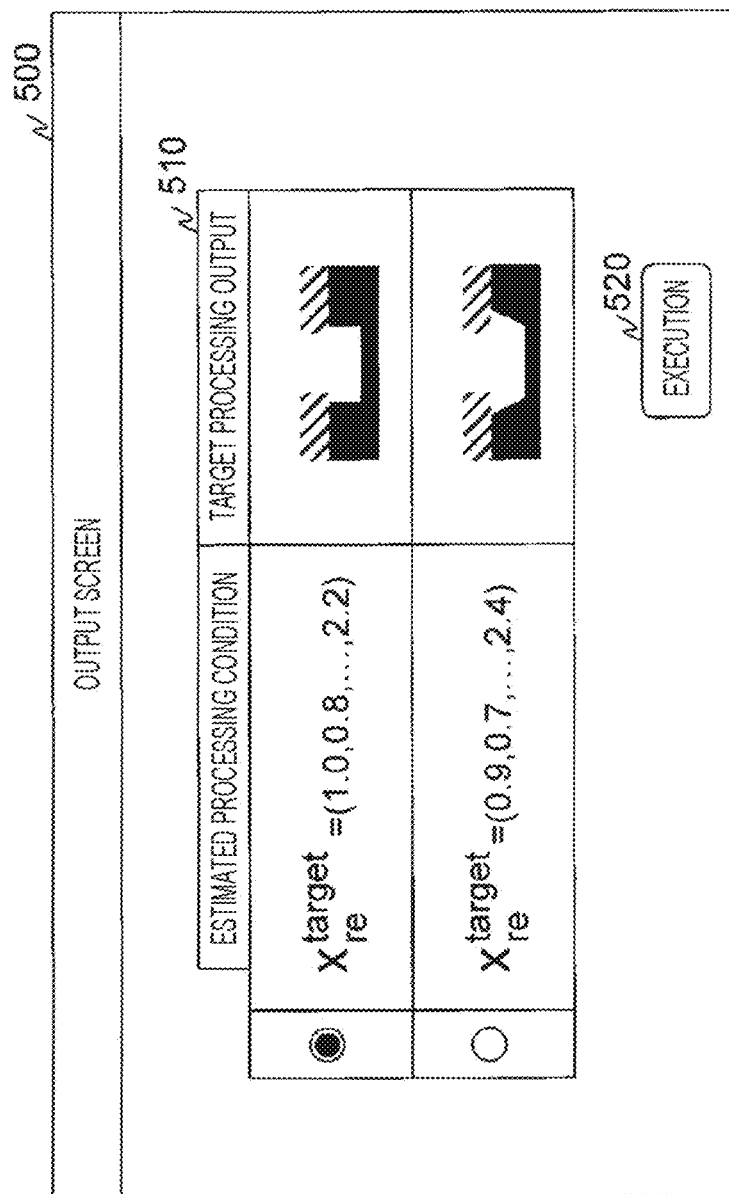
FIG. 5 is a diagram illustrating an example of the GUI displayed on the substitute sample terminal according to the first embodiment.

FIG. 3 is a flowchart for explaining calculation processing of the target processing condition 150 executed by the analysis system 40 of the first embodiment. FIGS. 4 and 5 are diagrams illustrating examples of the GUI displayed on the substitute sample terminal 10 of the first embodiment.

The user uses the GUI 400 displayed on the substitute sample terminal 10 to instruct execution of the learning processing and calculation processing of the target processing condition 150. Here, the GUI 400 will be described.

The GUI 400 includes a learning processing column 410, a target processing output column 420, a model column 430, and a decision button 440. In addition, the learning processing column 410, the target processing output column 420, and the model column 430 include a lamp 450 that indicates whether or not the input to the column is valid. If the input into the column is valid, lamp 450 is lit. Thus, the user can confirm that a correct value has been input. In addition to the lamp 450, pop-up display, audio reproduction, and the like may be performed.

The learning processing column 410 is a column for setting a learning processing for generating the processing output-processing condition model 140, and includes a learning processing type column 411. The learning processing column 410 may include a column for registering or specifying the substitute sample DB 131 used for the learning processing.

The learning processing type column 411 is a column for selecting a specific calculation method of the learning processing using the substitute sample DB 131. A check box for selecting a calculation method is displayed in the learning processing type column 411 of this embodiment.

The target processing output column 420 is a column for setting the target processing output 101, and includes a target numerical value column 421. The target processing output column 420 may include a column for setting a condition that is satisfied by an element included in the target processing output 101.

The target numerical value column 421 is a column for inputting a numerical value to be set as the target processing output 101. In this embodiment, the numerical value of each element included in the processing output is set.

The model column 430 is a column for setting the actual sample-substitute sample model 141, and includes a manual input column 431 and an automatic input column 432.

The manual input column 431 is a column for inputting a correlation between the processing output of the actual sample and the processing output of the substitute sample, which is defined as the actual sample-substitute sample model 141. In the manual input column 431 of this embodiment, a check box for selecting a correlation model is displayed. By specifying an arbitrary correlation model, the correlation between the processing output of the actual sample and the processing output of the substitute sample can be defined. In this embodiment, the correlation can be defined for each element included in the processing output.

The automatic input column 432 is a column for setting a learning processing for generating the actual sample-substitute sample model 141. The automatic input column 432 includes a column for inputting a database for processing output of actual samples, a column for inputting a database for processing output of substitute samples, and a column for inputting a calculation method for learning processing. Two databases specified using the automatic input column 432 store processing conditions obtained under the same processing conditions.

The decision button 440 is an operation button for transmitting a value input to any one of the learning processing column 410, the target processing output column 420, and the model column 430 to the analysis system 40.

When the user inputs a value in the learning processing column 410 and operates the decision button 440, the substitute sample terminal 10 transmits the value set in the learning processing column 410 to the processing device 20. In this case, the analysis part 130 sets a calculation method for the specified learning processing.

When the user inputs a value in the target processing output column 420 and operates the decision button 440, the substitute sample terminal 10 transmits the target processing output 101 including the value set in the target processing output column 420 to the processing device 20.

When the user inputs a value in the model column 430 and operates the decision button 440, the substitute sample terminal 10 transmits a generation request for a model including the value set in the model column 430 to the analysis system 40. In this case, the analysis part 130 generates the actual sample-substitute sample model 141 or updates the actual sample-substitute sample model 141.

The above is the description of the GUI 400. The description returns to FIG. 3.

The analysis part 130 receives the target processing output 101 from the substitute sample terminal 10 (step S101).

The analysis part 130 executes learning processing using the substitute sample DB 131 (step S102). The analysis part 130 stores the result of the learning processing as the processing output-processing condition model 140 in the model DB 132.

The analysis part 130 may read all the data registered in the substitute sample DB 131 or may select an entry to be read based on the specified substitute sample type.

If the processing output-processing condition model 140 has already been generated, the analysis part 130 can omit the processing of step S102.

Next, the analysis part 130 calculates the processing output of the substitute sample corresponding to the target processing output 101 using the target processing output 101 and the actual sample-substitute sample model 141 (step S103).

For example, when the actual sample-substitute sample model 141 is given as a quantitative correlation, that is, as a function, the analysis part 130 calculates the processing output of the substitute sample by substituting the target processing output 101 into the function.

A plurality of processing outputs of the substitute sample may be calculated. For example, when a model for specifying a range is set for an arbitrary element of the processing output, a plurality of processing outputs including elements included in the range are calculated.

The correlation between the processing output of the actual sample and the processing output of the substitute sample may be a qualitative correlation instead of a quantitative correlation. For example, a case is considered in which a qualitative correlation that "the larger the element B, the larger the element A" is established between the element A of the processing output of the substitute sample and the element B of the processing output of the actual sample. When the maximum value B' obtained by the element B is input as the target processing output 101, the analysis part 130 calculates the maximum value A' obtained by the element A as the processing output of the substitute sample.

Next, the analysis part 130 calculates the target processing condition 150 using the processing output of the substitute sample and the processing output-processing condition model 140 (step S104).

Specifically, the analysis part 130 uses the processing output-processing condition model 140 to calculate a processing condition (estimated processing condition) of the substitute sample in which a processing output of the substitute sample may be obtained.

For example, when the processing output-processing condition model 140 is given as a function, the analysis part 130 calculates the estimated processing condition by substituting the processing output of the substitute sample into the function. Since the substitute sample and the actual sample are processed using the same processing device 20, the estimated processing condition becomes the target processing condition 150.

The analysis part 130 may transmit the target processing condition 150 as the input processing condition 100 to the substitute sample terminal 10. By repeatedly executing the same arithmetic processing, it is possible to calculate an optimum processing condition and to discover a new processing condition.

The analysis part 130 may not use the processing output-processing condition model 140. For example, the analysis part 130 refers to the substitute sample DB 131 and searches for an entry that matches or is similar to the calculated processing output of the substitute sample. The analysis part 130 calculates the processing condition of the substitute sample included in the searched entry as the target processing condition 150.

Next, the analysis part 130 generates display information including the target processing condition 150 and transmits the generated display information to the actual sample terminal 50 (step S105). The analysis part 130 may store the target processing condition 150 in the secondary storage device 203 and read the target processing condition 150 when a display request is received from the actual sample terminal 50 to generate display information.

When receiving the display information, the actual sample terminal 50 displays a GUI 500 as illustrated in FIG. 5. Here, the GUI 500 will be described.

The GUI 500 includes a result display column 510 and an execution button 520.

The result display column 510 is a column for displaying the result of the calculation processing of the target processing condition 150. The result display column 510 includes one or more entries including a field for storing the target processing output 101 and a field for storing the target processing condition 150. The entry includes a radio button. The target processing output 101 may be displayed as an image or a numerical value.

The execution button 520 is an operation button for inputting the target processing condition 150 to the processing device 20. When the user operates the radio button of the entry included in the result display column 510 and further operates the execution button 520, the target processing condition 150 of the entry of which the radio button is operated is input to the processing device 20. When receiving the target processing condition 150, the processing device 20 processes the actual sample based on the target processing condition 150.

Here, the arithmetic processing executed by the analysis system 40 will be described. FIG. 6 is a diagram illustrating the concept of the calculation processing of the target processing condition 150 of the first embodiment. Here, for simplicity of explanation, it is assumed that the processing output-processing condition model 140 and the actual sample-substitute sample model 141 are respectively given by functions.

The ellipses in FIG. 6 indicate an actual sample processing output space 601, an actual sample processing condition space 602, a substitute sample processing output space 611, and a substitute sample processing condition space 612, respectively.

The actual sample processing output space 601 and the substitute sample processing output space 611 represent spaces having an element included in the processing output as an axis. The dimensions of the actual sample processing output space 601 and the substitute sample processing output space 611 do not necessarily match. The dimension of the substitute sample processing output space 611 may be lower than the dimension of the actual sample processing output space 601.

The actual sample processing condition space 602 and the substitute sample processing condition space 612 indicate spaces around elements included in the processing conditions. The actual sample processing condition space 602 and the substitute sample processing condition space 612 are the same dimensional space, and the two spaces can be viewed as the same.

The analysis system 40 holds the actual sample-substitute sample model 141 indicating a mapping relation (correlation) between the actual sample processing output space 601 and the substitute sample processing output space 611.

In step S103, the analysis system 40 generates the processing output-processing condition model 140 indicating a mapping relation (correlation) between the substitute sample processing output space 611 and the substitute sample processing condition space 612.

In step S104, the analysis system 40 receives an arbitrary element of the actual sample processing output space 601 as an input.

In step S105, the analysis system 40 uses the actual sample-substitute sample model 141 to map the element of the actual sample processing output space 601 to the substitute sample processing condition space 612. The element of the substitute sample processing condition space 612 is the processing output of the substitute sample.

The analysis system 40 uses the processing output-processing condition model 140 to map the element of the substitute sample processing condition space 612 to the substitute sample processing condition space 612. Since the actual sample processing condition space 602 can be viewed as the same as the substitute sample processing condition space 612, the element of the substitute sample processing condition space 612 can be regarded as the element of the actual sample processing condition space 602. Therefore, the analysis system 40 outputs the element as the target processing condition 150.

Next, specific examples of the actual sample, the substitute sample, and the actual sample-substitute sample model 141 will be described. Here, a sample to be subjected to the plasma etching processing will be described as an example, but the etchant used for the etching process may be a liquid instead of a gas.

Figure 7A:
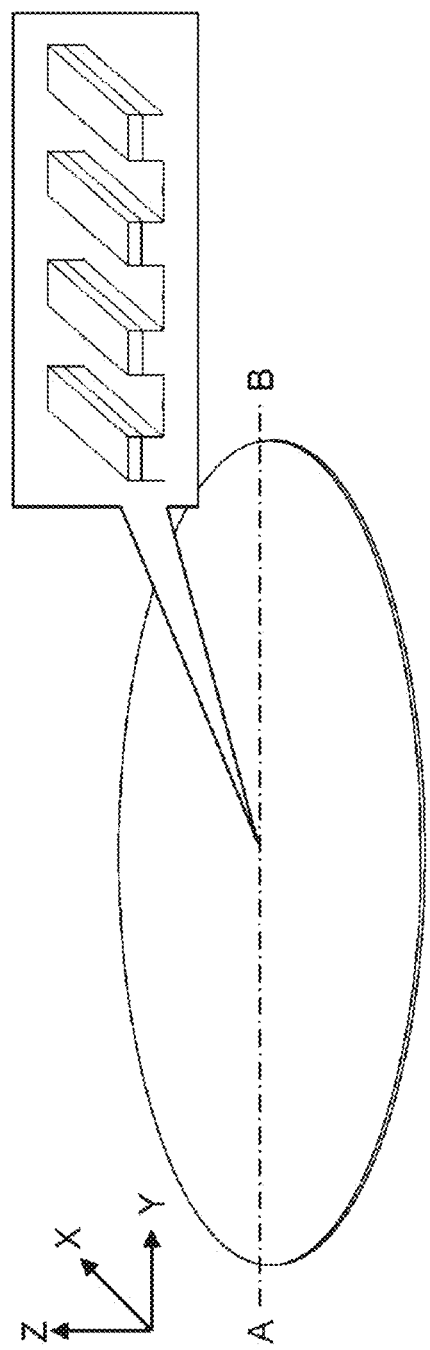
FIG. 7A is a diagram illustrating an example of an actual sample of the first embodiment.
Figure 7B:
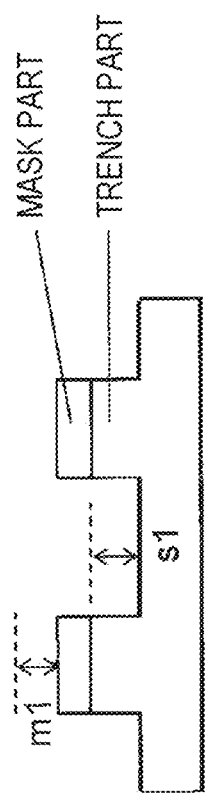
FIG. 7B is a diagram illustrating the example of the actual sample of the first embodiment.
Figure 8A:
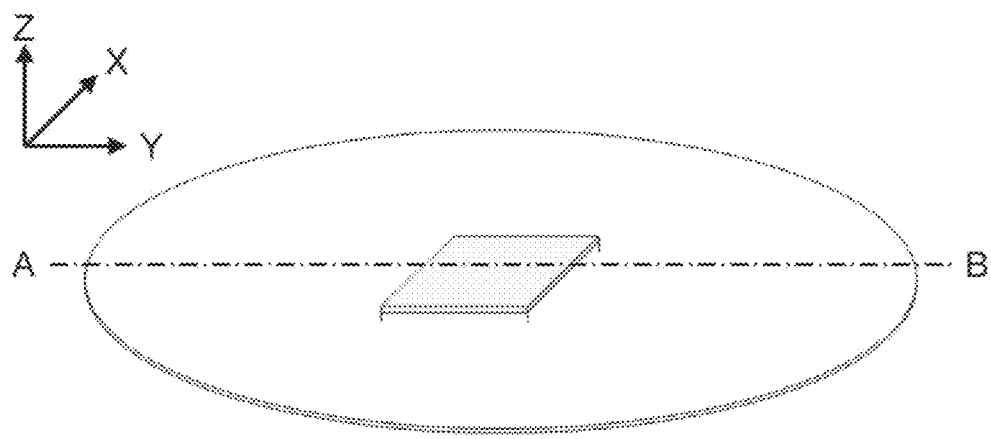
FIG. 8A is a diagram illustrating an example of a substitute sample of the first embodiment.
Figure 8B:
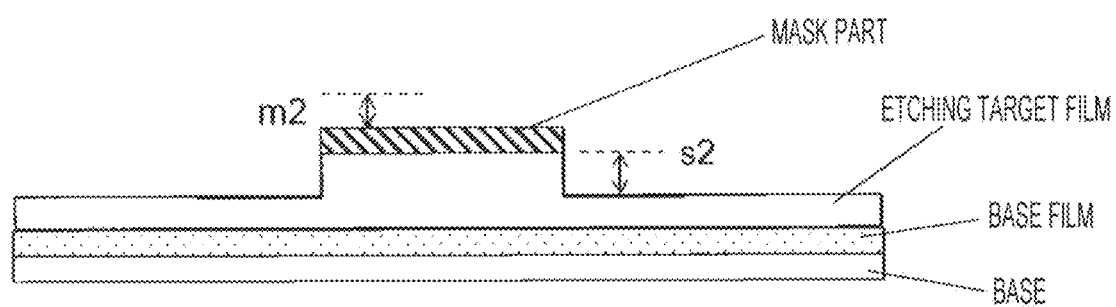
FIG. 8B is a diagram illustrating the example of the substitute sample of the first embodiment.

First, a case will be described in which a quantitative correlation can be defined between all elements included in the processing output of the actual sample and all elements included in the processing output of the substitute sample. FIGS. 7A and 7B are diagrams illustrating an example of the actual sample of the first embodiment. FIGS. 8A and 8B are diagrams illustrating an example of the substitute sample of the first embodiment.

FIG. 7A illustrates a masked pattern of an actual sample for performing an etching processing for forming a trench structure. FIG. 7B is a cross-sectional view of a cross section (YZ plane) obtained by cutting the actual sample along the dotted line AB in the positive direction of the X axis.

FIG. 8A illustrates a wafer of which a portion is coated with the same material as the mask part of the actual data illustrated in FIG. 7, and the other portion is coated with the same material as the trench part. FIG. 8B is a cross-sectional view of a cross section (YZ plane) obtained by cutting the substitute sample along the dotted line AB in the positive direction of the X axis. A sample in which a chip made of the same material as the mask part of the actual sample or a chip obtained by cutting the wafer coated with the same material as the mask part of the actual sample is fixed on a base wafer can also be used as a substitute sample.

The dotted lines above the mask part and the trench part illustrated in FIG. 7B indicate the positions of the mask part and the trench part before processing. Further, the dotted lines above the mask part and the etching target film illustrated in FIG. 8B indicate the positions of the mask part and the etching target film before processing.

The physical quantities that characterize the shape of the actual sample include the etching rate of the mask part and the etching rate of the trench part. In addition, the physical quantities that characterize the shape of the substitute sample include the etching rate of the mask part and the etching rate of the trench part.

In the following description, the etching rate of the mask part and the trench part of the actual sample are defined as m1 and s1, respectively, and the etching rate of the mask part and the etching rate of the trench part in the substitute sample are defined as m2 and s2, respectively. In addition, m1 and s1 are included in the processing output of the actual sample, and m2 and s2 are included in the processing output of the substitute sample.

In the plasma etching processing, a method of calculating the target processing condition 150 for adjusting m1 and s1 to the target processing output 101 will be described. It is assumed that the condition shown in Formula (1) is set as a condition that m1 and s1 satisfy.

[Mathematical Formula 1]

$$\frac{s_1}{m_1} \gg 1 \qquad (1)$$

When the actual sample has a fine pattern as illustrated in FIG. 7A, it is difficult to check the diffracted light and to measure the effective complex refractive index, and thus it is difficult to measure m1 and s1 using an optical measuring instrument. Therefore, it is necessary to measure cross-sectional information of the actual sample. In order to measure the cross-section information of the actual sample, it is necessary to take out the actual sample from the processing device 20 and further perform processing for measuring the cross-section information. Therefore, it takes time to obtain the learning data, and the cost becomes higher.

On the other hand, as illustrated in FIG. 8B, the substitute sample has a base film under the etching target film of the wafer and the chip. Therefore, m2 and s2 can be measured by using light interference. When the film thickness measurement device incorporated in the processing device 20 is used, it is not necessary to take out the substitute sample from the processing device 20 and perform processing on the substitute sample for measuring a pressure film. Therefore, it is possible to obtain the learning data at a high speed and at a lower cost compared to the case of obtaining the learning data from the actual sample.

Even when the processing device 20 does not include the measurement device 30, stand-alone optical measurement is possible, so that the processing of the substitute sample is not necessary.

As the actual sample-substitute sample model 141 of the actual sample illustrated in FIG. 7A and the substitute sample illustrated in FIG. 8A, the following can be considered.

The actual sample and the substitute sample are configured of the same material. Thus, when the processing conditions are the same, formulas as illustrated in Formula (2) and Formula (3) can be defined as the actual sample-substitute sample model 141.

[Mathematical Formula 2]

$$m1 \approx m2 \qquad (2)$$

[Mathematical Formula 3]

$$s1 \approx s2 \qquad (3)$$

Here, when m1=1 nm/min and s1=100 nm/min are input to the analysis system 40 as the target processing output 101 satisfying Formula (1), the analysis system 40 calculates m2=1 nm/min and s2=100 nm/min as the processing output of the substitute sample from the actual sample-substitute sample model 141 as shown in Formula (2) and Formula (3), for example.

Note that the substitute sample using the chip made of the same material as the mask part is described as an example. However, the present invention is not limited thereto. For example, a material exhibiting processing characteristics similar to the mask part or a material having a correlation with the processing shape of the mask part can be applied.

In the case of the substitute sample to which the material exhibiting processing characteristics similar to that of the mask part is applied, the actual sample-substitute sample model 141 as illustrated in Formula (2) and Formula (3) can be used. In addition, when the material has a correlation with the processing shape of the mask part and the correlation is known, the correlation can be used as the actual sample-substitute sample model 141. When the above-described correlation is not known, the actual sample-substitute sample model 141 obtained from learning processing using experimental data can be set.

Figure 9A:
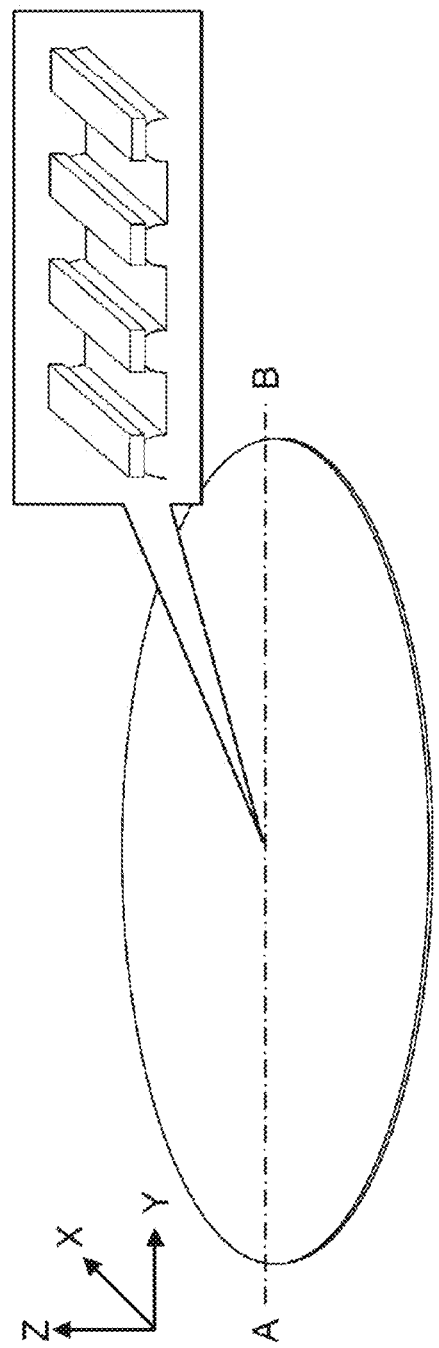
FIG. 9A is a diagram illustrating an example of an actual sample of the first embodiment.
Figure 9B:
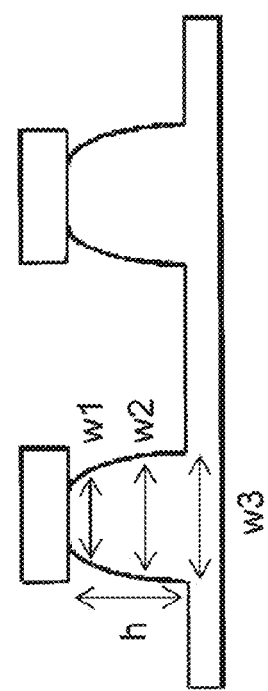
FIG. 9B is a diagram illustrating the example of the actual sample of the first embodiment.
Figure 11:
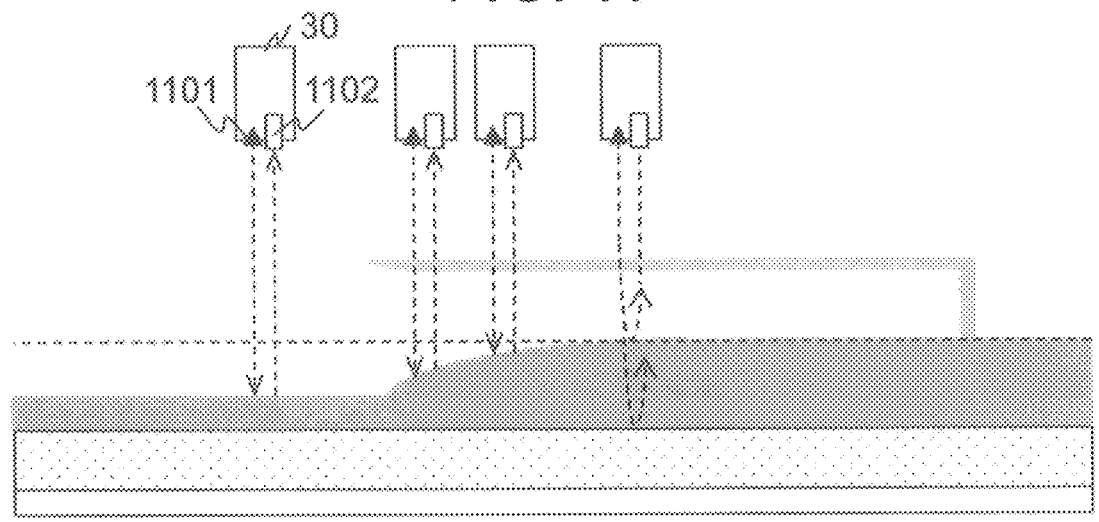
FIG. 11 is a diagram illustrating an example of a method for measuring a physical quantity of the substitute sample of the first embodiment.

Next, a case will be described in which a quantitative correlation can be defined between a part of elements included in the processing output of the actual sample and a part of elements included in the processing output of the substitute sample. FIGS. 9A and 9B are diagrams illustrating an example of the actual sample of the first embodiment. FIGS. 10A and 10B are diagrams illustrating an example of the substitute sample of the first embodiment. FIG. 11 is a diagram illustrating an example of a method for measuring the physical quantity of the substitute sample of the first embodiment.

FIG. 9A illustrates a masked pattern of the actual sample for performing the etching processing for forming the trench structure. FIG. 9B illustrates a cross-sectional view of a cross section (YZ plane) obtained by cutting the actual sample along the dotted line AB in the positive direction of the X axis.

FIG. 10A illustrates the substitute sample (a sample with a hut) in which a roof is installed on the wafer. The upper portion of the roof is configured of a transparent material that light transmits, and the roof is supported by walls on three sides to form the hut. That is, a gap portion of which one surface is open is formed between the wafer and the roof, and the other three surfaces are separated by walls. Therefore, the substitute sample illustrated in FIG. 10A is a one-sided opening sample in which the etchant (etching particles) can flow into the inner space of the hut (under the roof). The etching target film of the substitute sample is made of the same material as the trench part of the actual sample. FIG. 10B illustrates a cross-sectional view of a cross section (XZ plane) obtained by cutting the substitute sample along the dotted line AB in the negative direction of the Y-axis. The substitute sample has a gap structure as illustrated in FIG. 10B. In addition, the dotted line illustrated in FIG. 10B indicates the position of the etching target film before processing.

The physical quantities that characterize the shape of the actual sample include the width of the apex portion of the trench part, the width of the central portion of the trench part, the width of the bottom portion of the trench part, and the depth of the actual sample. The physical quantities that characterize the shape of the substitute sample include the etching amount in the hut outside portion, the etching amount in the hut inside portion, and the length of attenuation in the hut inside portion.

In the following description, the width of the apex portion of the trench part of the actual sample, the width of the central portion of the trench part, the width of the bottom portion of the trench part, and the depth of the actual sample are defined as w1, w2, w3, and h, respectively. In addition, the etching amount in the hut outside portion, the etching amount in the hut inside portion, and the length of attenuation of the etching amount in the hut inside portion of the substitute sample are defined as o, i, and d, respectively. In addition, w1, w2, w3, and h are included in the processing output of the actual sample, and o, i, and d are included in the processing output of the substitute sample.

In the plasma etching processing, a method for calculating the target processing condition 150 for adjusting w1, w2, w3, and h to the target processing output 101 will be described. As a condition that w1, w2, w3, and h satisfy, a condition is set in which w1, w2, and w3 are substantially equal, and h is the maximum.

Similarly to the actual data illustrated in FIG. 7A, the actual sample illustrated in FIG. 9A is difficult to measure w1, w2, w3, and h using an optical measuring instrument. In addition, it takes time to obtain learning data, and the cost becomes higher.

On the other hand, as illustrated in FIG. 11, the hut of the substitute sample is transparent. Thus, a physical quantity indicating the shape can be measured from an arbitrary measurement position by film thickness measurement using light interference or the like. Specifically, the measurement device 30 emits light from a light source 1101 and detects reflected light from the etching target film and the base film by using a detector 1102. In this way, the processing output can be obtained without taking out the substitute sample from the processing device 20 and processing the substitute sample. Therefore, it is possible to obtain the learning data at a high speed and at a lower cost compared to the case of obtaining the learning data from the actual sample.

It is desirable to measure o, i, and d in the vicinity of the central portion of the hut opening parallel to the Y axis of the substitute sample. However, when the distribution of the etching amount in the X-axis direction in a portion sufficiently inward from both ends of the hut is uniform, o, and d may be measured at arbitrary positions.

As the actual sample-substitute sample model 141 of the actual sample illustrated in FIG. 9A and the substitute sample illustrated in FIG. 10A, the following can be considered.

When d is large, the etching rate on the inside of the hut becomes difficult to attenuate. Thus, as d increases, a uniform etching amount approaches on the inside of the hut. On the other hand, when d is small, the etching rate on the inside of the hut is immediately attenuated, so that the etching amount increases around the opening portion of the hut as compared with other portions.

As illustrated in FIGS. 9B and 10B, the actual sample and the substitute sample have a similar groove structure. Therefore, the properties of the substitute sample have the following relationship with the properties of the actual sample. It is considered that when i of the actual sample is large, the etching rate of the actual sample in the horizontal direction is also increased. Thus, it is expected that the difference between w1, w2, and w3 tends to increase. When d of the substitute sample is small, the etching reaction proceeds only to the etching target film directly under the mask part. Thus, it is predicted that w1 tends to increase from w2 and w3. Therefore, the above property between the actual samples w1, w2, and w3 and the substitute samples d and i is defined as the actual sample-substitute sample model 141.

In addition, since h of the actual sample and o of the substitute sample are etched with respect to the etching target film without an obstacle (mask), the formula as illustrated in Formula (4) can be defined as the actual sample-substitute sample model 141.

[Mathematical Formula 4]

$$h \approx o \qquad (4)$$

As described above, this embodiment can also be applied to the actual sample-substitute sample model 141 in which a quantitative relationship is not defined between some elements of the actual sample processing output and the substitute sample processing output.

For example, when the target processing output 101 including the value of h is input, the analysis system 40 searches for the processing output of the substitute sample that satisfies Formula (4). Based on the above properties (actual sample-substitute sample model 141), the analysis system 40 searches for the processing output of the substitute sample with large o, small i, and large d from the searched processing outputs of the substitute sample. Further, the analysis system 40 calculates the target processing condition 150 using the searched processing output of the substitute sample and the processing output-processing condition model 140. By executing the arithmetic processing as described above, the processing conditions for obtaining an actual sample having a deep vertical shape can be calculated.

Although the substitute sample which has a transparent roof was described as an example, the present invention is not limited thereto. For example, a substitute sample having an opaque roof can be used. In this case, the optical interference film thickness can be measured by taking out the substitute sample from the device and removing the entire hut or a part of the hut corresponding to the space used as the optical path during optical measurement. Therefore, it is possible to obtain the learning data at a high speed and at a lower cost compared to the case of using the actual sample.

Although the wafer formed into a film with the same material as the trench part of the actual sample is used as the substitute sample, the present invention is not limited thereto. For example, a material exhibiting processing characteristics similar to the trench part or a material having a correlation with the processing shape of the trench part can be applied.

Figure 12:
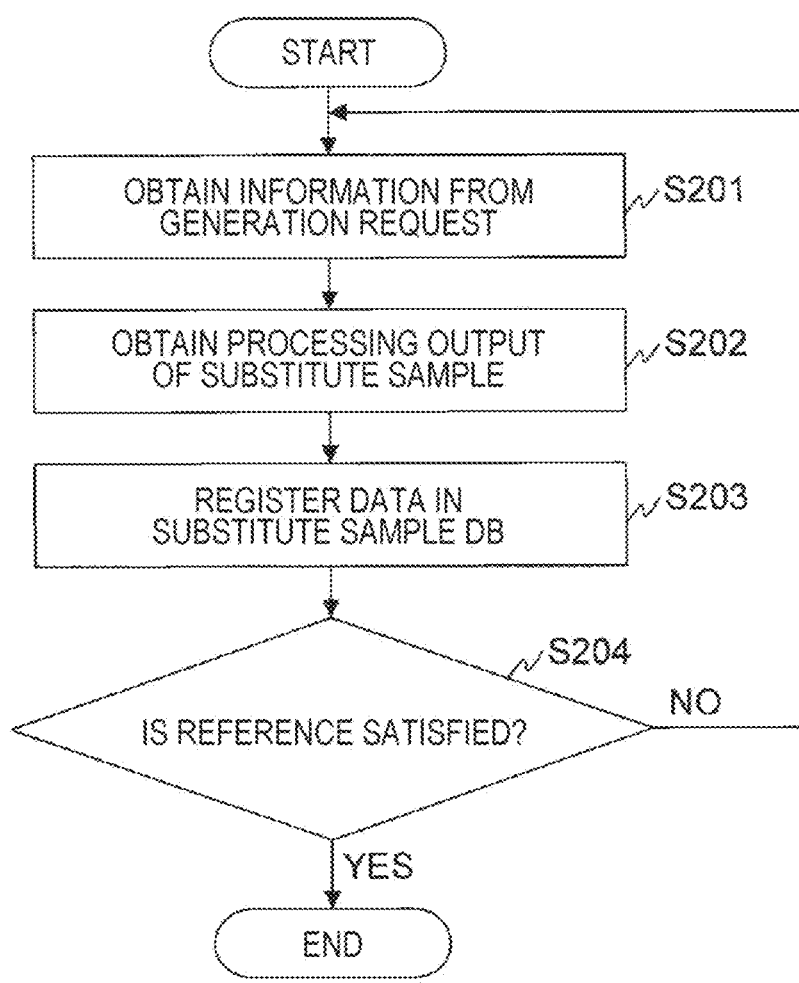
FIG. 12 is a diagram illustrating an example of a substitute sample DB generation processing executed by the analysis system of the first embodiment.
Figure 13:
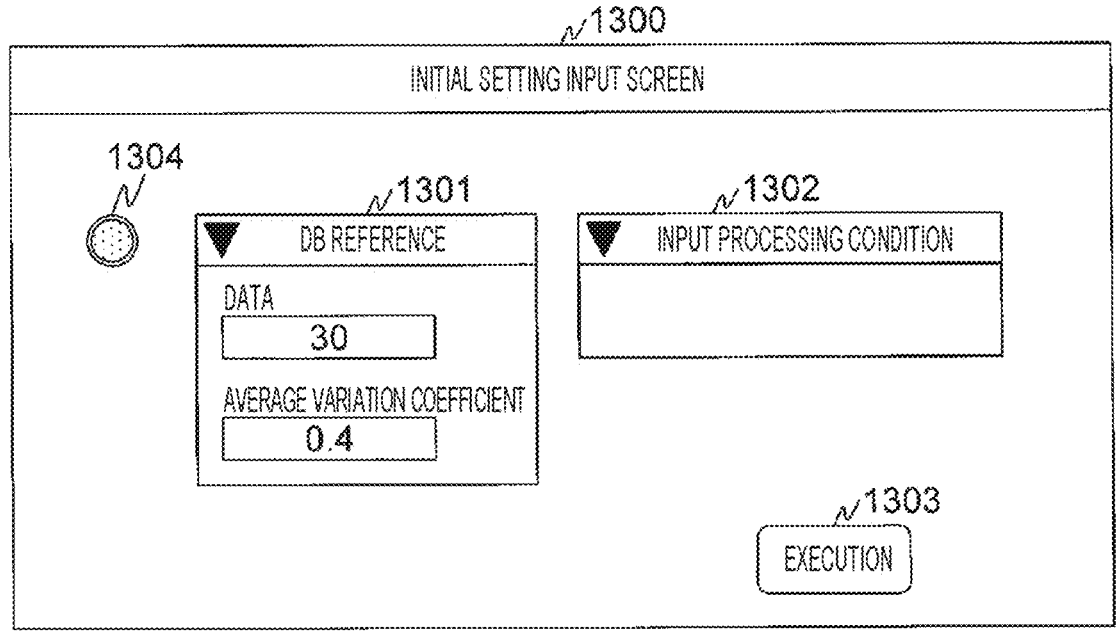
FIG. 13 is a diagram illustrating an example of the GUI displayed on the substitute sample terminal of the first embodiment.
Figure 14:
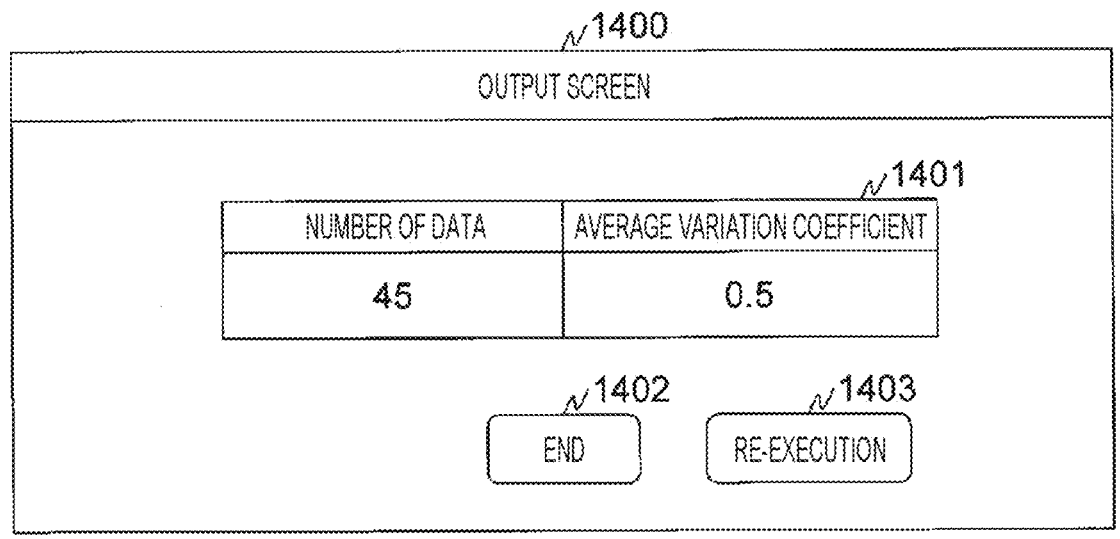
FIG. 14 is a diagram illustrating an example of the GUI displayed on the substitute sample terminal of the first embodiment.

Next, a method for generating the substitute sample DB 131 will be described. FIG. 12 is a diagram illustrating an example of a substitute sample DB 131 generation processing executed by the analysis system 40 of the first embodiment. FIGS. 13 and 14 are diagrams illustrating examples of the GUI displayed on the substitute sample terminal 10 of the first embodiment.

A user using the substitute sample terminal 10 performs an initial setting for generating the substitute sample DB 131 by using the GUI 1300 illustrated in FIG. 13. Here, the GUI 1300 will be described.

The GUI 1300 includes a DB reference column 1301, an input processing condition column 1302, an execution button 1303, and a lamp 1304.

The DB reference column 1301 is a column for setting a reference for the substitute sample DB 131 to be constructed, and includes a column for setting a reference for the total number of input data and an average variation coefficient. Here, the average variation coefficient is calculated by calculating the variation coefficient for each variable of the substitute sample processing output and taking the average of all the variables.

The input processing condition column 1302 is a column for setting the input processing condition 100. Instead of inputting a specific value, a column for selecting a means for automatically generating the input processing condition 100 may be provided. For example, an experimental design method, a random selection method, or a selection method based on a sparse region described later can be selected. A plurality of selection means may be combined.

The execution button 1303 is an operation button for instructing execution of the generation processing of the substitute sample DB 131.

The lamp 1304 indicates whether or not the input to the DB reference column 1301 or the input processing condition column 1302 is valid. In addition to the lamp 1304, pop-up display, audio reproduction, and the like may be performed. It is assumed that the lamp 1304 is turned on also when a valid value is input only in the input processing condition column 1302.

When the user sets a value in each column and operates the execution button 1303, the substitute sample terminal 10 transmits the input processing condition 100 to the processing device 20, and also transmits a generation request of the substitute sample DB 131 to the analysis system 40. The generation request includes the total number of data, the average variation coefficient, the input processing condition 100, and the like.

When receiving the generation request for the substitute sample DB 131, the analysis part 130 starts the generation processing of the substitute sample DB 131 described below.

First, the analysis part 130 obtains information included in the received generation request (step S201). At this time, the analysis part 130 holds the total number of data included in the generation request and the average variation coefficient as a reference for the substitute sample DB 131. In addition, the analysis part 130 temporarily holds the input processing condition 100 included in the generation request.

Next, the analysis part 130 obtains the processing output of the substitute sample from the processing device 20 (step S202). The processing output is a processing output of the processing performed based on the input processing condition 100.

Next, the analysis part 130 registers data in the substitute sample DB 131 (step S203). Specifically, the analysis part 130 registers the processing conditions and the processing output of the substitute sample in association with each other in the substitute sample DB 131.

Next, the analysis part 130 determines whether or not the substitute sample DB 131 satisfies the reference (step S204). Specifically, the following arithmetic processing is executed.

The analysis part 130 sets the total number of data and the average variation coefficient to 0.

The analysis part 130 holds the number of registered entries as the total number of data with reference to the substitute sample DB 131.

The analysis part 130 calculates an average variation coefficient with respect to the processing output in the substitute sample processing output space 611 with reference to the substitute sample DB 131. The analysis part 130 holds the calculated average variation coefficient value.

The analysis part 130 determines whether or not the total number of data is greater than the specified number and whether or not the average variation coefficient is greater than the specified numerical value. When the above conditions are satisfied, the analysis part 130 determines that the substitute sample DB 131 satisfies the reference. The above is the description of the processing in step S204.

When it is determined that the substitute sample DB 131 does not satisfy the reference, the analysis part 130 returns to step S201 and executes the same arithmetic processing. At this time, the analysis part 130 performs a display prompting the substitute sample terminal 10 to input a new processing condition.

When it is determined that the substitute sample DB 131 satisfies the reference, the analysis part 130 ends the generation processing of the substitute sample DB 131. At this time, the analysis part 130 generates display information for displaying the GUI 1400 as illustrated in FIG. 14 and transmits the display information to the substitute sample terminal 10. Here, the GUI 1400 illustrated in FIG. 14 will be described.

The GUI 1400 includes a result display column 1401, an end button 1402, and a re-execution button 1403.

The result display column 1401 is a column for displaying information on the generated substitute sample DB 131. In FIG. 14, the total number of data and the average variation coefficient are displayed. Details of the entries registered in the substitute sample DB 131 may be displayed.

The end button 1402 is an operation button for ending the generation processing of the substitute sample DB 131. When the user operates the end button 1402, the GUI 1400 is closed. The analysis part 130 may end the generation processing of the substitute sample DB 131 when the end button 1402 is operated.

The re-execution button 1403 is an operation button for executing the generation processing of the substitute sample DB 131 again. When the user operates the re-execution button 1403, the GUI 1300 is displayed.

The following reference can be adopted as the reference of the substitute sample DB 131. When the substitute sample DB 131 has the same processing output as the target substitute sample, or when the substitute sample processing output space 611 has a processing output of which the distance is close to the processing output of the target substitute sample, it is determined that the substitute sample DB 131 satisfies the reference. By adopting this reference, the substitute sample DB 131 with high calculation accuracy of the target processing condition 150 can be generated.

Figure 15:
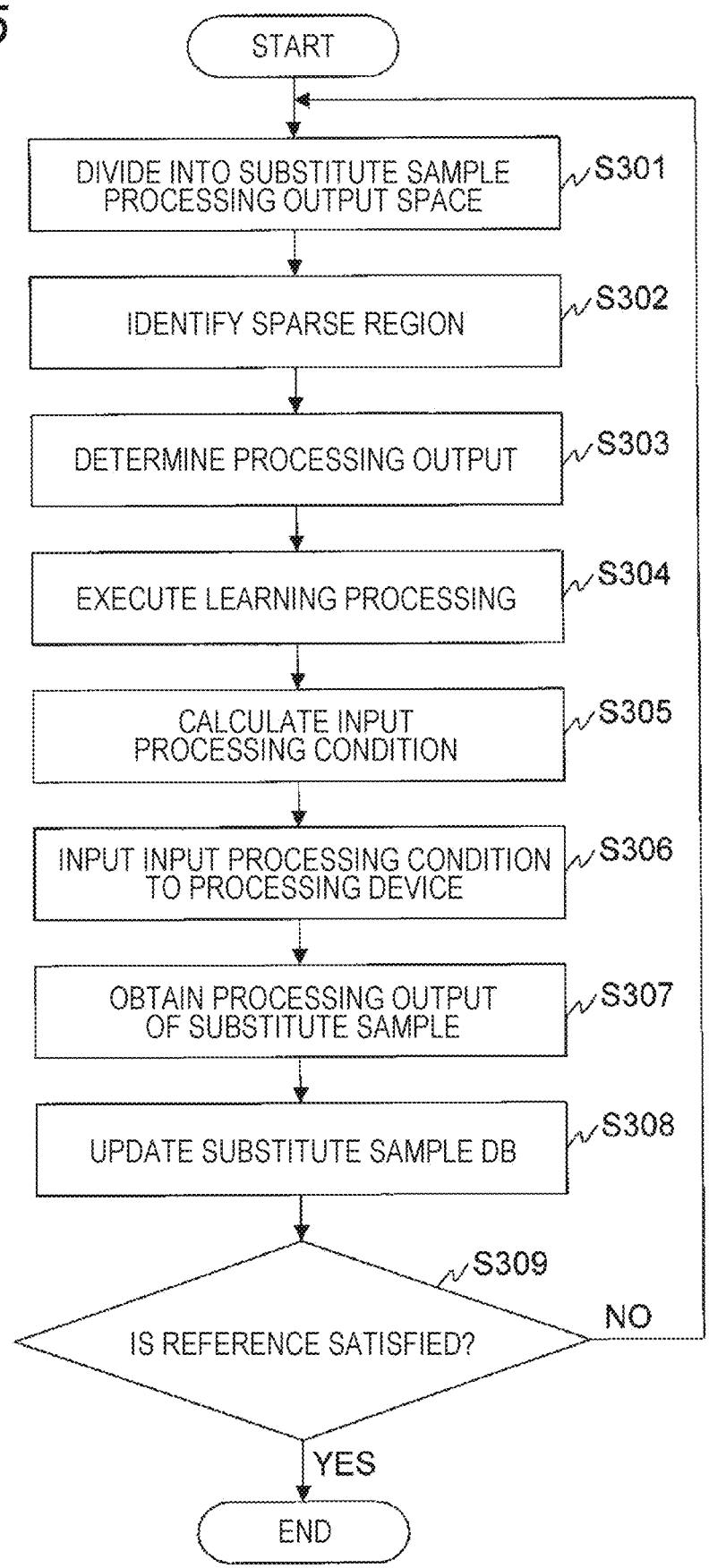
FIG. 15 is a flowchart for explaining an example of a substitute sample DB update processing executed by the analysis system of the first embodiment.
Figure 16:
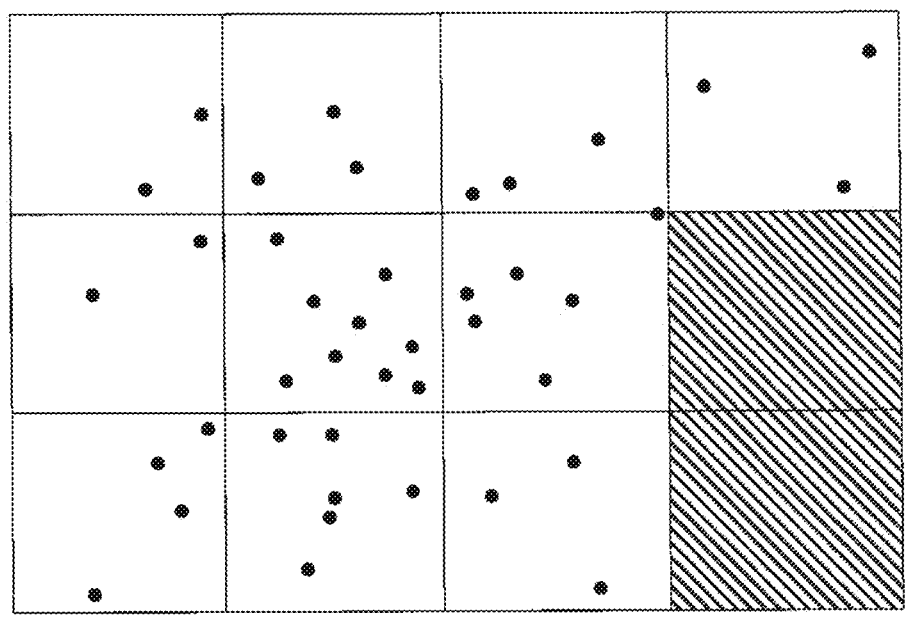
FIG. 16 is a diagram illustrating an example of a method for dividing a substitute sample processing output space of the first embodiment.
Figure 17:
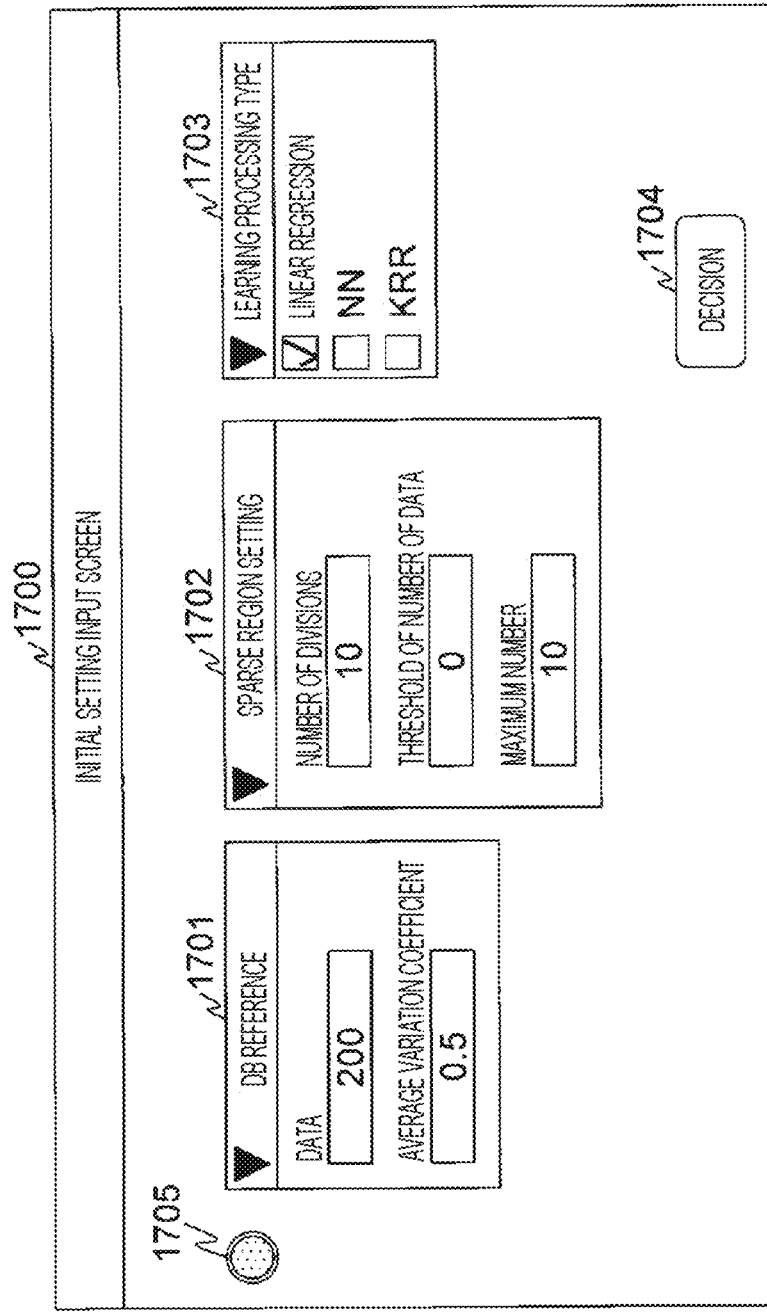
FIG. 17 is a diagram illustrating an example of the GUI displayed on the substitute sample terminal of the first embodiment.

FIG. 15 is a flowchart for explaining an example of the substitute sample DB 131 update processing executed by the analysis system 40 of the first embodiment. FIG. 16 is a diagram illustrating an example of a method for dividing the substitute sample processing output space 611 of the first embodiment. FIG. 17 is a diagram illustrating an example of the GUI displayed on the substitute sample terminal 10 of the first embodiment;

A user who is using the substitute sample terminal 10 performs a setting for updating the substitute sample DB 131 by using the GUI 1700 illustrated in FIG. 17. Here, the GUI 1700 will be described.

The GUI 1700 includes a DB reference column 1701, a sparse region column 1702, a learning processing type column 1703, a decision button 1704, and a lamp 1705.

The DB reference column 1701 is a column for setting the reference of the substitute sample DB 131, and includes a column for setting the total number of input data and the average variation coefficient.

The sparse region column 1702 is a column for setting a sparse region as a selection reference for the input processing condition 100, and includes a column for setting the number of divisions of the substitute sample processing output space 611, the number of data included in the divided regions, and the maximum number of the input processing condition 100 to be added. The number of data included in the divided region is used as an index for determining whether or not the divided region is a sparse region.

The learning processing type column 1703 is a column for selecting a specific calculation method of the learning processing using the substitute sample DB 131. In the learning processing type column 1703 of this embodiment, a check box for selecting a calculation method is displayed.

The decision button 1704 is an operation button for registering input in each column.

The lamp 1705 indicates whether or not the input to the DB reference column 1701, the sparse region column 1702, and the learning processing type column 1703 is valid. In addition to the lamp 1705, pop-up display, audio reproduction, and the like may be performed.

When the user sets a value in each column and operates the decision button 1704, the substitute sample terminal 10 transmits the setting information to the processing device 20.

When the generation processing of the substitute sample DB 131 ends, the setting information is received, or the update instruction is received from the user, the analysis part 130 executes the update processing of the substitute sample DB 131 described below. The analysis part 130 may periodically execute the update processing of the substitute sample DB 131.

First, the analysis part 130 divides the substitute sample processing output space 611 into a plurality of divided regions based on the value set in the sparse region column 1702 (step S301). For example, when the substitute sample processing output space 611 is two-dimensional, the substitute sample processing output space 611 is divided as illustrated in FIG. 16.

Next, the analysis part 130 identifies a sparse region from the divided regions based on the value set in the sparse region column 1702 (step S302).

Specifically, the analysis part 130 identifies a sparse region on the reference to the number of processing outputs included in the divided regions. For example, in the example illustrated in FIG. 16, the divided region provided with an oblique line in which no point representing a processing output exists is specified as a sparse region among the divided regions included in the substitute sample processing output space 611.

When the number of sparse regions is large, the analysis part 130 may select some sparse regions. As a selection method, a method of selecting at random or a method of selecting a divided region provided in the vicinity of the divided region including the processing output of the target substitute sample is considered. When the latter selection method is adopted, there is a possibility that the prediction accuracy of the target processing condition 150 can be improved.

As another method, the analysis part 130 identifies a predetermined number of divided regions as sparse regions in the order of decreasing processing output.

Note that the identification reference and identification method of the sparse region are merely examples, and the present invention is not limited thereto.

Next, the analysis part 130 determines an arbitrary processing output from the sparse region (step S303). For example, a method of randomly determining from a sparse region or a method of determining from a relative position in a sparse region is considered.

Next, the analysis part 130 executes a learning processing based on the value set in the learning processing type column 1703 and the substitute sample DB 131 (step S304) and generates a processing output-processing condition model 140.

If there is an existing processing output-processing condition model 140, the process of step S304 may be omitted.

The analysis part 130 may obtain the accuracy of the generated processing output-processing condition model 140 and execute the learning processing again when the accuracy is smaller than the threshold. For example, the analysis part 130 evaluates the accuracy of the processing output-processing condition model 140 by performing cross validation and determining whether or not the validation error is larger than the threshold.

Next, the analysis part 130 calculates the input processing condition 100 based on the processing output determined in step S303 and the processing output-processing condition model 140 (step S305).

Next, the analysis part 130 inputs the input processing condition 100 to the processing device 20 (step S306).

Next, the analysis part 130 obtains the processing output of the substitute sample from the processing device 20 (step S307).

Next, the analysis part 130 updates the substitute sample DB 131 (step S308). Specifically, the analysis part 130 registers the input processing condition 100 and the received processing output of the substitute sample in association with each other in the substitute sample DB 131.

Next, the analysis part 130 determines whether or not the substitute sample DB 131 satisfies the reference based on the value set in the DB reference column 1701 (step S309). The reference similar to the reference of step S205 can be applied as the reference of step S309.

When it is determined that the substitute sample DB 131 does not satisfy the reference, the analysis part 130 returns to step S301 and executes the same arithmetic processing.

When it is determined that the substitute sample DB 131 satisfies the reference, the analysis part 130 ends the update processing of the substitute sample DB 131.

As described above, according to this embodiment, the analysis system 40 does not need to obtain learning data from the actual sample and perform the learning. That is, the analysis system 40 can calculate the target processing condition 150 of the actual sample from the target processing output 101 of the actual sample. In this embodiment, the learning data is collected by using the substitute sample that is more inexpensive and easier to measure than the actual sample, and the learning processing is executed using the obtained data, so that the processing conditions of the actual sample can be obtained at high speed and low cost. That is, the processing conditions with high accuracy can be obtained while suppressing the process development cost.

Since the number of elements included in the processing output of the substitute sample may be equal to or less than the number of elements included in the processing output of the actual sample, measurement time, analysis time, and the like can be shortened.

Next, another embodiment of the present invention will be described.

First, when the actual sample-substitute sample model in the analysis system 40 illustrated in FIG. 1 is supplemented, and there is a DB of actual sample output and substitute sample output for the same processing conditions, the DB is stored in the model DB 132 to be input to the analysis part 130, and the correlation can be learned by the analysis method of the analysis part 130. By storing this result in the model DB 132, the actual sample-substitute sample relation model can be stored.

Even when the actual sample-substitute sample relation model is not a quantitative relationship but a qualitative correspondence relationship, it is possible to determine the target substitute sample output. For example, a case is considered in which variable A of substitute sample output and variable B of actual sample output have a qualitative actual sample-substitute sample relation model in which A is larger as B is larger. Also, a case is considered in which the case where B*, which is the maximum possible value of B, is used as the target actual sample output. At this time, the substitute sample output corresponding to the target actual sample output can be determined to be the maximum value A* which is the maximum possible value of A.

Then, in the output of the processing conditions that give the target actual sample output, the solution that becomes the obtained processing condition that gives the target substitute sample output is estimated using the sample output-processing condition model for the substitute sample obtained by the analysis. In addition, without using the sample output-processing condition model, the data having the substitute sample output closest to the obtained target substitute sample output is referred to from the substitute sample database stored in the model DB 132, and the processing condition of the data may be output as a solution. From the above, when the number of actual samples is limited and the condition search using actual samples cannot be performed sufficiently, the target processing condition can be searched by using the substitute sample DB and the actual sample-substitute sample relation model that has been known in advance.

In the additional processing condition determination procedure described with reference to FIG. 15, it is also possible to specify a sparse region including coordinates of the obtained target substitute sample output or a sparse region near the coordinates from all the sparse regions. By specifying the sparse region in this way, data near the target substitute sample output can be intensively increased, and the prediction accuracy of the actual sample processing condition of the target can be improved. In addition, an example of the reference of the DB will be described. When the data point of the obtained target substitute sample output and the neighboring data thereof are included in the DB, it can be determined that the reference is satisfied. Based on this reference, the DB including data near the target substitute sample output can be constructed.

In FIGS. 8A, 8B, 10A, and 10B, the description is given by using the processing characteristics of the etching target film when the substitute sample is exposed to plasma. The substitute sample can measure the characteristics of the medium in the vicinity of the opening of the hut. The method is to measure an aspect of processing each target film of the inside and outside of the hut, that is, an etching amount o in the hut outside portion, an etching amount i in the hut inside portion, a characteristic length d of the attenuation of the etching amount in the hut inside portion, or a characteristic length d of the attenuation of the thickness of the etching target film toward the opening from the back of the hut.

Therefore, the medium in the processing chamber or in the vicinity of the hut opening includes, in addition to plasma, a corrosive gas, a gas containing radicals, a mist that reacts with a processing target film, an aerosol, and the like.

In addition, when the medium is plasma, a sheath is formed on the surface of the substitute sample. Thus, when positive ions in the plasma are incident on the substitute sample surface, the positive ions are accelerated in the direction perpendicular to the wafer. Therefore, outside the hut, positive ions from the plasma, radicals, and source gas for plasma generation are incident. On the other hand, the incidence of positive ions is suppressed in a gap in the hut, and only the source gas for plasma generation and radical diffuse. Therefore, the plasma characteristics can be measured by measuring the etching amount of the inside and outside of the hut.

However, since the sheath is formed along the surface of the substitute sample, caution is required because the sheath is distorted around the opening of the roof (hut cover). The sheath distortion will be described later with reference to FIG. 24. The roof is also referred to as a hut cover in this specification.

Figure 24:
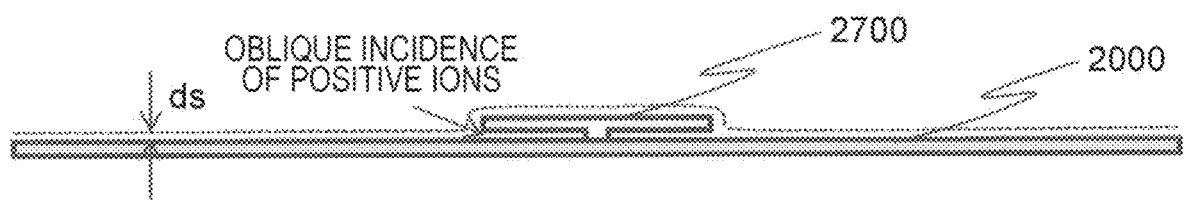
FIG. 24 is a diagram illustrating an example of a substitute sample having openings on both sides.

In FIG. 24, broken lines extending from an image sensor 2610 to a lens 2620, a hut cover 2700, and a wafer 2000 are outlines of optical paths of interference light used for film thickness measurement. A circle portion drawn with a broken line on the surface of the wafer 2000 is an observation region. By changing the focal distance of the lens 2620 and the area of the image sensor 2610, the area of the observation region can be changed.

By making the observation region wider than the hut cover, the thickness of the etching target film at a place other than the hut cover can be measured.

A plurality of hut covers can be installed on the wafer 2000, and the distribution in the wafer plane can be measured with respect to the thickness of the etching target film of the inner portion of the hut cover and the outer portion of the hut cover.

Similarly to FIGS. 8B and 10B, the base film and the etching target film are laminated on the surface of the wafer 2000.

By irradiating the etching target film with light, the thickness of the etching target film can be measured by measuring the interference light emitted from the etching target film.

As the light irradiated to the etching target film, a method of installing a light source outside the processing chamber and light generated inside the processing chamber 2001 can be used. As the light generated in the processing chamber, plasma light generated during plasma processing can be used. The method using an external light source will be described with reference to FIGS. 21 and 22.

When broadband light such as plasma light is used as the light source, it is necessary to perform spectroscopic measurement in order to measure the film thickness from the interference light. The spectroscopic measurement can be performed by limiting the wavelength incident on a camera by the optical filter 2630. By combining a band-pass filter or a low-pass filter and a high-pass filter as the optical filter 2630, the band of light incident on the camera can be limited.

By changing the lens 2620 or adding a lens between the optical filter 2630 and the image sensor 2610, it is possible to expand the observation region by enabling measurement at a wider angle. The wider the observation region, the wider the distribution can be measured.

However, in the measurement at a wide angle, when the interference light passes through the optical filter 2630, the incident angle with respect to the optical filter 2630 decreases as the optical path is separated from the central axis of the optical path of the interference light. In the band-pass filter in which a multilayer film is laminated, as the incident angle decreases from 90°, the wavelength of transmitted light shifts, and the transmission efficiency decreases. Thus, caution is required. The angle at which the interference light from each place in the observation region passes through the optical filter 2630 is estimated in advance, and the actual transmission wavelength is calculated by using the incident angle dependency of the transmission wavelength of the optical filter 2630. Thus, the thickness of the etching target film can be measured with high accuracy and in a wide observation region.

In the measurement at a wide angle, the light from the light source incident on the etching target film is incident obliquely on the etching target film, and thus the optical path in the etching target film varies depending on the incident angle. Therefore, the interference light intensity from each place of the observation region also has the incident angle dependency of light from the light source with respect to the etching target film. Therefore, when the angle dependency of the interference light intensity generated when light is incident on the etching target film is estimated, and the interference intensity of the light of the wavelength to be measured is calculated, the thickness of the etching target film can be measured with high accuracy and in a wide observation region.

Instead of estimating and using the light incident angle dependency on the optical filter 2630 and the light incident angle dependency on the etching target film, a method is provided which measure the thickness of the etching target film by calculating the actual interference light intensity distribution at the time of the change of the film thickness of the etching target film and using time-dependent change data of the interference light intensity at each measurement position at that time as a database. When the actual film thickness is linked to the measurement position and measurement time of the interference light, and the interference light and the database when measuring the film thickness of the etching target film of the same film type as when obtaining the database are compared, the film thickness distribution of the etching target film can be measured with high accuracy.

When a hyperspectral camera is used which can split light incident on each element of the image sensor 2610, it is not necessary to use the optical filter 2630. In addition, when broadband light is used as the light source, it is possible to obtain spectroscopic measurement results over multiple wavelengths, so that the accuracy of film thickness measurement can be improved.

The wavelength at which interference light can be measured may be limited due to the relation of the refractive index and the extinction coefficient between the etching target film and the laminated film before and after that or the space. However, the wavelengths at which film thickness can be measured can be used by measuring a plurality of wavelengths.

In a method of simply selecting the wavelength and measuring the interference film, it is possible to set a filter having a different transmission wavelength on the filter wheel (filter changer) and select the filter.

Assuming that an X axis is set to be parallel to A-A', that is, to be an axial direction from the opening of the hut cover to the back side, when the X-axis direction distribution of the film thickness distribution of the etching target film in the hut cover is measured, the characteristics of a medium such as plasma for processing the etching target film in the vicinity of the opening can be evaluated.

In a case where the characteristics of the plasma for processing the etching target film near the hut cover opening are uniform, the absolute values of the X-axis direction distribution of the etching target film thickness are the same value at an arbitrary position in positions away from both sides of the hut. That is, the axial distribution can be measured at an arbitrary position in the central portion of the hut.

When the gap of the hut cover is within a certain range, the X-axis direction distribution can be measured and the characteristics can be evaluated at an arbitrary position. Therefore, if it is sufficient to measure one axis, a line scan type camera can be used.

In the above method using a camera, it is possible to obtain substitute sample outputs at considerably many points in the observation region with the number of pixels of the image sensor as an upper limit.

Figure 19:
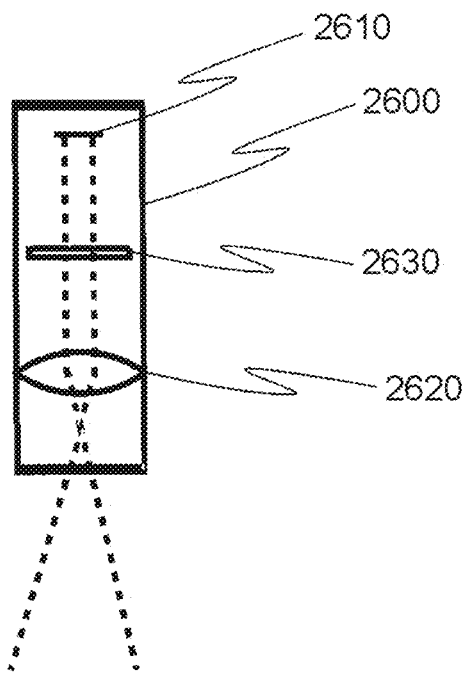
FIG. 19 is a diagram illustrating an example of an optical system in a camera system for substitute sample output measurement.

In FIG. 19, the lens 2620 that makes the optical path from the lens 2620 to the image sensor 2610 telecentric is used. By installing the optical filter 2630 in the telecentric optical path part, the incident angle of the interference light to the optical filter 2630 can be made perpendicular. Thus, it is possible to avoid shift and attenuation of transmission wavelength that occur when the interference light is obliquely incident on the optical filter 2630. In addition, the small optical filter 2630 having the same size as the image sensor can be used.

Figure 20:
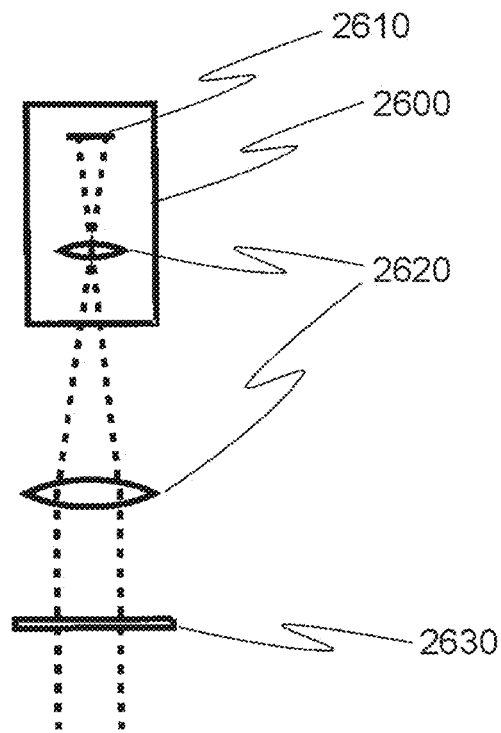
FIG. 20 is a diagram illustrating an example of the optical system in the camera system for substitute sample output measurement.

In FIG. 20, the lens 2620 that makes the optical path from the lens 2620 to the wafer telecentric is used. By installing the optical filter 2630 in the telecentric optical path part, the incident angle of the interference light to the optical filter 2630 can be made perpendicular. Thus, it is possible to avoid shift and attenuation of transmission wavelength that occur when the interference light is obliquely incident on the optical filter 2630. The lens 2620 can have a configuration in which an additional lens is added to the lens mounted in the camera. In addition, it is possible to obtain a target optical path by using a method of replacing the lens inside the camera with a lens for obtaining a target optical path or by using only an additional lens.

Figure 21:
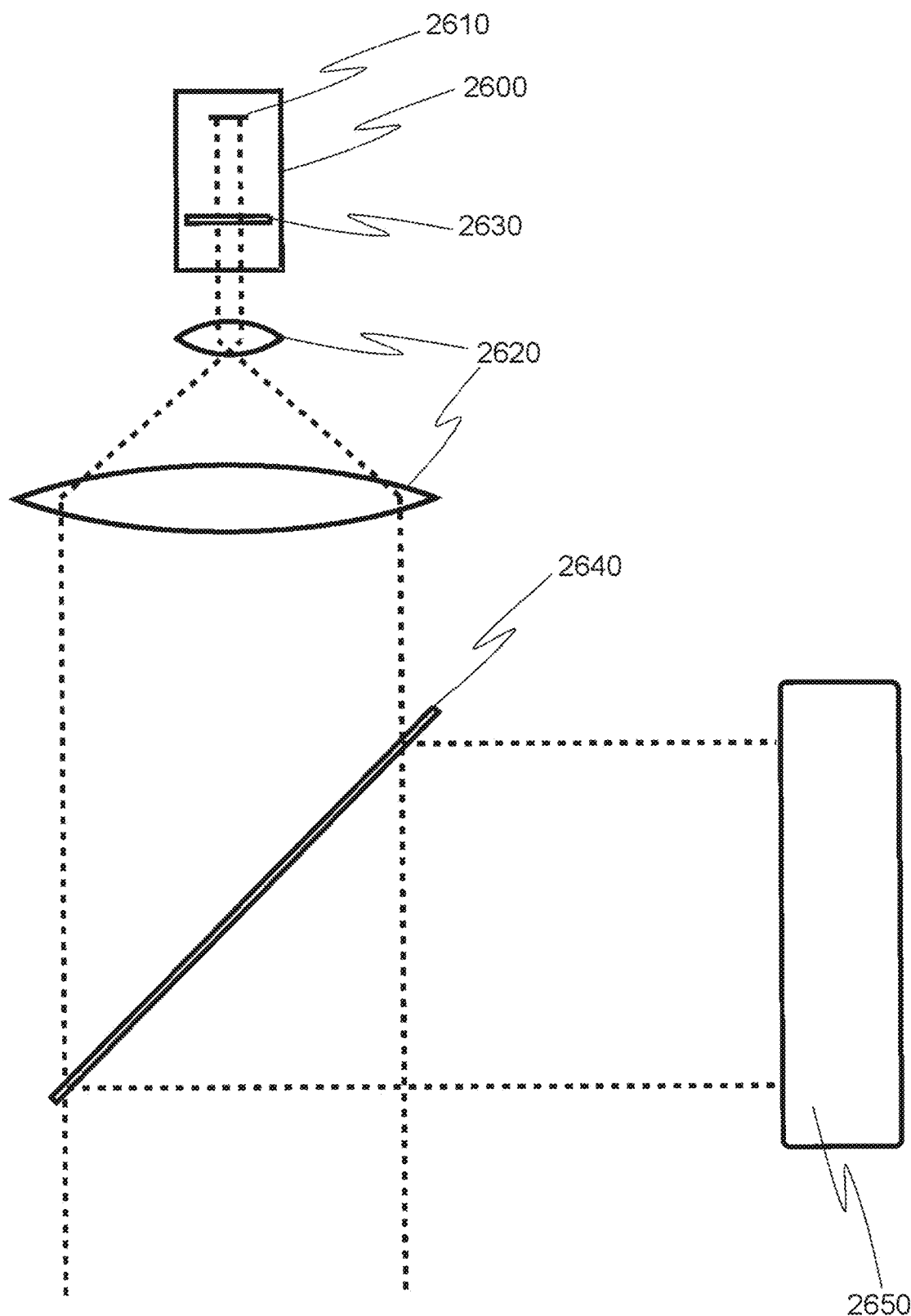
FIG. 21 is a diagram illustrating an example of the optical system and an external light source in the camera system for substitute sample output measurement.

In FIG. 21, the lens 2620 that makes the optical path before and after the lens 2620 telecentric is used. In addition, a half mirror 640 is installed in the optical path from the lens 2620 to the wafer, and light from the light source 2650 is incident on the half mirror 2640. With this configuration, the light from the light source 2650 travels vertically from the half mirror 2640 to the wafer and generates interference light in the observation region. The interference light from the observation region returns to the half mirror 2640 again, and the light transmitted through the half mirror 2640 can be measured by the camera.

In the method of FIG. 21, the optical paths of the light of the light source and the interference light are coaxial between the camera 2600 and the wafer 2000. Therefore, when the angle of the optical path of the wafer 2000 from the lens 2620 is made wide, the interference light measurable by the camera and the observation range are greatly reduced as the angle of the optical path becomes wider, to which caution is required.

The position of the half mirror 2640 can also be installed on the image sensor side from the lens 2620. In that case, the small half mirror 2640 having the same size as the image sensor can be used.

The wavelength band of the light source 2650 and the transmission and reflection wavelength bands of the half mirror 2640 need to be the same as or wider than the transmission band of the optical filter 2630. In addition, when the multispectral simultaneous spectral measurement is performed by using the hyperspectral camera described above, it is desirable that the light source 2650 be a broadband light source. In addition, it is desirable that the transmission and reflection wavelength band of the half mirror be approximately the same as or wider than the band of the light source 2650.

As the light source 2650, an LED, an Xe lamp, a halogen lamp, a deuterium lamp, a fluorescent lamp, or a laser can be used. However, when a narrow band light source such as a laser is used, it is necessary to match the transmission wavelength of the optical filter 2630 and the half mirror 2640 with the wavelength range of the laser.

The light from the light source 2650 is preferably incident on the half mirror 2640 as telecentric light by using a lens, a mirror, or the like. In addition, by configuring the light source 2650 with a large number of light sources, the light amount can be increased, and the wavelength band can be expanded.

Figure 22:
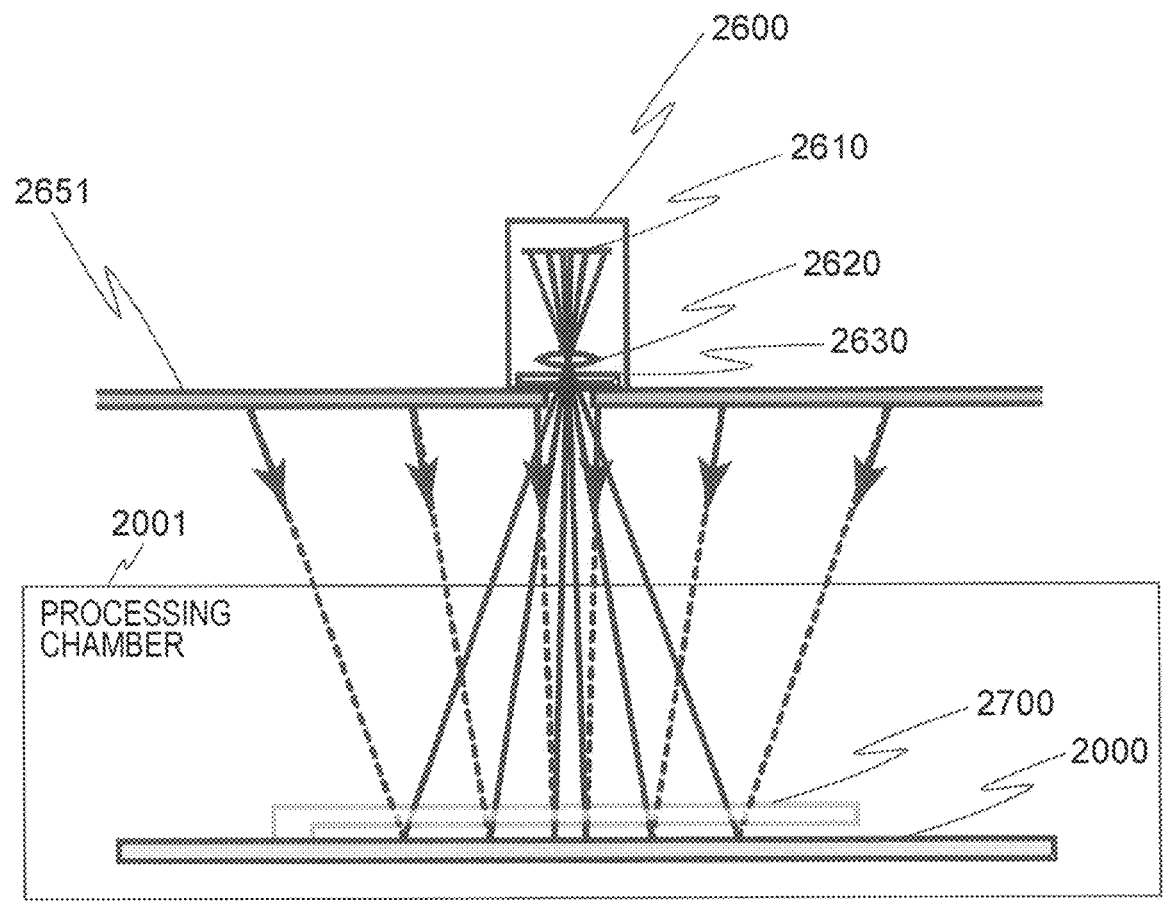
FIG. 22 is a diagram illustrating an example of the optical system and external illumination in a camera system for substitute sample output measurement.

In FIG. 22, an illumination 2651 is used as the light source. The illumination 2651 is configured by a large number of light sources or is a surface-emitting light source, and can irradiate the entire wafer 2000 with light.

A hole or window for introducing interference light into the camera 2600 is provided in the central portion of the illumination 2651. The light from the illumination 2651 is emitted isotropically toward the wafer from a large number of light sources or light emitting surfaces. Therefore, the interference light from the entire observation region can be introduced into the camera 2600. Further, by changing the lens 2620, it is possible to measure the interference light from the entire observation region even when the size of the observation region is changed. An arrow and a broken line and a solid line subsequent thereto in FIG. 22 are examples of the optical path of the emitted light from the illumination 2651 and the interference light introduced into the camera 2600. For the optical path and optical filter 2630, the configurations of FIGS. 18 and 19 can be used.

Figure 23:
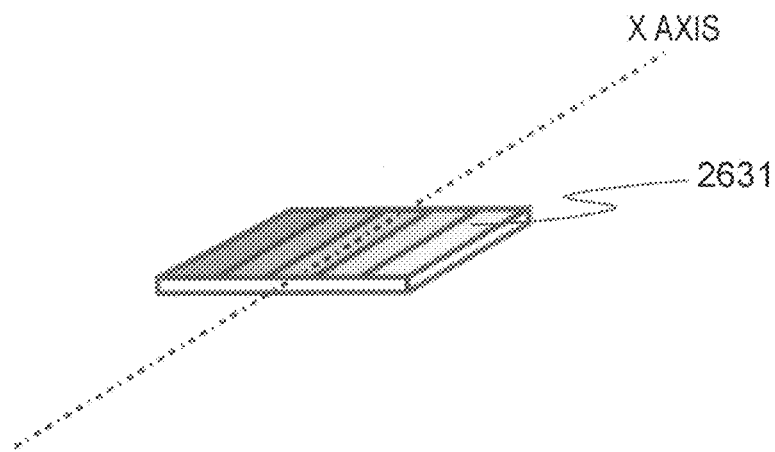
FIG. 23 is a diagram illustrating an example of a multi-optical filter.

FIG. 23 illustrates a multi-optical filter 2631 that selectively transmits a plurality of wavelengths. By arranging a plurality of optical filters 2630 having different transmission wavelengths, a plurality of wavelengths can be selectively transmitted. As described above, the axial distribution from the opening of the hut cover to the back side can be measured at an arbitrary position inside the hut cover. Therefore, if the axis of the multi-optical filter 2631 that transmits only the same wavelength is set as the X axis, the multi-optical filter 2631 and the X axis inside the hut cover can be set in the same direction, so as to enable measurement using multiple wavelengths.

Figure 18:
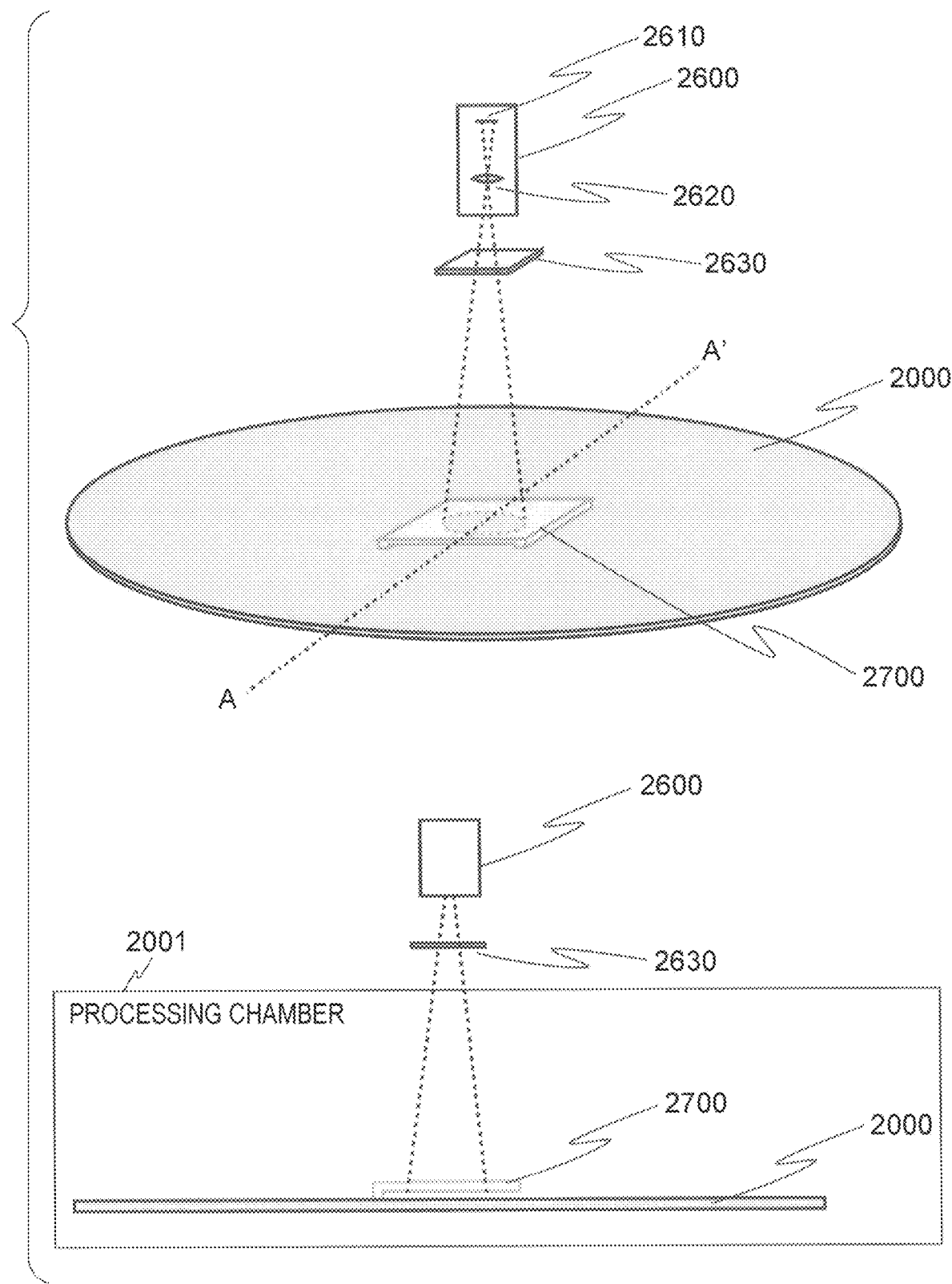
FIG. 18 is a diagram illustrating a method of measuring a substitute sample output using a camera system.

As illustrated in FIGS. 21, 20, and 18, when the optical path toward the wafer 2000 is enlarged by the lens 2620, a large filter can be installed. Thus, it is possible to install the multi-optical filter 2631 having a larger number of transmission wavelengths. However, as described above, when the optical path has a wide angle, it is necessary to consider the incident angle of light with respect to the filter and the wafer.

FIG. 24 illustrates the hut cover 2700 in which both ends of the hut cover in FIG. 18 are released, and a partition is provided at the central portion. Therefore, it is possible to evaluate the characteristics of a medium such as plasma for processing the etching target film in the vicinity of the two left and right openings.

When the characteristic length d of the attenuation in the hut inside portion is shorter than the length from the hut opening to the partition, the partition may be omitted.

When the substitute sample is exposed to plasma, it is necessary to consider the influence of sheath distortion caused by the presence of the hut. The sheath has a thickness ds that depends on a plasma density and a bias output applied to the wafer, and the sheath is formed along the shape of the hut as indicated by the broken line in FIG. 24. Since the sheath is distorted along the hut cover, positive ions are accelerated and obliquely incident on the etching target film under the hut cover in the vicinity of the opening of the hut.

Therefore, the phenomenon of processing the etching target film differs between the vicinity of the opening of the hut where positive ions are incident and the inside of the hut where no positive ions are incident.

Therefore, it is desirable that the etching amount i in the hut inside portion and the characteristic length d of the attenuation of the etching amount in the hut inside portion be measured as values divided into the vicinity of the opening of the hut and the inside of the hut.

It is desirable that the positions of the vicinity of the opening of the hut and the inside of the hut be positions be at least two times the height of the gap in the hut cover from the hut opening in the X-axis direction. Even when the axial distribution of the etching target film in the vicinity of the opening becomes complicated and it is difficult to measure the characteristic length of attenuation, it is possible to obtain the measurement value inside the hut.

Figure 25:
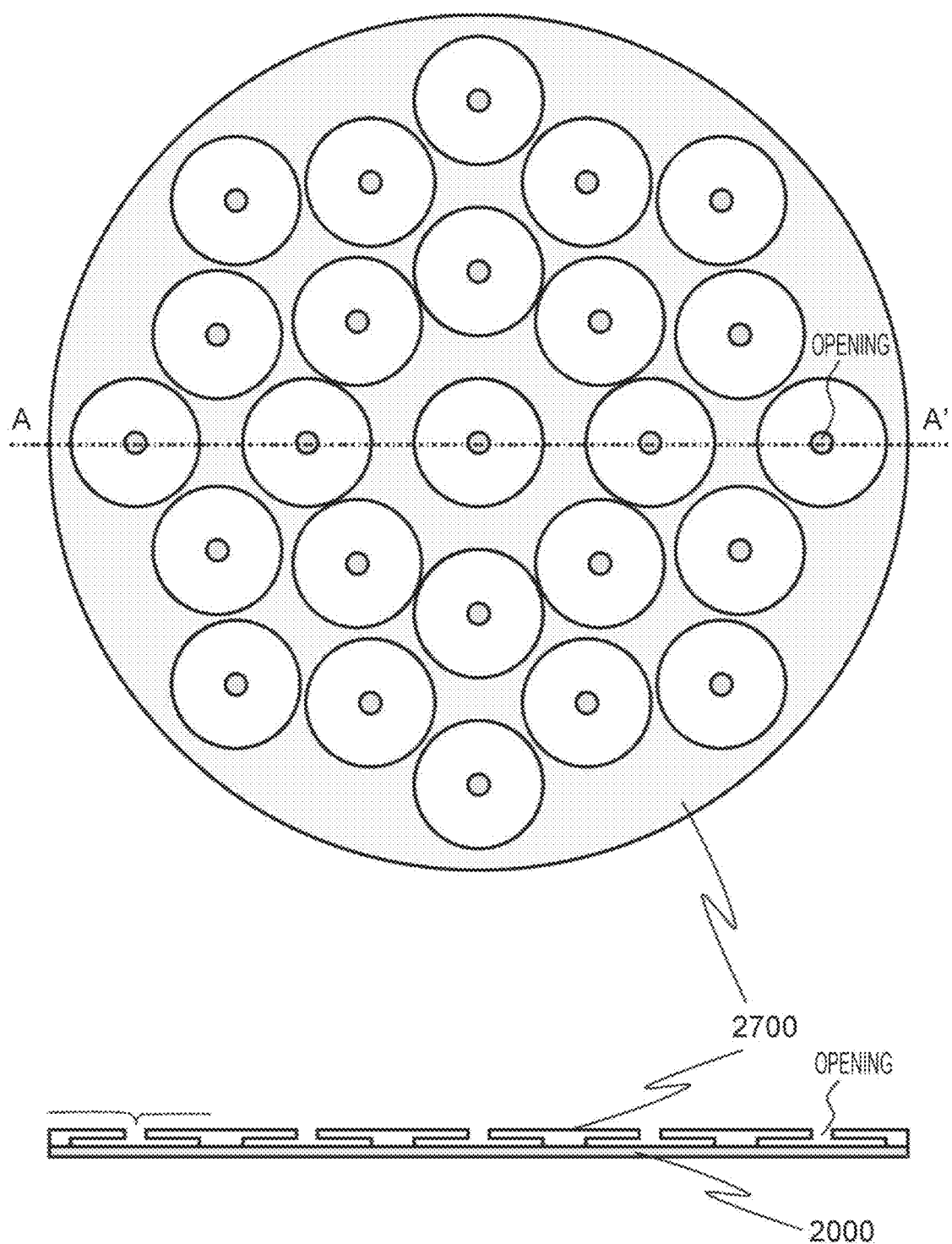
FIG. 25 is a diagram illustrating an example of a substitute sample that enables in-wafer plane distribution measurement.
Figure 26:
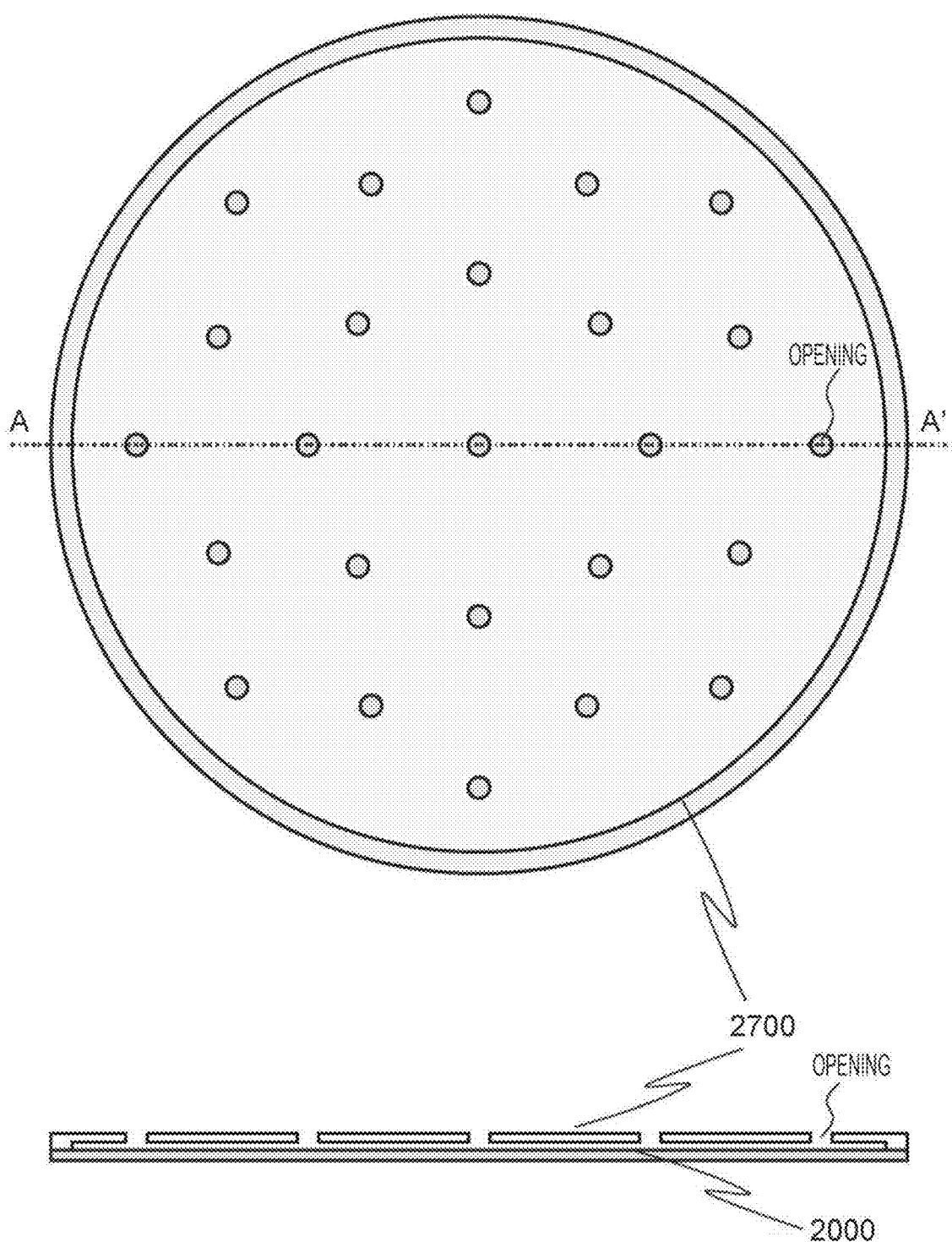
FIG. 26 is a diagram illustrating an example of the substitute sample that enables in-wafer plane distribution measurement.

FIG. 25 illustrates the hut cover 2700 that covers the entire wafer. By providing a plurality of openings of the hut as holes in the upper portion of the hut cover, it is possible to obtain the distribution in the wafer surface with respect to the characteristics of the medium such as a plasma for processing the etching target film. In FIG. 26, the gap is partitioned by the hut cover such that there is a gap having a certain radius from the opening in the hut inside portion, and thus, the characteristics of the medium in the vicinity of each opening can be obtained.

By providing a hole in the upper portion of the hut cover, it is possible to suppress the influence of the above-described sheath distortion. In FIG. 26, since the entire periphery of the hole is a hut cover, the distortion of the sheath can be suppressed by reducing the diameter of the hole. By reducing the diameter of the hole to be less than two times the sheath thickness, as indicated by the broken line, the sheath is superposed on the central portion where the sheath is distorted from the right and left of the hole to the center, and the distortion of the sheath is relieved. By making the diameter of the hole one time or less the sheath thickness, the distortion of the sheath can be further suppressed.

If the characteristic length d of the attenuation in the hut inside portion is shorter than the length from the hut opening to the partition, several pillars to support the cabin may be left, or the outermost peripheral portion of the hut cover may be left as a support with the partition of the other parts eliminated.

FIG. 26 illustrates the hut cover 2700 in which the partition of the outermost peripheral portion of the hut cover described in FIG. 25 is left.

Figure 27:
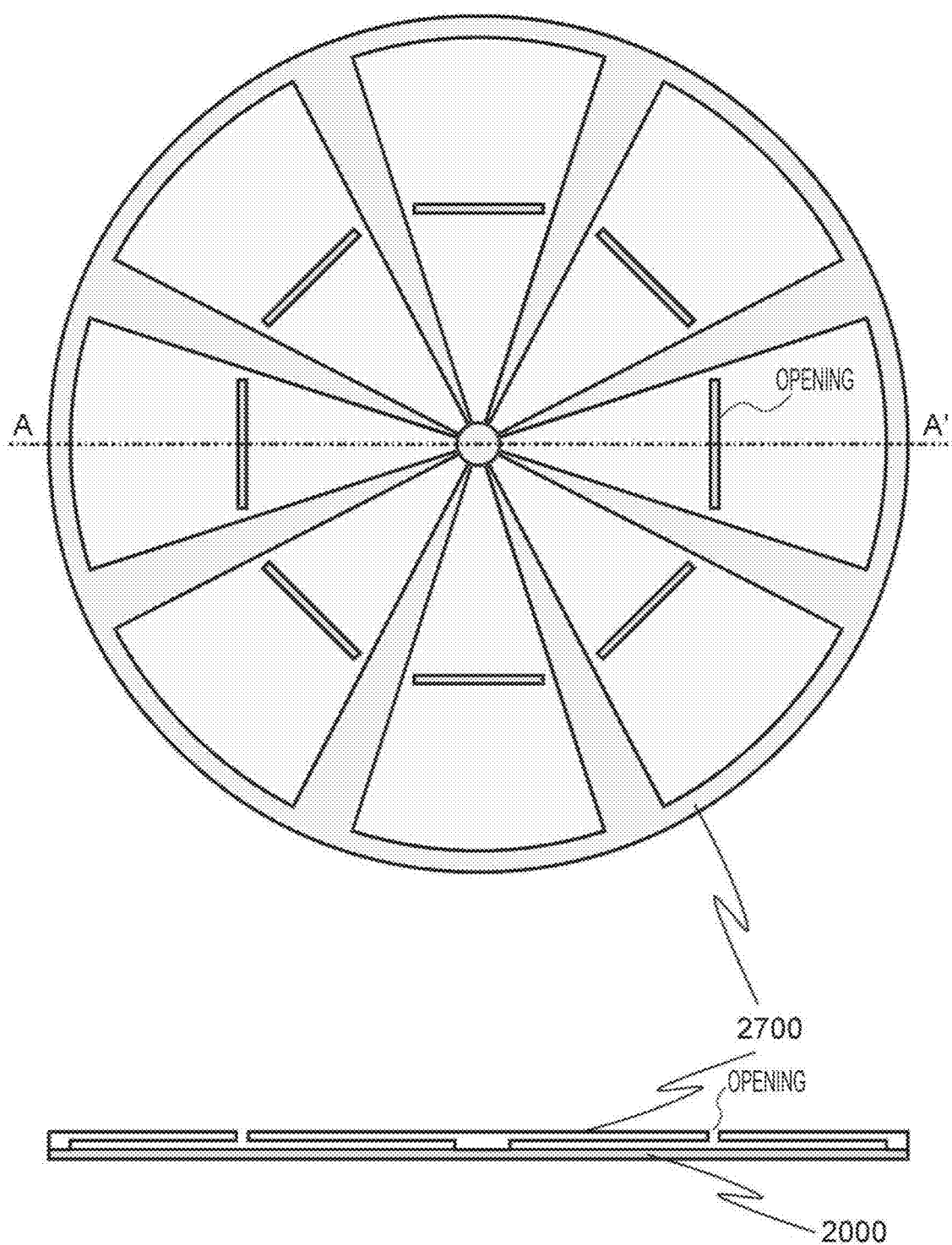
FIG. 27 is a diagram illustrating an example of a substitute sample that enables measurement of distribution in a circumferential direction of a wafer.

FIG. 27 illustrates the hut cover 2700 in which the circumferential distribution of the characteristics of a medium such as a plasma for processing the etching target film can be measured by making the gaps in the hut cover and the partition portions for each hut cover radial.

In FIG. 27, the opening has a linear shape. However, a more accurate circumferential distribution can be measured by making this an arc shape.

The circumferential distribution of the desired position can be measured by changing the position of the opening in the radial direction.

The circumferential distribution at a plurality of radial positions can be measured by providing a circumferential partition and an opening in each gap.

Figure 28:
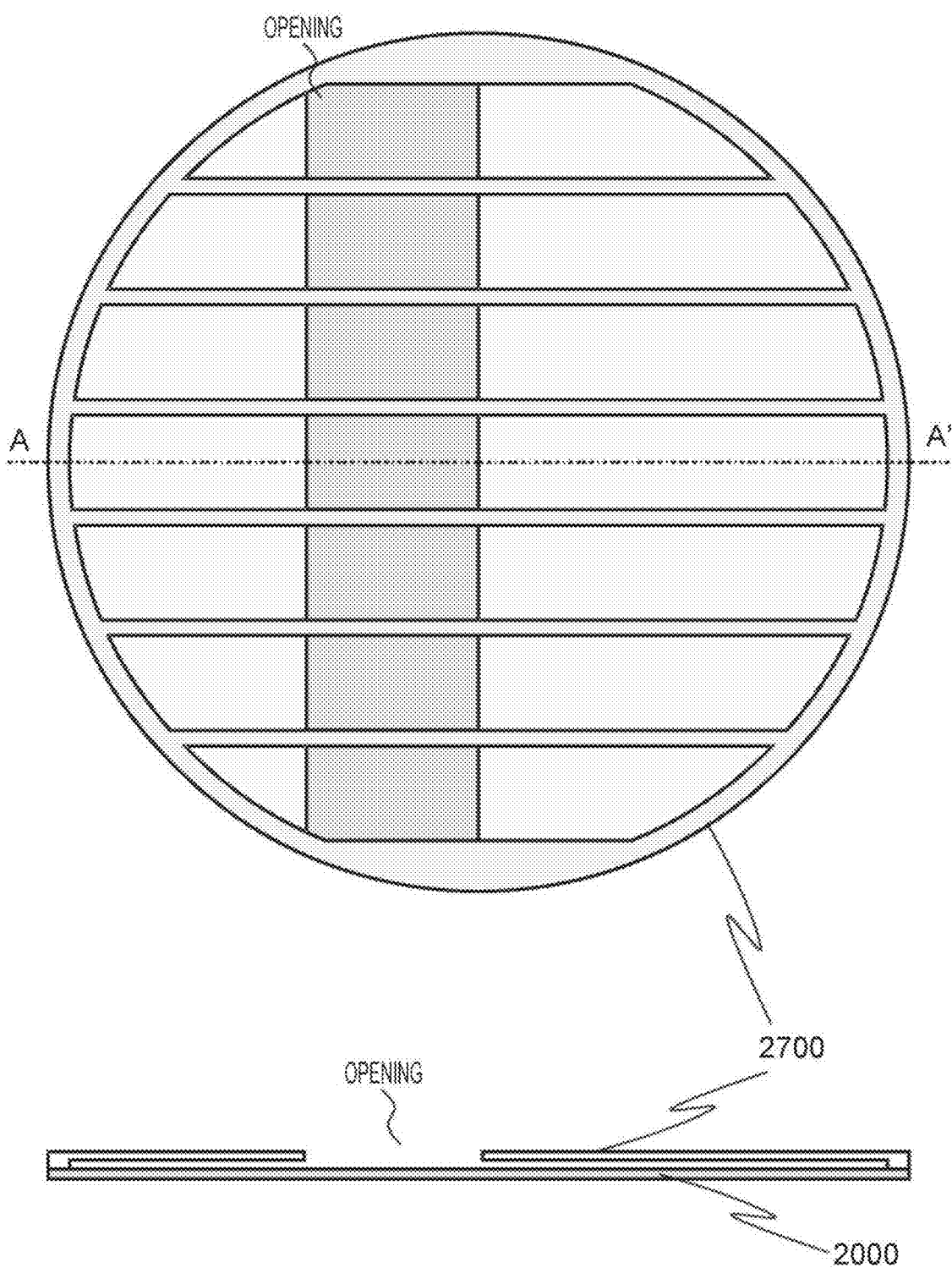
FIG. 28 is a diagram illustrating an example of a substitute sample that enables measurement of distribution in an axial direction of the wafer.

FIG. 28 illustrates the hut cover 2700 provided with a gap in the X-axis direction. Assuming that the direction perpendicular to the X axis is a Y-axis direction, the Y-axis direction distribution of the characteristics of a medium such as a plasma for processing the etching target film can be measured by using the configuration of FIG. 28.

In FIG. 28, by increasing the width of the opening, it is possible to obtain the etching amount o of the opening portion, that is, the hut outside portion. In addition, by increasing the width of the opening, the processing amount of the etching target film by a medium such as plasma for processing the etching target film can be obtained in the opening.

Since it is necessary to suppress the influence of the reaction between the hut cover and the surrounding medium on the processing characteristics of the etching target film in the opening portion, the size of the opening portion needs to be at least larger than the hut cover.

When the etching amount by plasma is measured in the opening portion, that is, in the hut outside portion, it is necessary to make the size of the opening portion three times or more the sheath thickness in order to avoid the influence of the distortion of the sheath formed along the shape of the hut cover.

In order to further suppress the influence of the reaction between the hut cover and the surrounding medium on the processing characteristics of the etching target film in the opening portion, it is desirable to make the size of the opening at least two times that of the hut cover, ten times or more the sheath thickness, or further 1 cm$^2$ or more than the sheath thickness.

The opening portion described above can be provided in a part of FIGS. 25, 26, and 27. In addition, the characteristics of the opening can be measured by enlarging the size of the opening illustrated in FIGS. 25, 26, and 27.

Figure 29:
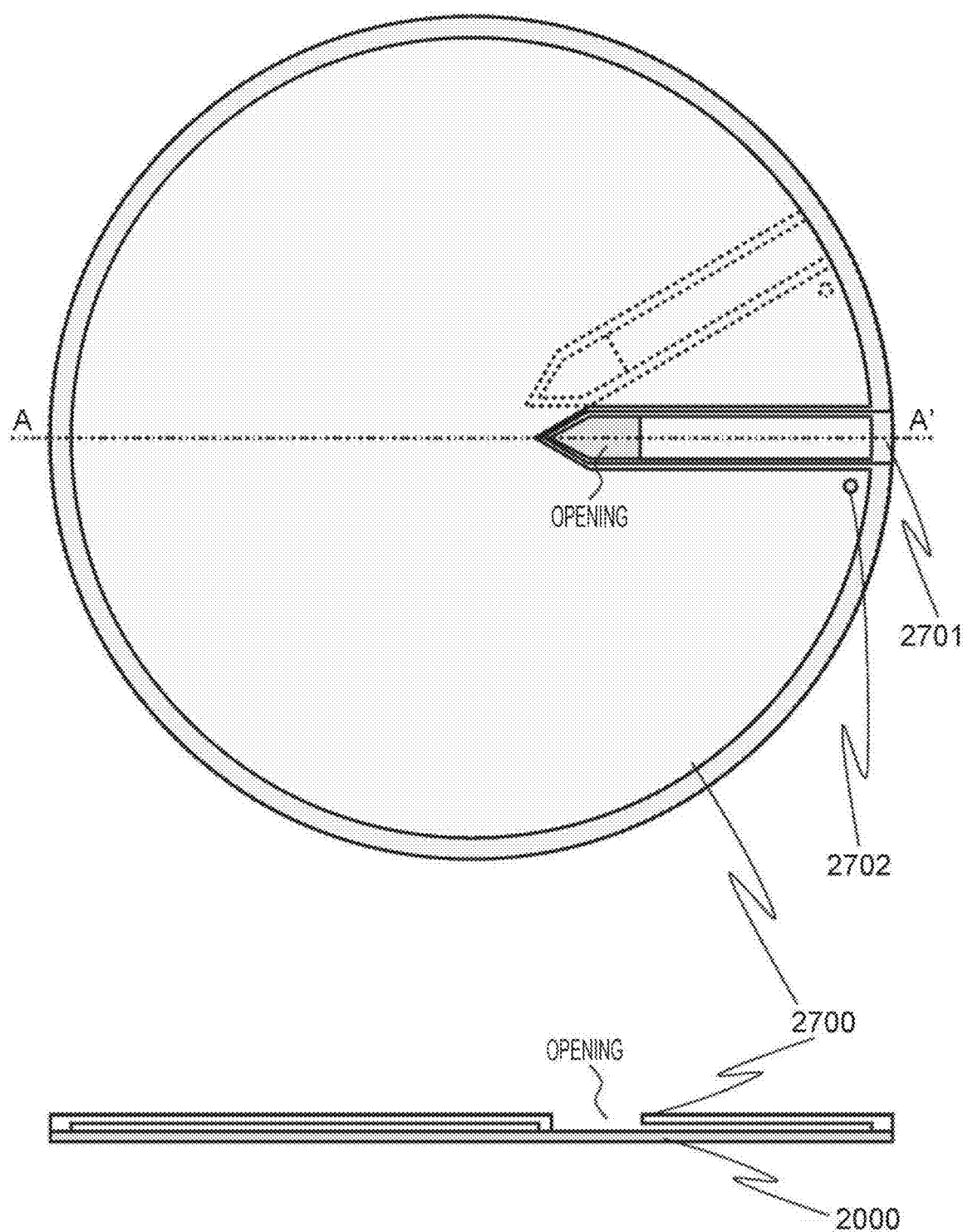
FIG. 29 is a diagram illustrating an example of a substitute sample that enables a plurality of times of measurement of the substitute sample output.

FIG. 29 illustrates the hut cover 2700 in which a gap and an opening are provided in the hut cover that covers the entire wafer. A portion having these gaps and openings is referred to as a measurement part 2701.

First, a case will be described in which the hut cover 2700 and the measurement part 2701 are configured as an integral unit.

Most regions inside the hut cover have gaps to avoid contact between the etching target film and the hut cover. On the other hand, the processing of the etching target film in the gap in the hut cover other than the measurement part is prevented by providing a partition between the measurement part and the hut cover.

With the above configuration, after the substitute sample is used for measurement, the hut cover 2700 is rotated to move the measurement part to a portion where the etching target film is not used, thereby allowing measurement again. Therefore, measurement can be performed a plurality of times by using one wafer with an etching target film.

When the hut cover 2700 rotates, the bottom surface of the partition surrounding the measurement part 2701 comes into contact with the etching target film. In order to avoid damage to the surface of the etching target film due to this contact, when the partition is rotated, the hut cover may be lifted once and then rotated.

In a case where the hut cover is rotated while being slid, the partition can be fixed to the upper surface of the hut cover or extended from the upper surface, so as to have a length that the partition does not contact the etching target film. However, in this case, the etching target film may be slightly processed on the outer portion of the partition in the vicinity of the measurement part 2701. Thus, the number of times that repeated measurement can be performed is reduced, to which caution is required. In order to suppress the processing of the external portion of the partition as much as possible, it is desirable to make the space between the partition and the etching target film immediately below the partition as small as possible. In addition, by providing minute portions or dots to be a contact portion with the etching target film on the lower surface of the partition and limiting the contact area with the etching target film, it is possible to suppress the disturbance to the measurement results resulting from the partition contacting the etching target film.

The damage to the etching target film by the contact portion can be suppressed by giving a low friction material or a coating for reducing friction on the lower surface of the partition. By reducing the size of the low friction material or the coating, it is possible to suppress the reaction with the medium. However, in some combination of the medium and the material applied to the lower surface of the partition, the disturbance to the measurement result may increase, to which caution is required.

Next, a configuration will be described in which the hut cover 2700 and the measurement part 2701 are separable. In the central portion of the partition, the hut cover 2700 and the measurement part 2701 are configured to be separated from each other, so that the measurement part can be exchanged with the measurement part 2701 which is different in the area, shape, position, number of the openings of the measurement part 2701 and the depth and width of the gap.

In a case where the substitute sample of FIG. 29 is used under reduced pressure, when a gas remains in the gap in the hut cover other than the measurement part 2701, and the remaining gas is released into the processing chamber, it is not possible to measure the processing characteristics of the target etching target film when a desired medium such as a plasma is generated in the processing chamber. In addition, the pressure due to the remaining gas is generated, which may destroy the substitute sample itself. In order to prevent this, a vent hole 2702 is provided in a part of the hut cover 2700.

However, since the etching target film around the vent hole is processed during the measurement, the portion cannot be used as the measurement part. Therefore, it is desirable that the area of the vent hole be several+mm$^2$ or less.

By providing the vent hole 2702 in the partition part between the hut cover 2700 and the measurement part 2701 and connecting the gap in the measurement part and the gap other than the measurement part, the remaining gas can be exhausted from the opening.

Figure 30:
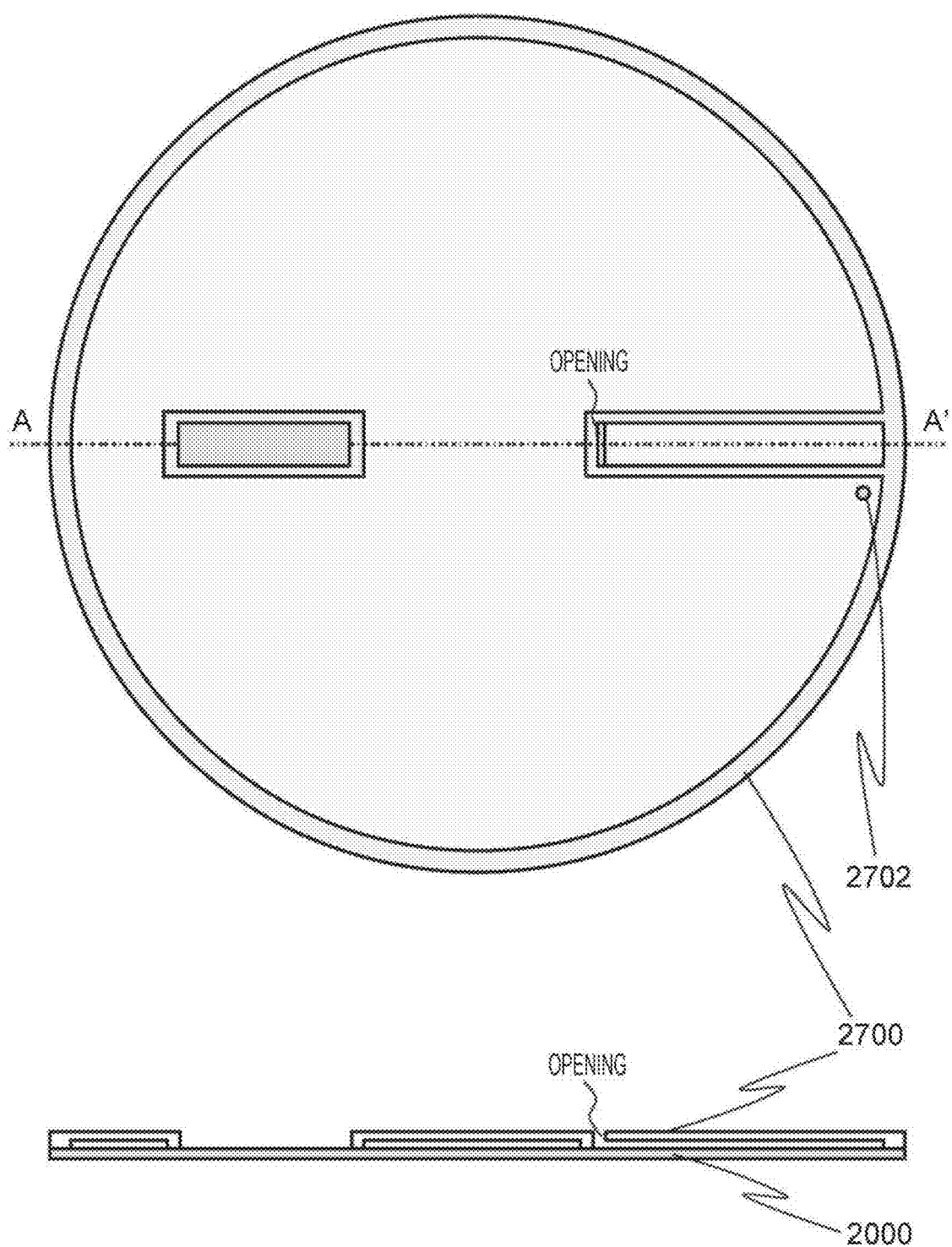
FIG. 30 is a diagram illustrating an example of a substitute sample that enables a plurality of times of measurement of the substitute sample output.

FIG. 30 illustrates the hut cover 2700 in which the opening and the measurement part in FIG. 29 are provided to be positioned separately. In a case where the sum of the length of the opening and the length of the gap below the hut cover in the X-axis direction exceeds the wafer radius, the configuration of FIG. 30 can be used. In addition, the radial distribution of the opening can be measured. Furthermore, the measurement is possible even when the characteristic length d of the attenuation in the hut inside portion is long.

Figure 31:
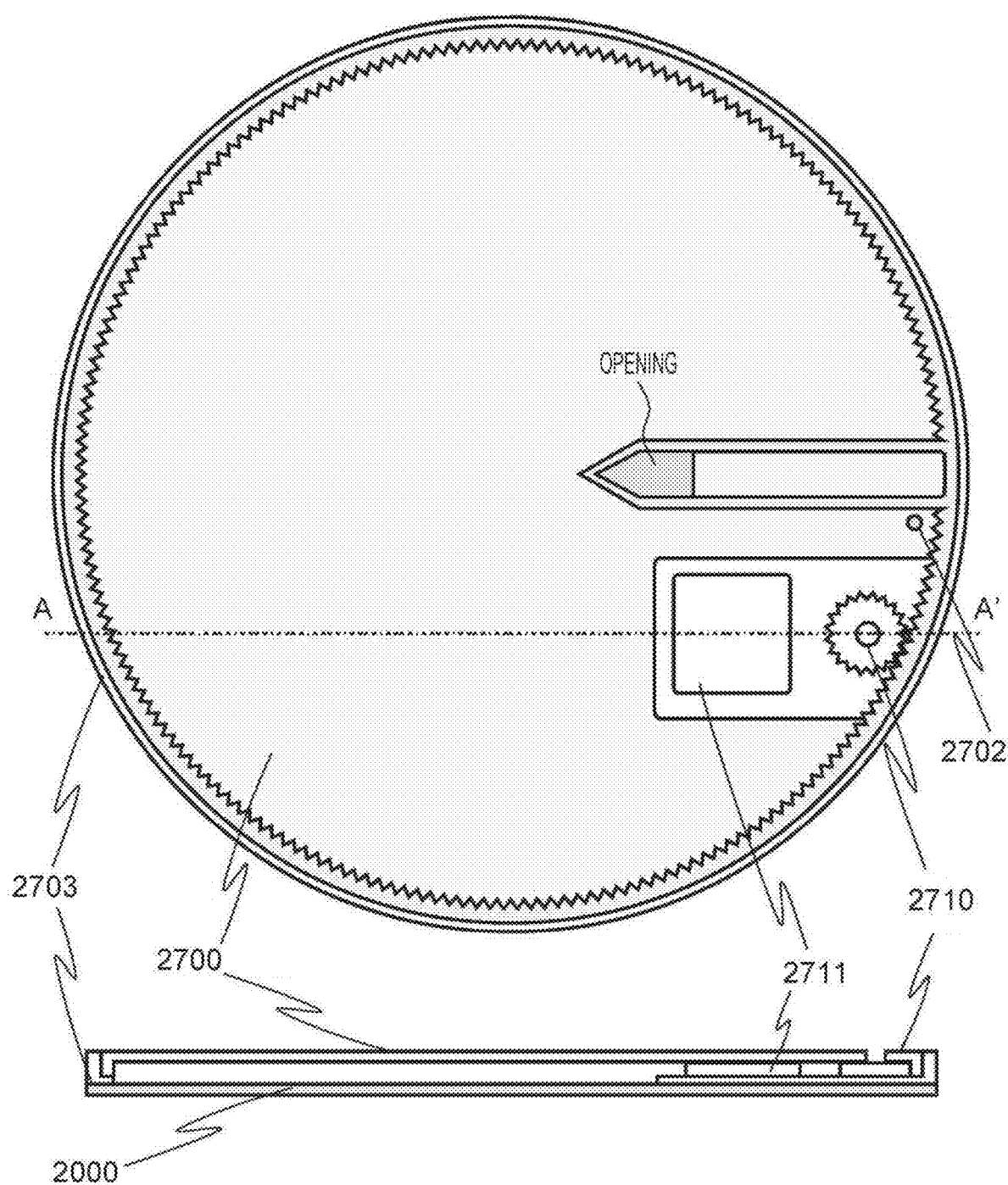
FIG. 31 is a diagram illustrating an example of a hut cover rotation mechanism that can measure the substitute sample output a plurality of times.

FIG. 31 illustrates the hut cover 2700 and a rotation mechanism which enables the automatic rotation of the hut cover described in FIG. 29. In FIG. 31, the hut cover is configured by two of the hut covers 2700 and an outer peripheral support part 2703 (or referred to as a rotation guide part). A gear is provided on the gap side of the outermost peripheral portion of the hut cover and is driven with a rotational power transmission component 2710 such as a gear, so that the hut cover can be rotated.

The rotation mechanism can be configured such that a material or component having a large friction coefficient is used as the above-described gear portion, and the hut cover is rotated by using the rotational power transmission component 2710.

The rotational power transmission component 2710 is controlled by a rotation control system 2711 for the rotation amount, the rotation speed, and the timing for starting and stopping the rotation. The rotation control system 2711 includes a rotation control board, a memory, an arithmetic device, and a power source. In addition, the power source can be a secondary battery, and a contact for charging the secondary battery or a coil for wireless power feeding can be provided. In addition, a wireless communication part can be provided which rewrites the control program of the control board stored in the memory, acquires log information such as a rotation amount, rotation speed, and rotation start and stop timing obtained during rotation control, and receives rotation start and stop signals.

The rotation control system 2711 and the rotational power transmission component 2710 are fixed to the extended portion of the outer peripheral support part 2703, and thus only the hut cover 2700 can be rotated.

Instead of using the rotation control system 2711, a hut position opening/closing component 2712 may be manually rotated. In that case, the hut cover 2700 can be rotated when the central portion of the rotational power transmission component 2710 is rotated by using a screwdriver or the like. In addition, by providing a knob at the central portion of the rotational power transmission component 2710, the hut cover 2700 can be rotated by manually rotating the knob.

By providing the outer peripheral support part 2703 on the outer periphery of the hut cover 2700 of FIGS. 29 and 30, the hut cover 2700 can be rotated smoothly.

Figure 32:
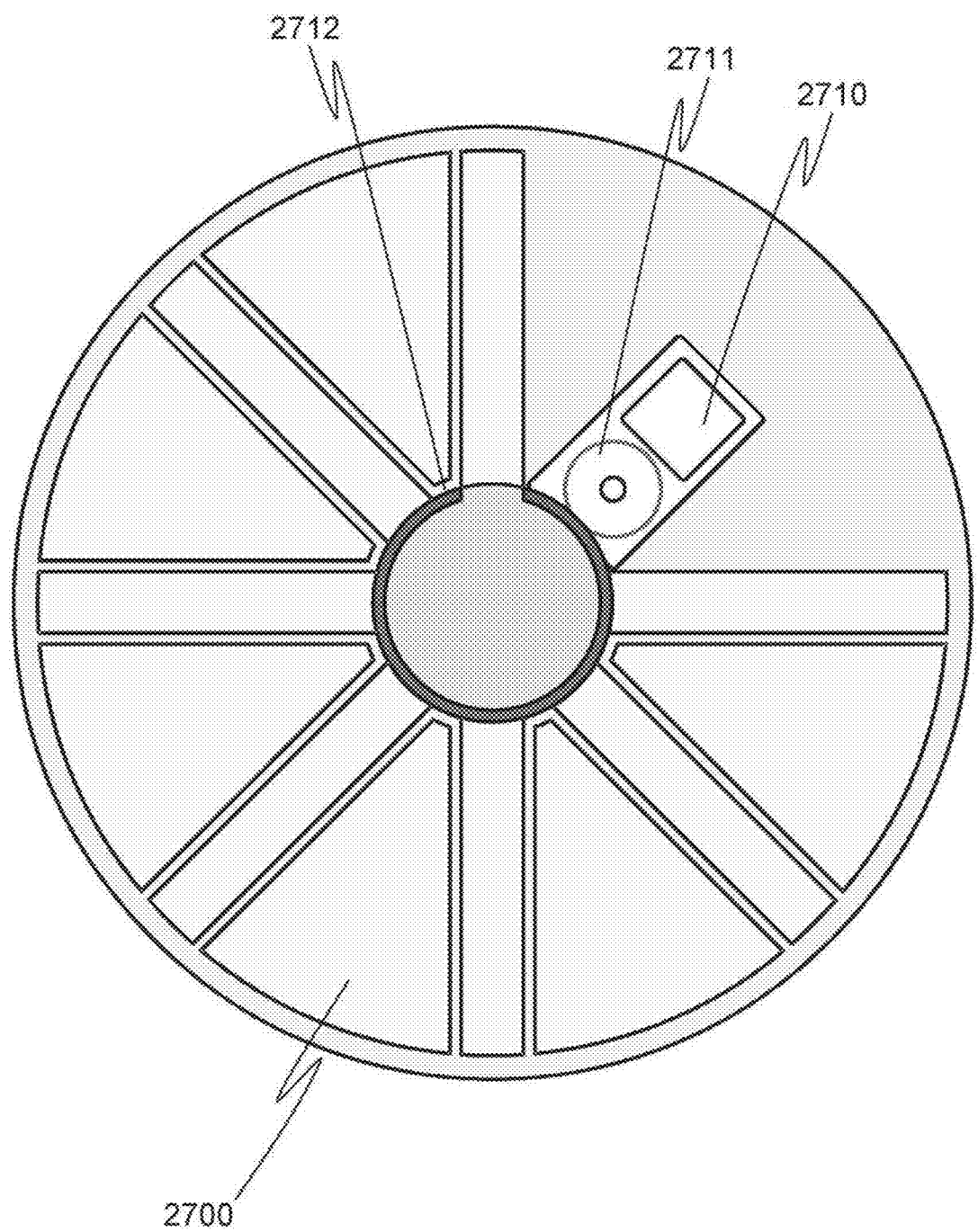
FIG. 32 is a diagram illustrating an example of the hut cover rotation mechanism that can measure the substitute sample output a plurality of times.

FIG. 32 illustrates the hut cover 2700 and a rotation mechanism that enable multiple measurements by rotating the hut position opening/closing component 2712 to open and close a plurality of the openings of the measurement gap provided in the hut cover.

By using the rotational power transmission component 2710 and the rotation control system 2711, the hut position opening/closing component 2712 is rotated. In addition, without using the rotation control system 2711, the hut position opening/closing component 2712 may be rotated manually. The hut cover 2700 can be rotated by using a gear or a material or a component having a large friction coefficient for the rotation mechanism of the hut position opening/closing component 2712 by the rotational power transmission component 2710.

In the configuration of FIG. 32, holes are provided in the partitions on both sides of the measurement portion, and the respective gaps are connected, whereby the remaining gas inside each gap can be exhausted from the gap of the measurement part where the hut opening is open. In addition, by providing a vent hole in any one of the gaps and further providing holes in the partitions on both sides of the measurement portion to connect the gaps, the remaining gas inside each gap may be exhausted from the vent hole.

In the above description, the description has been made mainly using the processing of grooves or holes in the sample, grinding of the sample surface, and grinding of the film laminated on the sample surface. However, even in a case where a film or a structure is deposited on the sample, the same effect can be obtained by using the information on the thickness of the deposited film and the deposited film structure as the sample output and the substitute sample output.

Figure 33A:
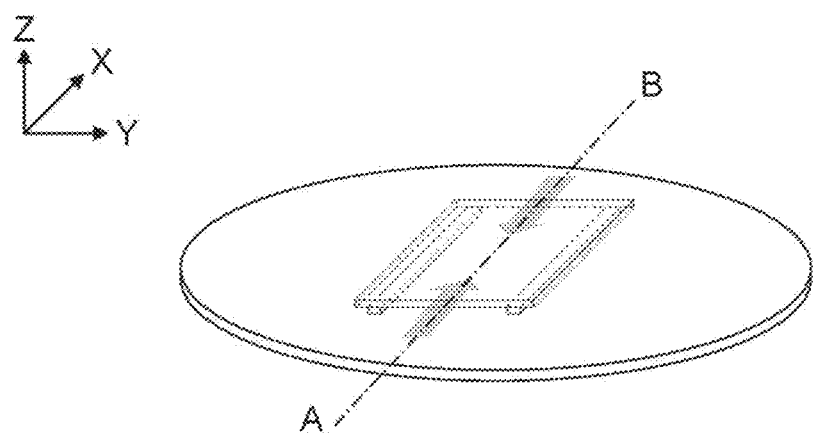
FIG. 33A is a diagram illustrating an example of the substitute sample.
Figure 33B:
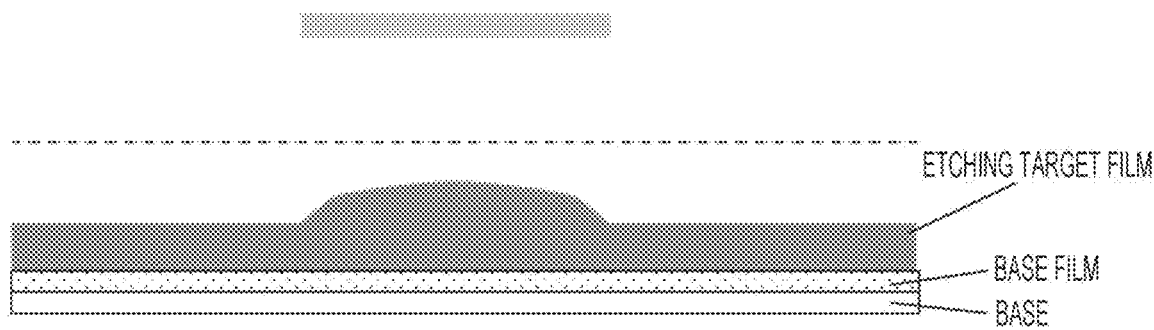
FIG. 33B is a diagram illustrating an example of the substitute sample.

Another example of the substitute sample will be described. The substitute sample illustrated in FIG. 10 is a sample (one-sided opening sample) having a hut structure in which only one side surface is opened, and one gap portion is formed. However, as illustrated in FIG. 33A, a sample (both-sided opening sample) having a hut structure in which two side surfaces are opened, and two gaps are formed can be used as the substitute sample. For this reason, in the substitute sample illustrated in FIG. 10A, the etchant can flow from one surface forming the gap portion into the space in the hut formed between the wafer and the roof. However, in the substitute sample illustrated in FIG. 33A, the etchant (etching particles) can flow from the two surfaces forming the gap into the space in the hut. FIG. 33B illustrates a typical cross-sectional view after processing the substitute sample illustrated in FIG. 33A.

In the one-sided opening sample described with reference to FIG. 10, the film thickness of the etching target film becomes thinner as the processing progresses, and the film thickness distribution of the remaining film near the gap portion becomes steep. In a case where optical film thickness measurement is performed for a steep film thickness, light with an optical path difference is mixed within the spot diameter of the irradiated light, or reflected light with a deviated reflected angle does not return to an optical receiver. Thus, accurate measurement becomes difficult. Therefore, when the processing time and the number of processing for the substitute sample are increased, the accuracy of film thickness measurement may be deteriorated, and it may be difficult to obtain the processing output.

On the other hand, when both-sided opening sample is subjected to the etching processing, the etchant enters the space in the hut through a plurality of gap portions. Thus, the film is expected to progress in spatially uniform processing. Due to the symmetrical superposition of the processing by the etchant flowing in from a plurality of directions, it is expected that the processing of the etching target film at the center progresses in a spatially uniform manner as illustrated in FIG. 33B.

Figure 34:
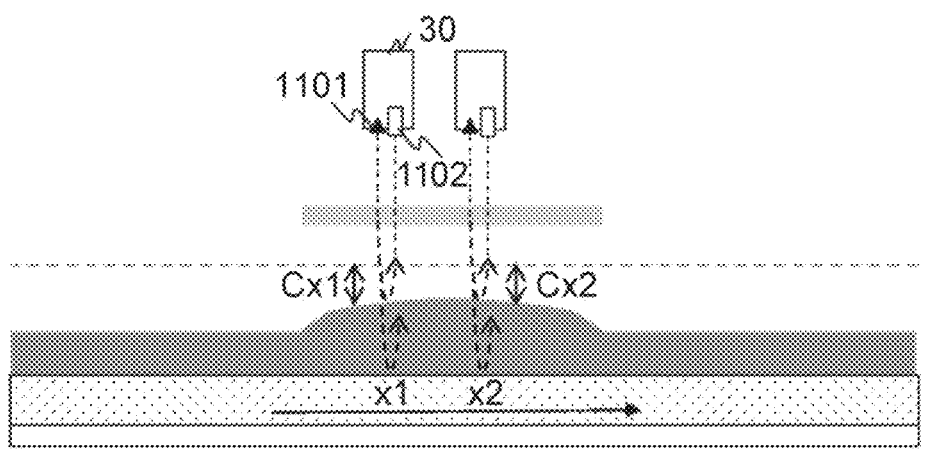
FIG. 34 is a diagram illustrating an example of the method for measuring the physical quantity of the substitute sample.

FIG. 34 illustrates a first calculation method of the substitute sample processing output in the both-sided opening sample. The etching amount $Cx$ of the etching target film at the position x inside the sample of the both-sided opening sample is determined by a certain function F depending on the values i and d of the processing result of the one-sided opening sample of FIG. 10 and the position x. The function F is a function determined by the diffusion equation of the radical particle, the shape of the sample, and geometric symmetry. One both-sided opening sample is prepared to be processed, etching amounts $Cx1$ and $Cx2$ are measured and obtained at two internal positions $x1$ and $x2$, and the simultaneous equations shown in Formula (5) are solved so as to calculate i and d. That is, since $Cx1$, $Cx2$, $x1$, and $x2$ are known in Formula (5), simultaneous equations for two variables i and d can be solved. However, when this equation becomes irregular, i and d can be calculated by obtaining etching amounts at more positions x and formulating a plurality of simultaneous equations. In addition, in order to improve the calculation accuracy of i and d, i and d may be calculated based on the data of the etching amount at many positions x. From the above, it was shown that the substitute sample processing output similar to that of the one-sided opening sample can be obtained even in the both-sided opening sample.

[Mathematical Formula 5]

$$C_{x1}=F(i,d,x_1) \text{、} C_{x2}=F(i,d,x_2) \qquad (5)$$

In the vicinity of the center of the both-sided opening sample, a flat film thickness is realized than in the case of the one-sided opening sample. Therefore, if the measurement position x is close to the center of the sample in the above calculation method, the substitute sample processing output can be obtained for a longer time or a number of times.

Figure 35A:
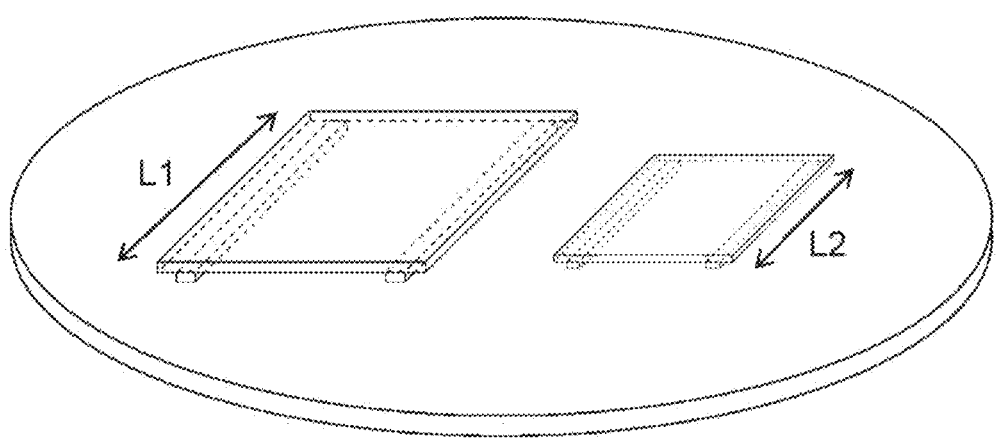
FIG. 35A is a diagram illustrating an example of a sample arrangement for measuring the physical quantity of the substitute sample.

FIG. 35 illustrates a second calculation method of the substitute sample processing output in the both-sided opening sample. Assuming that the length of the roof of the both-sided opening sample is L, the etching amount C of the etching target film at the center is determined by a function G depending on the values i and d and the length L of the one-sided opening sample in FIG. 10. The function G is a function determined by the diffusion equation of radical particles, the shape of the sample, and geometric symmetry. Therefore, as illustrated in FIG. 35A, two both-sided opening samples with different sizes (roof lengths L1 and L2 between two openings) are prepared to be processed, etching amounts C1 and C2 are measured and obtained at the respective inner central portions, and the simultaneous equations shown in Formula (6) are solved so as to calculate i and d. That is, since C1, C2, L1, and L2 are known in Formula (6), simultaneous equations for the two variables i and d can be solved. However, when this equation becomes irregular, i and d can be calculated by obtaining etching amounts at the central portions in more samples having different lengths and formulating a plurality of simultaneous equations. In addition, in order to improve the calculation accuracy of i and d, i and d may be calculated based on the data of the etching amounts at the central portions in many samples having different lengths.

[Mathematical Formula 6]

$$C_1=G(i,d,L_1) \text{、} C_2=G(i,d,L_2) \qquad (6)$$

In the central portion of the both-sided opening sample, the change in the film thickness is small and a flat film thickness is realized, so that it is possible to obtain the substitute sample processing output until the remaining film disappears. Thereby, it is possible to obtain the substitute sample processing output for a longer time or a large number of times compared to the one-sided opening sample.

Figure 35B:
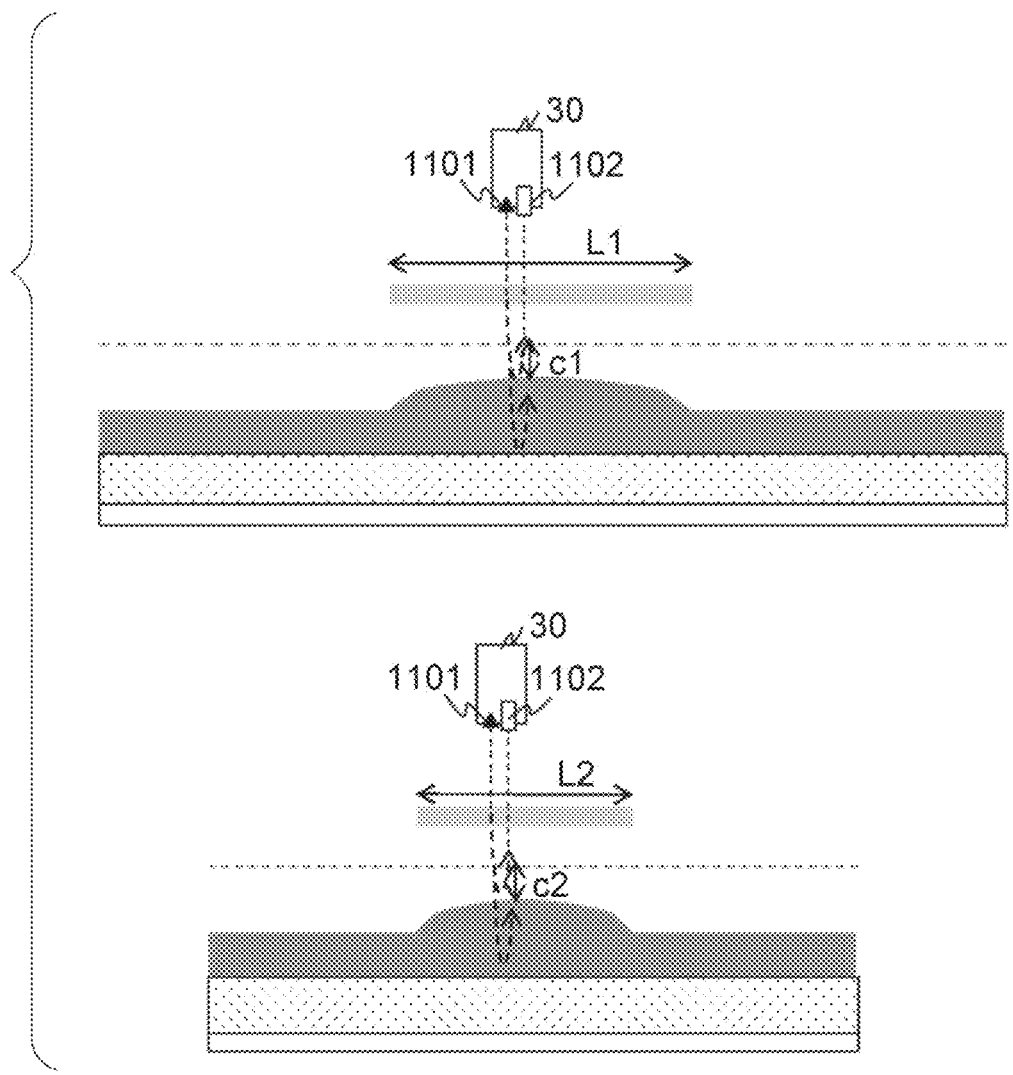
FIG. 35B is a diagram illustrating an example of the method for measuring the physical quantity of the substitute sample.

In the both-sided opening sample illustrated in FIG. 33A, as in the one-sided opening sample illustrated in FIG. 10, if the roof is made of a transparent material that light can transmit, a real-time interference film thickness measurement during processing can be obtained as illustrated in FIGS. 34 and 35B. Specifically, the measurement device 30 emits light from a light source 1101 and detects reflected light from the etching target film and the base film by using a detector 1102. In this way, the processing output information can be obtained without taking out the substitute sample from the processing device 20 and processing the substitute sample.

As an effect of such a both-sided opening sample, an improvement in the obtaining efficiency of the substitute sample processing output in the second calculation method will be specifically described. As described above, in the both-sided opening sample, the spatially uniform processing is expected to progress in the central portion. Thus, the processing output can be continuously obtained without taking out the sample until the remaining film disappears. Therefore, the substitute sample DB 131 can be obtained at a higher speed and at a lower cost than the sample of FIG. 10 for the following reason. For example, a one-sided opening sample and a both-sided opening sample in which the film thickness of the etching target film is 400 nm, and the length of the roof is 2 cm are considered. Under the reference processing conditions, it is assumed that an etching rate of 10 nm/min at the entrance and 4 nm/min at the central portion is realized in the one-sided opening sample. Here, assuming that the measurement with the interference film thickness meter becomes difficult when the difference in the remaining film of the etching target film between the entrance and the central portion exceeds 30 nm, in the one-sided opening sample, the measurement is possible until time of 30÷(10−4)=5 min. On the other hand, the both-sided opening sample has an etching rate of 10 nm/min same as the one-sided opening sample at the entrance and an etching rate of 4×2=8 nm/min which is approximately twice that of the one-sided opening sample due to the overlapping effect of the processing in the central portion. Since the remaining film in the central portion is generally flat, the measurement is possible until time of 400÷8=50 min until the remaining film disappears. In other words, in this example, the both-sided opening sample is expected to have approximately ten times the number of data acquisition compared to the one-sided opening sample.

Although FIG. 22 illustrates a method for measuring the thickness of the etching target film in the one-sided opening sample, the method for measuring the thickness of the etching target film can be similarly performed in the both-sided opening sample.

Figure 36:
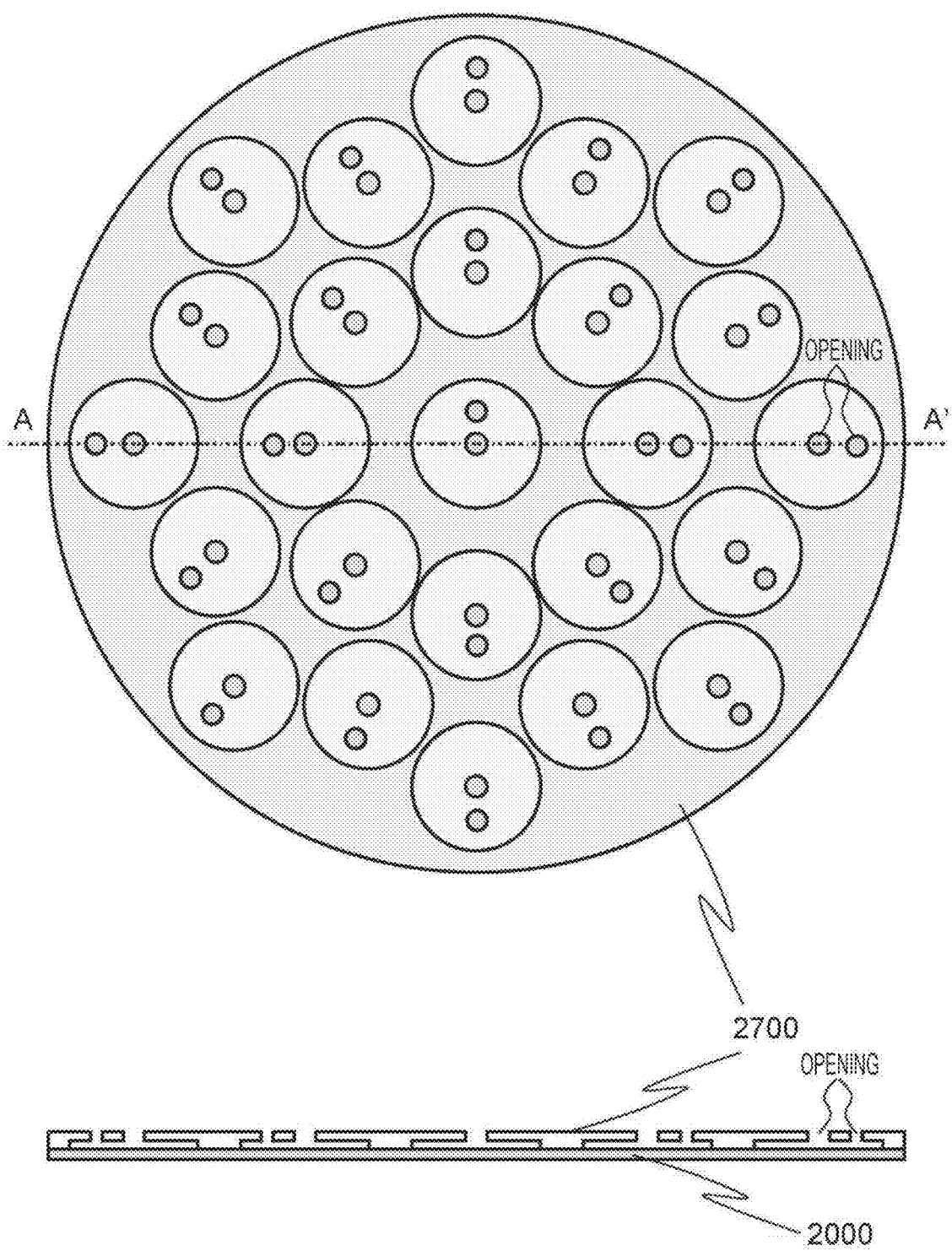
FIG. 36 is a diagram illustrating an example of the substitute sample that enables in-wafer plane distribution measurement.

As illustrated in FIG. 36, another hole may be provided in the hut cover roof above each gap in the sample of FIG. 25, and a sample having two holes in each gap may be used as a substitute sample. In this case, in the etching target film immediately below the midpoint between the two holes, a flat remaining film is realized similarly with the both-sided opening sample, so that an increase in the number of data acquisition is expected. As illustrated in the figure, two holes may be positioned at the central portion of the hut cover roof and positioned to be deviated from the central portion. However, both two holes may be provided at a position deviated from the central portion of the hut cover roof (for example, the position of one third of the diameter).

As illustrated in FIGS. 37, 38, 39, 40 and 41, another opening (hole) is provided in the sample illustrated in FIGS. 26, 27, 29, 30 and 31, so that the same effect can be obtained. In the case of FIGS. 38, 39, 40, and 41, the lengths of the two linear openings (holes) may be the same or different (for example, the outer peripheral side is long and the inner peripheral side is short). When the lengths of the openings are different, the amount of the etchant that flows in is different, and thus, strictly speaking, the etching rates provided by the two openings are different. However, in the vicinity of the straight line connecting the centers of the openings, the influence of the etchant flowing from the end of the opening is small, and the calculation may be performed without considering the influence.

In particular, in the one-sided opening sample illustrated in FIG. 29, one opening is provided at the end of the hut cover 2700. However, in the both-sided opening sample illustrated in FIG. 39, two openings are provided in the central portion of the hut cover 2700. Similarly, in the both-sided opening sample illustrated in FIGS. 40 and 41, two openings are provided in the central portion of the hut cover 2700.

Figure 37:
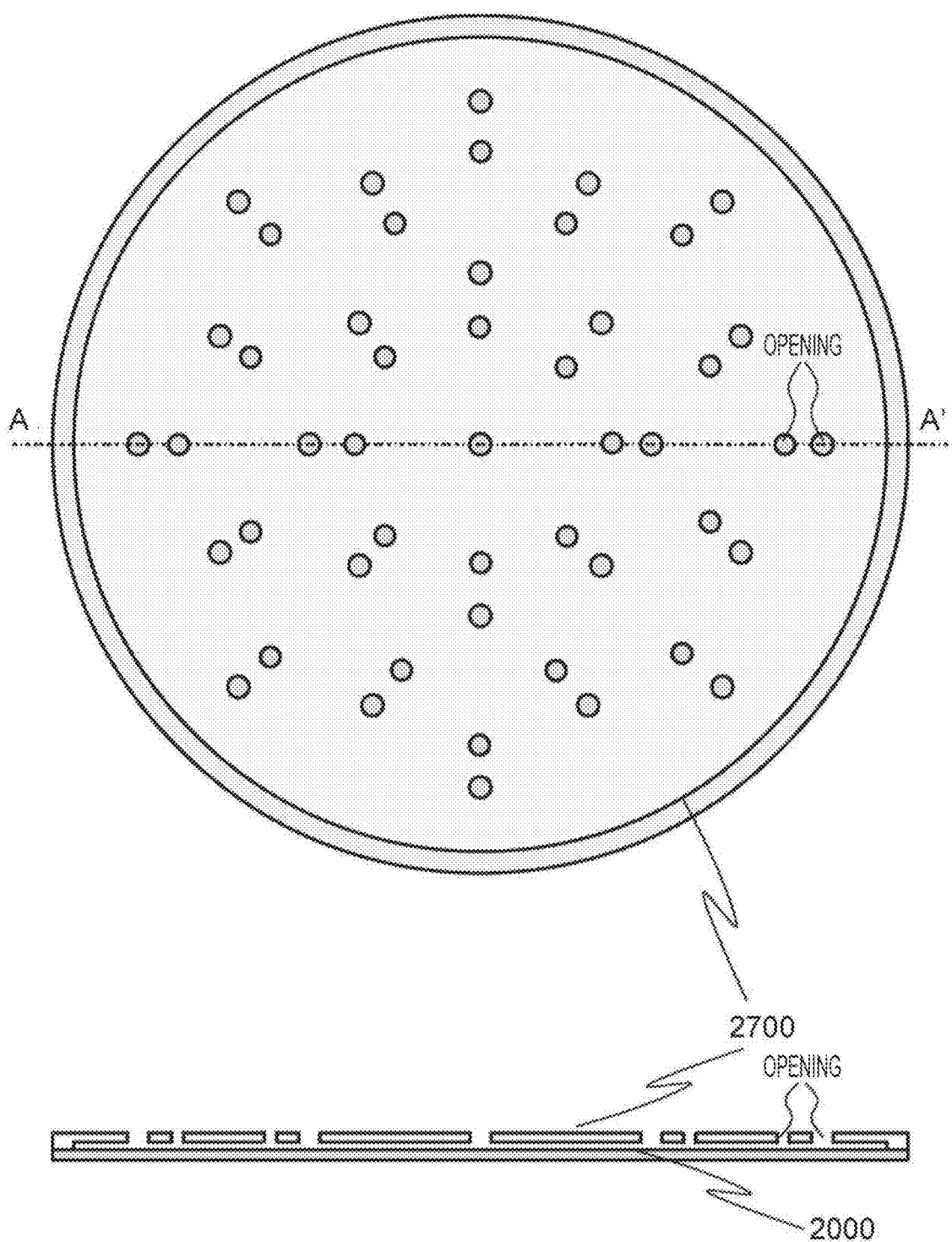
FIG. 37 is a diagram illustrating an example of the substitute sample that enables in-wafer plane distribution measurement.
Figure 38:
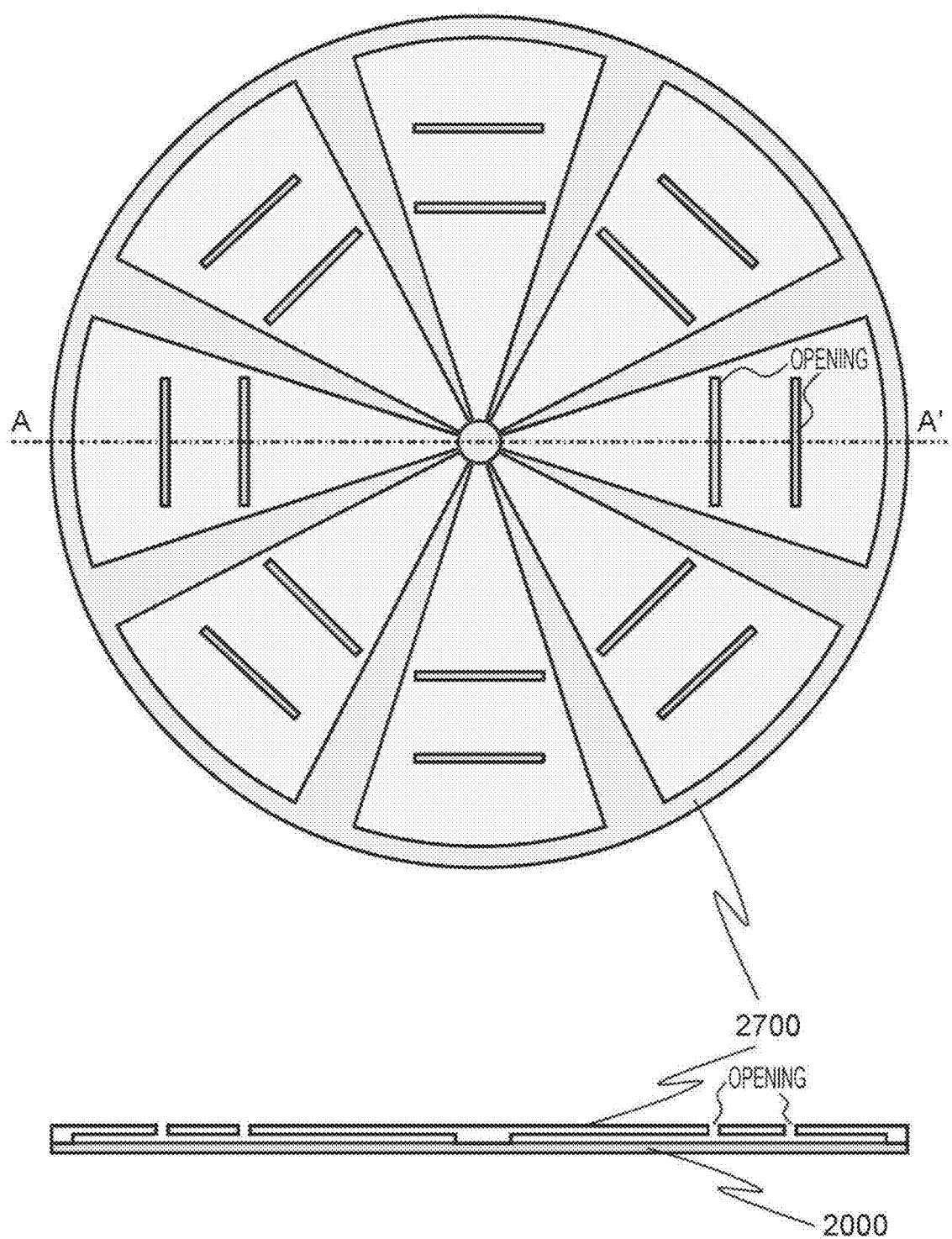
FIG. 38 is a diagram illustrating an example of the substitute sample that enables measurement of the distribution in the circumferential direction of the wafer.
Figure 39:
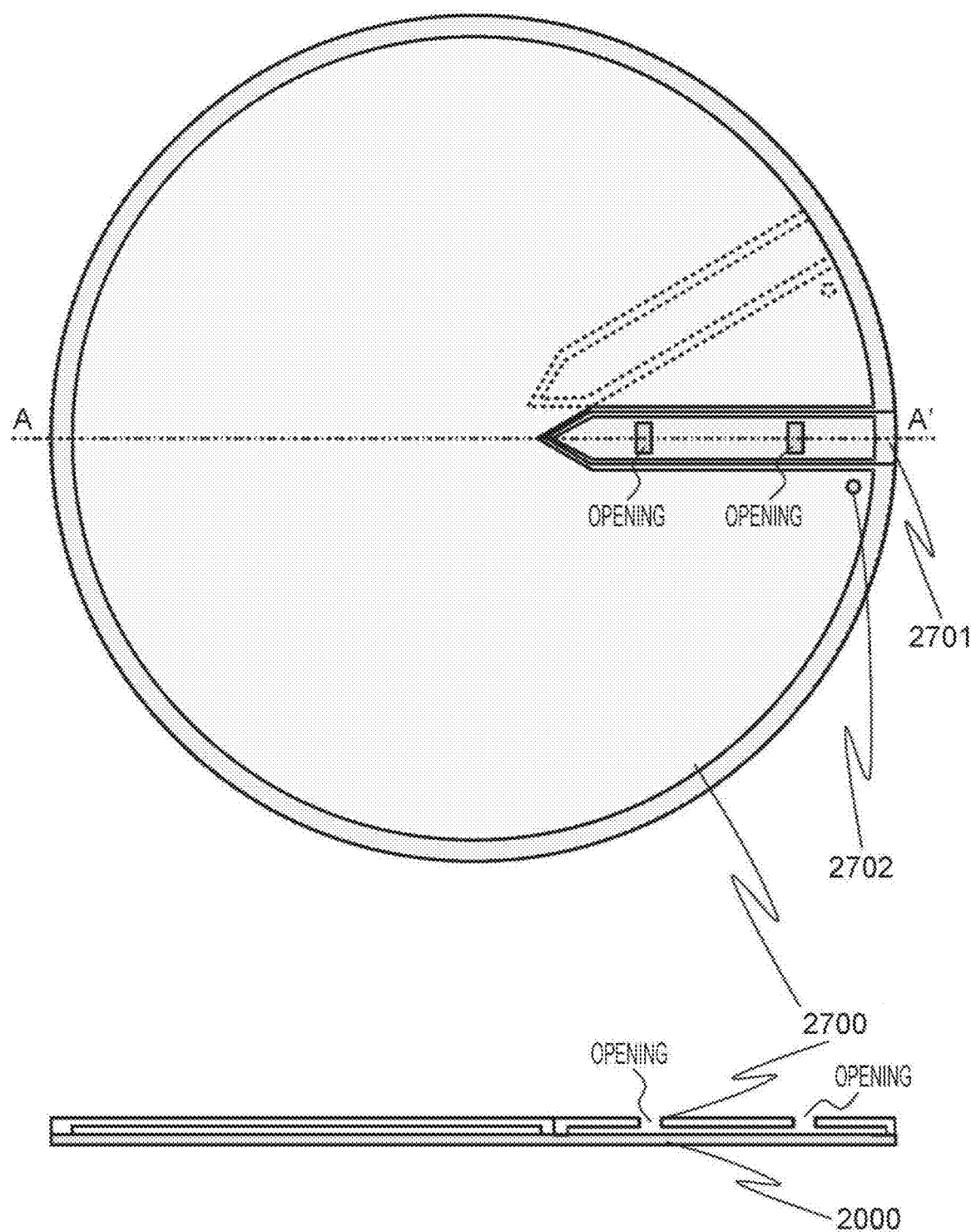
FIG. 39 is a diagram illustrating an example of the substitute sample that enables a plurality of times of measurement of the substitute sample output.
Figure 40:
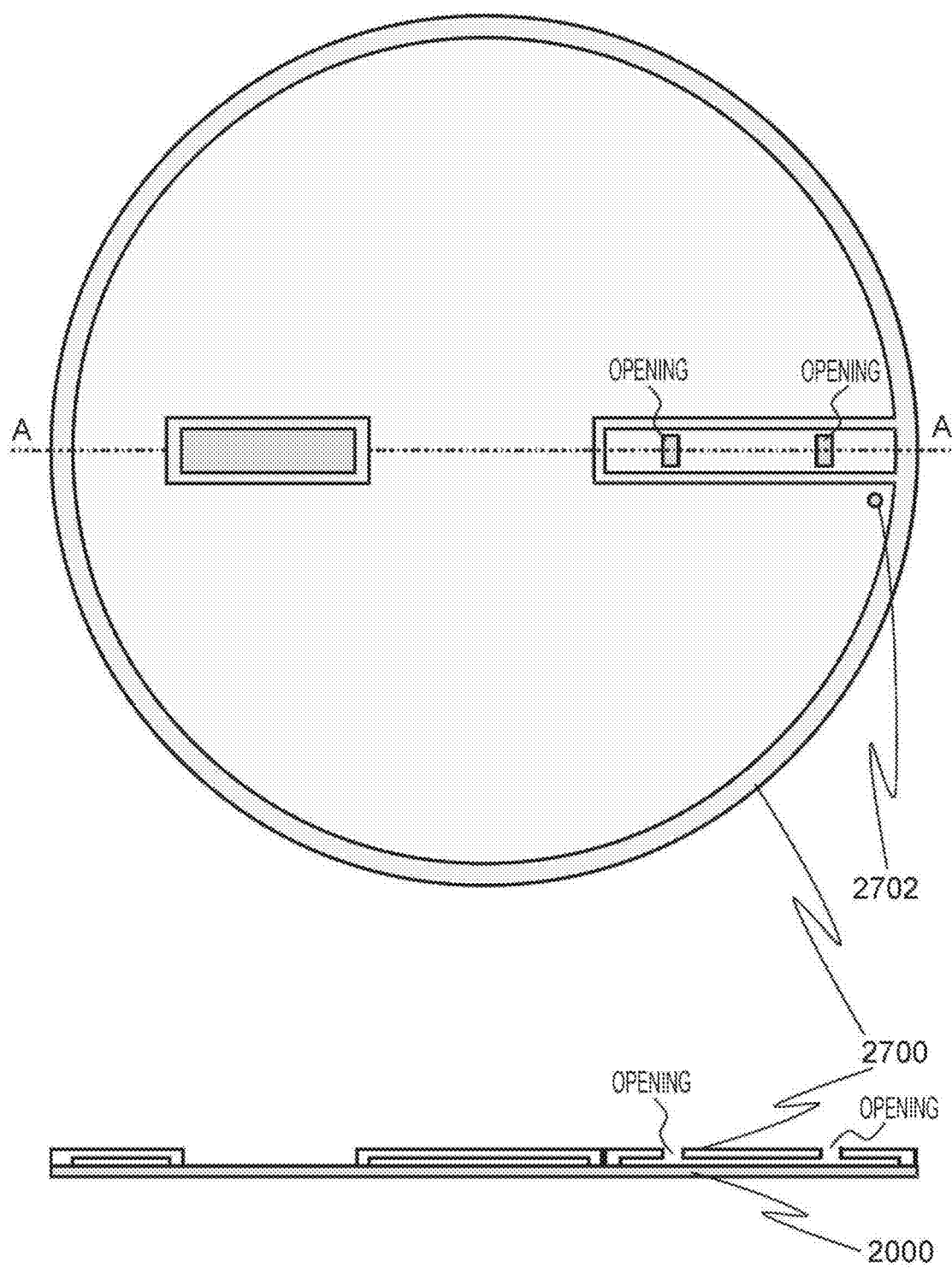
FIG. 40 is a diagram illustrating an example of the substitute sample that enables a plurality of times of measurement of the substitute sample output.
Figure 41:
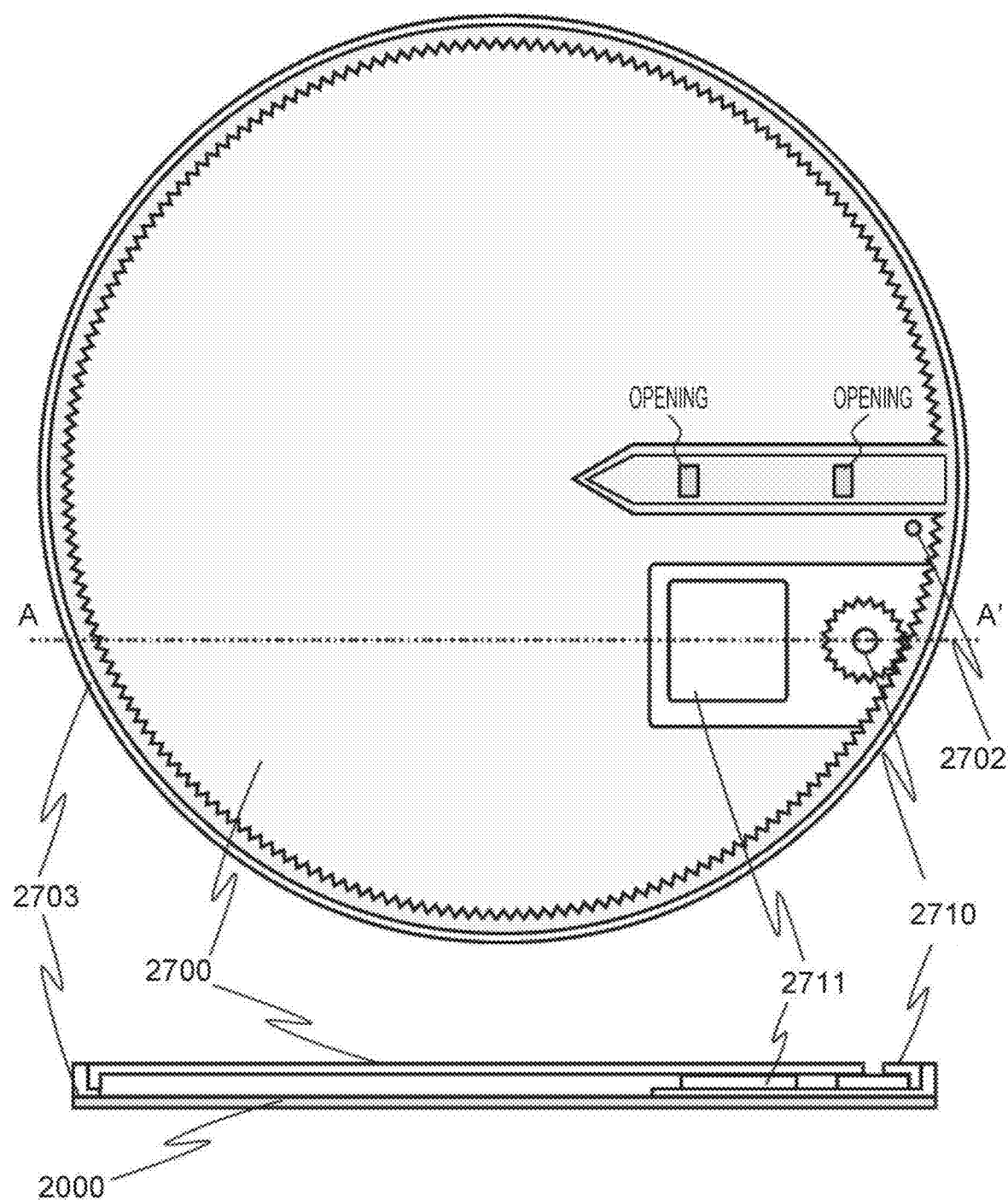
FIG. 41 is a diagram illustrating an example of the hut cover rotation mechanism that can measure the substitute sample output a plurality of times.

In the form illustrated in FIGS. 36, 37, and 38, two openings (holes) are arranged in a set, but three openings (holes) may be arranged in a set. In this case, simultaneous equations including three equations are solved. Further, four or more openings (holes) may be provided as a set.

In the form illustrated in FIGS. 36, 37, and 38, an interval between the two openings (holes) forming a set is the same at any location, but the interval between the two openings (holes) forming a set may be changed. By arranging openings (holes) with different intervals, the second calculation method illustrated in FIG. 35 can be realized with one sample.

Hereinbefore, the embodiment of etching a semiconductor wafer has been described. However, the present invention can be applied to a processing of forming a layer on the surface of the semiconductor wafer, such as chemical vapor deposition (CVD), in addition to the processing of removing the surface of the semiconductor wafer.

As described above, the substitute sample of the embodiment of the present invention includes a first surface (a surface of an etching target film) formed at a first height when viewed from a sample surface (a surface of a base film), a second surface (roof, hut cover) formed at a second height higher than the first height, and a plurality of inflow parts (openings, holes, or the like) which allow a particle (such as an etchant for etching processing and a source gas in a chemical vapor deposition (CVD)) for performing processing on the first surface to flow between the first surface and the second surface. Therefore, even if the film thickness of the etching target film decreases with the progress of the etching processing, the film thickness can be measured at a location, which has little change in the film thickness, in the central portion where the processing by the etching particles flowing in from a plurality of inflow parts is superimposed. Thus, the substitute sample can be used when the processing is performed during a long time and many times. For this reason, a lot of data can be obtained at low cost, and the cost for determining the control parameter of the processing performed on the sample can be reduced.

In addition, the first surface and the second surface are connected by walls arranged in at least two directions, and the inflow part is formed as a gap which communicates a space formed between the first surface and the second surface (wafer) with an outside. The location, which has little change in film thickness, in the central portion where the processing by etching particles is superimposed can be formed, and the film thickness can be accurately measured.

The inflow part is formed on the second surface and is a hole which communicates the space formed between the first surface and the second surface with the outside. Therefore, data can be obtained efficiently.

Partial regions of at least two locations in one sample in a region where the processing is superimposed are measured by the measurement device 30. Therefore, data can be obtained with one sample, and handling becomes easy.

Partial regions of at least one location in each of a plurality of samples having different distances between the inflow parts in the region where the processing is superimposed are measured by the measurement device 30. Therefore, the number of measurements in one sample can be increased, and the data acquisition efficiency can be improved.

A method of determining a control parameter of processing according to the embodiment of the present invention includes: a first step of causing the arithmetic device to generate a second model indicating a correlation between a control parameter of the processing performed on the second sample and the second processing output by executing a learning processing and to store the second model in the storage device; and a second step of causing the arithmetic device to calculate a target control parameter of the processing performed on the first sample based on a target processing output that is the first process output as a target, the first model, and the second model. Therefore, it is possible determine the control parameter of the processing performed on the sample while reducing the cost for process development.

In the first step, the second model is generated by executing learning processing using the database. The processing conditions of the actual sample can be obtained at high speed and low cost. That is, the processing conditions with high accuracy can be obtained while suppressing the process development cost.

The second step includes calculating the second processing output corresponding to the target processing output based on the first model, calculating an estimated control parameter which is a control parameter having a possibility of obtaining the second processing output corresponding to the target processing output based on the second model, and outputting the estimated control parameter as the target control parameter. The processing conditions can be obtained with higher accuracy.

The method includes: analyzing a distribution of the second processing output in a space with each of the plurality of elements as an axis with reference to the database; determining a second processing output of an adding target based on a result of the analysis; calculating a new control parameter for the processing performed on the second sample by using the second processing output of the adding target and the second model; and inputting the new control parameter to the processing device;

obtaining a new second processing output from the processing device which has performed the processing based on the new control parameter; and registering the new control parameter and the new second processing output in the database in association with each other. The data near the target substitute sample output can be intensively increased, and the prediction accuracy of the actual sample processing condition of the target can be improved.

Note that the present invention is not limited to the above-described embodiments, and various modifications are included. For example, the above-described embodiments have been described in detail for easy understanding of the present invention and are not necessarily limited to those having all the described configurations. Further, it is possible to add, delete, and replace other configurations for a part of the configuration of each embodiment.

Each of the above-described configurations, functions, processing parts, processing means, and the like may be realized by hardware by designing a part or all of them with, for example, an integrated circuit. In addition, the present invention can also be realized by software program codes that implement the functions of the embodiments. In this case, a storage medium in which the program code is recorded is provided to the computer, and a processor included in the computer reads the program code stored in the storage medium. In this case, the program code itself read from the storage medium realizes the functions of the above-described embodiments, and the program code itself and the storage medium storing the program code configure the present invention. As a storage medium for supplying such a program code, for example, a flexible disk, CD-ROM, DVD-ROM, hard disk, solid state drive (SSD), optical disk, magneto-optical disk, CD-R, magnetic tape, nonvolatile memory cards, ROMs, and the like are used.

The program code for realizing the functions described in this embodiment can be implemented by a wide range of programs or script languages such as assembler, C/C++, perl, Shell, PHP, Java (registered trademark).

By distributing the program code of the software that realizes the functions of the embodiment via a network, it may be stored in a storage means such as a hard disk or memory of a computer or a storage medium such as a CD-RW or CD-R. A processor included in the computer may read and execute the program code stored in the storage unit or the storage medium.

In the above-described embodiments, the control lines and information lines indicate what is considered necessary for the explanation, and not all control lines and information lines on the product are necessarily shown. All the components may be connected to each other.

What is claimed is:

1. A sample which simulates a processing state of a semiconductor sample and is measured by a measurement device, the sample comprising:
   a first surface formed at a first height when viewed from a sample surface;
   a second surface formed at a second height higher than the first height; and
   a plurality of inflow parts which allow a particle for performing processing on the first surface to flow between the first surface and the second surface,
   wherein the processing by the particle flowing from the plurality of inflow parts is superimposed in at least a part of a region to be processed on the first surface, and
   the region where the processing is superimposed on the first surface is measured by the measurement device.

2. The sample according to claim 1, wherein
   the first surface and the second surface are connected by walls arranged in at least two directions, and
   the inflow part is formed as a gap which communicates a space formed between the first surface and the second surface with an outside.

3. The sample according to claim 1, wherein
   the inflow part is formed on the second surface and is a hole which communicates the space formed between the first surface and the second surface with the outside.

4. The sample according to claim 1, wherein
   partial regions measured by the measurement device in a region where the processing is superimposed are provided at at least two locations in the one sample.

5. The sample according to claim 1, comprising:
   a plurality of samples having different distances between the inflow parts,
   wherein partial regions measured by the measurement device in a region where the processing is superimposed are provided at at least one location in each of the plurality of samples.

6. A method for determining a control parameter of processing performed on a sample executed by a computer, wherein
   the computer includes an arithmetic device, a storage device connected to the arithmetic device, and an interface connected to the computer and connected with an external device, and
   the storage device stores a first model indicating a correlation between a first processing output obtained by measuring a first sample which is subjected to the processing and is used for manufacturing and a second processing output obtained by measuring a second sample which is subjected to the processing and simulates the first sample,
   the method comprising:
   a first step of causing the arithmetic device to generate a second model indicating a correlation between a control parameter of the processing performed on the second sample and the second processing output by executing a learning processing and to store the second model in the storage device; and
   a second step of causing the arithmetic device to calculate a target control parameter of the processing performed on the first sample based on a target processing output that is the first processing output as a target, the first model, and the second model,
   wherein the second sample includes
   a first surface formed at a first height when viewed from a sample surface,
   a second surface formed at a second height higher than the first height, and
   a plurality of inflow parts which allow a particle for performing processing on the first surface to flow between the first surface and the second surface.

7. The method for determining a control parameter of processing according to claim 6, wherein
   the inflow part is formed in a gap communicating a space formed between the first surface and the second surface with an outside or formed in the second surface and is a hole which communicates the space formed between the first surface and the second surface with the outside.

8. The method for determining a control parameter of processing according to claim 6, wherein
   partial regions of at least two locations in the one second sample in a region where the processing is superimposed are measured to obtain the second processing output.

9. The method for determining a control parameter of processing according to claim 6, wherein
   the second sample includes a plurality of second samples having different distances between the inflow parts, and
   a portion of at least one location in each of the plurality of second samples in a region where the processing is superimposed is measured to obtain the second processing output.

10. The method for determining a control parameter of processing according to claim 6, wherein
    the arithmetic device is accessible to a database storing data in which the control parameter of the processing performed on the second sample is associated with the second processing output, and
    in the first step, the arithmetic device generates the second model by executing learning processing using the database.

11. The method for determining a control parameter of processing according to claim 10, wherein
    the second step includes
    causing the arithmetic device to calculate the second processing output corresponding to the target processing output based on the first model,
    causing the arithmetic device to calculate an estimated control parameter which is a control parameter having a possibility of obtaining the second processing output corresponding to the target processing output based on the second model, and
    causing the arithmetic device to output the estimated control parameter as the target control parameter.

12. The method for determining a control parameter of processing according to claim 10, wherein
a processing device for performing the processing is connected to the computer, and
the second processing output includes measurement values of a plurality of elements,
the method comprising:
causing the arithmetic device to analyze a distribution of the second processing output in a space with each of the plurality of elements as an axis with reference to the database;
causing the arithmetic device to determine a second processing output of an adding target based on a result of the analysis;
causing the arithmetic device to calculate a new control parameter for the processing performed on the second sample by using the second processing output of the adding target and the second model;
causing the arithmetic device to input the new control parameter to the processing device;
causing the arithmetic device to obtain a new second processing output from the processing device which has performed the processing based on the new control parameter; and
causing the arithmetic device to register the new control parameter and the new second processing output in the database in association with each other.

13. A system comprising:
a processing device for performing a processing on a sample;
a measurement device for measuring a result of the processing performed on the sample; and
a computer for determining a control parameter of the processing performed on the sample,
wherein the computer includes
a storage part which stores a first model indicating a correlation between a first processing output obtained by measuring a first sample which is subjected to the processing and is used for manufacturing and a second processing output obtained by measuring a second sample which is subjected to the processing and is easier to measure than the first sample and a second model indicating a correlation between a control parameter of the processing performed on the second sample and the second processing output, and
an analysis part which calculates a target control parameter of the processing performed on the first sample based on a target processing output that is the first processing output as a target, the first model, and the second model, and
the sample includes
a first surface formed at a first height when viewed from a sample surface,
a second surface formed at a second height higher than the first height, and
a plurality of inflow parts which allow a particle for performing processing on the first surface to flow between the first surface and the second surface.

* * * * *